(12) United States Patent
Tiwari et al.

(10) Patent No.: US 12,406,886 B2
(45) Date of Patent: Sep. 2, 2025

(54) MICROELECTRONIC DEVICES INCLUDING SLOT STRUCTURES, AND RELATED ELECTRONIC SYSTEMS AND METHODS OF FORMING THE MICROELECTRONIC DEVICES

(71) Applicant: Micron Technology, Inc., Boise, ID (US)

(72) Inventors: Chandra S. Tiwari, Boise, ID (US); David A. Kewley, Boise, ID (US); Deep Panjwani, Boise, ID (US); Matthew Holland, Victor, NY (US); Matthew J. King, Boise, ID (US); Michael E. Koltonski, Boise, ID (US); Tom J. John, Boise, ID (US); Xiaosong Zhang, Boise, ID (US); Yi Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 500 days.

(21) Appl. No.: 17/720,695

(22) Filed: Apr. 14, 2022

(65) Prior Publication Data
US 2023/0335439 A1      Oct. 19, 2023

(51) Int. Cl.
*H01L 21/768* (2006.01)
*H01L 23/532* (2006.01)
*H10B 41/10* (2023.01)
*H10B 41/30* (2023.01)
*H10B 41/35* (2023.01)
*H10B 41/48* (2023.01)
(Continued)

(52) U.S. Cl.
CPC .. *H01L 21/76897* (2013.01); *H01L 21/76832* (2013.01); *H01L 23/53295* (2013.01);
(Continued)

(58) Field of Classification Search
CPC ......... H01L 21/76897; H01L 21/76832; H01L 23/53295; H10B 41/27; H10B 41/30;
(Continued)

(56) References Cited

U.S. PATENT DOCUMENTS 9,490,262 B1    11/2016    Pang et al.
10,170,493 B1    1/2019    Greenlee et al.
(Continued)

FOREIGN PATENT DOCUMENTS

CN    107658306 A    2/2018

OTHER PUBLICATIONS

U.S. Appl. No. 16/877,233, filed May 18, 2020, titled "Microelectronic Devices Including Contact Structures, and Related Electronic Systems and Methods", to Hu et al., 36 pages.
(Continued)

Primary Examiner — Herve-Louis Y Assouman
(74) Attorney, Agent, or Firm — TraskBritt

(57) ABSTRACT

A microelectronic device comprises a stack structure comprising alternating conductive structures and insulative structures. Memory cells vertically extend through the stack structure, and comprise a channel material vertically extending through the stack structure. An additional stack structure vertically overlies the stack structure and comprises additional conductive structures and additional insulative structures. First pillar structures extend through the additional stack structure and vertically overlie a portion of the memory cells. Second pillar structures are adjacent to the first pillar structures and extend through the additional stack structure and vertically overlie another portion of the memory cells. Slot structures are laterally adjacent to the first pillar structures and to the second pillar structures and extend through at least a portion of the additional stack structure. A distance between the first pillar structures and the slot structures is substantially equal to a distance between the second pillar structures and the slot structures.

25 Claims, 44 Drawing Sheets

(51) Int. Cl.
   *H10B 43/10* (2023.01)
   *H10B 43/27* (2023.01)
   *H10B 43/35* (2023.01)
   *H10B 80/00* (2023.01)
   *H10B 41/27* (2023.01)
(52) U.S. Cl.
   CPC .............. *H10B 41/27* (2023.02); *H10B 41/30* (2023.02); *H10B 41/48* (2023.02)
(58) Field of Classification Search
   CPC ........ H10B 41/48; H10B 41/35; H10B 43/35; H10B 41/10; H10B 80/00; H10B 43/10; H10B 43/27
   See application file for complete search history.

(56) References Cited

U.S. PATENT DOCUMENTS

| | | |
|---|---|---|
| 10,242,995 B2 | 3/2019 | Zhu et al. |
| 10,283,524 B1 | 5/2019 | Greenlee et al. |
| 10,290,650 B1 | 5/2019 | Iwai |
| 10,475,804 B1 | 11/2019 | Nishikawa et al. |
| 2014/0264533 A1 | 9/2014 | Simsek-Ege et al. |
| 2015/0348989 A1 | 12/2015 | Pekay |
| 2019/0333581 A1 | 10/2019 | Diep et al. |
| 2020/0295027 A1* | 9/2020 | Sakata ............... H10B 43/20 |
| 2021/0035987 A1* | 2/2021 | Lee ............... H10B 43/27 |
| 2021/0066339 A1* | 3/2021 | Kadota ............... H10B 43/10 |
| 2021/0193678 A1* | 6/2021 | Noh ............... H10B 41/10 |

OTHER PUBLICATIONS

U.S. Appl. No. 16/877,209, filed May 18, 2020, titled "Methods for Forming Electronic Apparatus With Tiered Stacks Having Conductive Structures Isolated By Trenches, and Related Electronic Apparatus and Systems", to Hu et al., 65 pages.

U.S. Appl. No. 16/730,505, filed Dec. 30, 2019, titled "Tungsten Structures and Methods of Forming the Structures", to Greenlee et al., 34 pages.

* cited by examiner

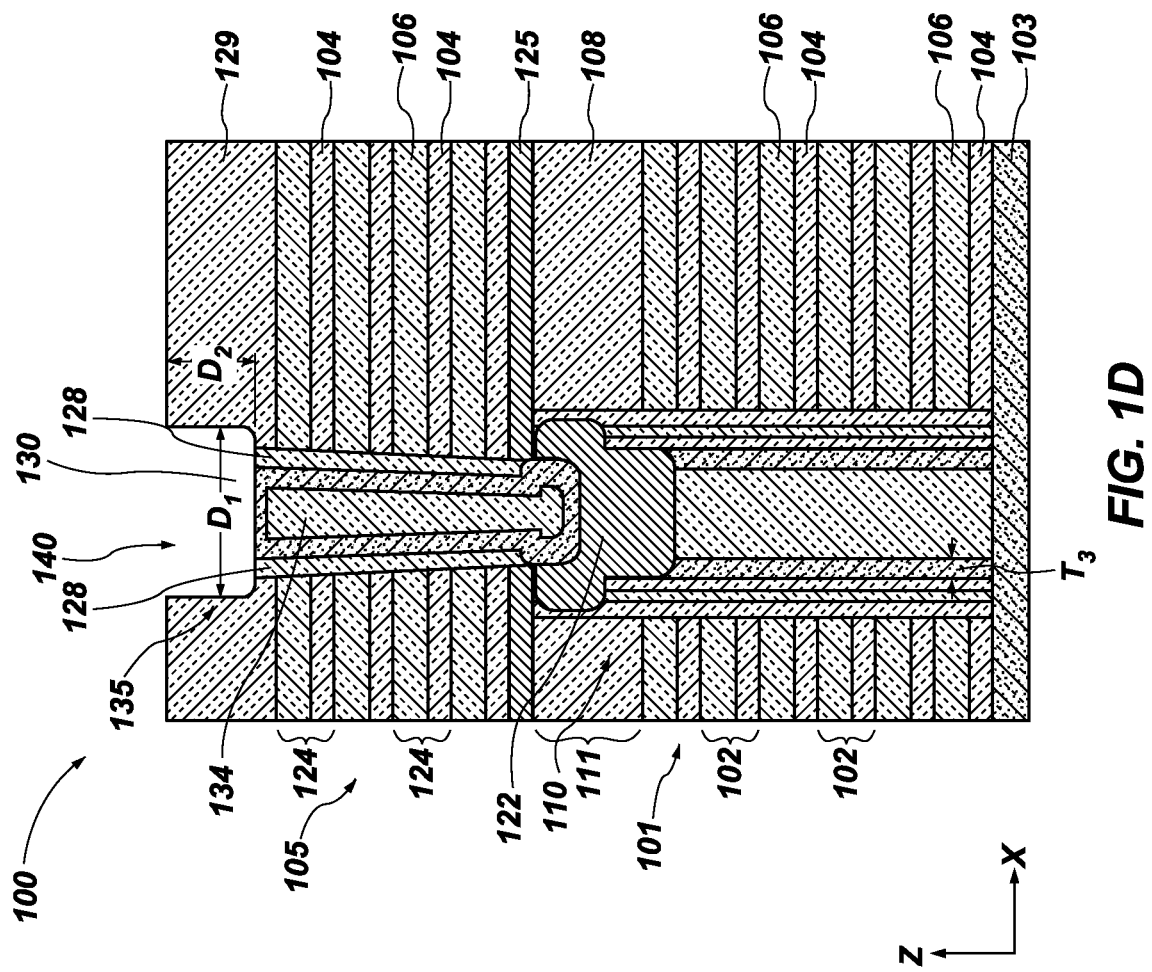

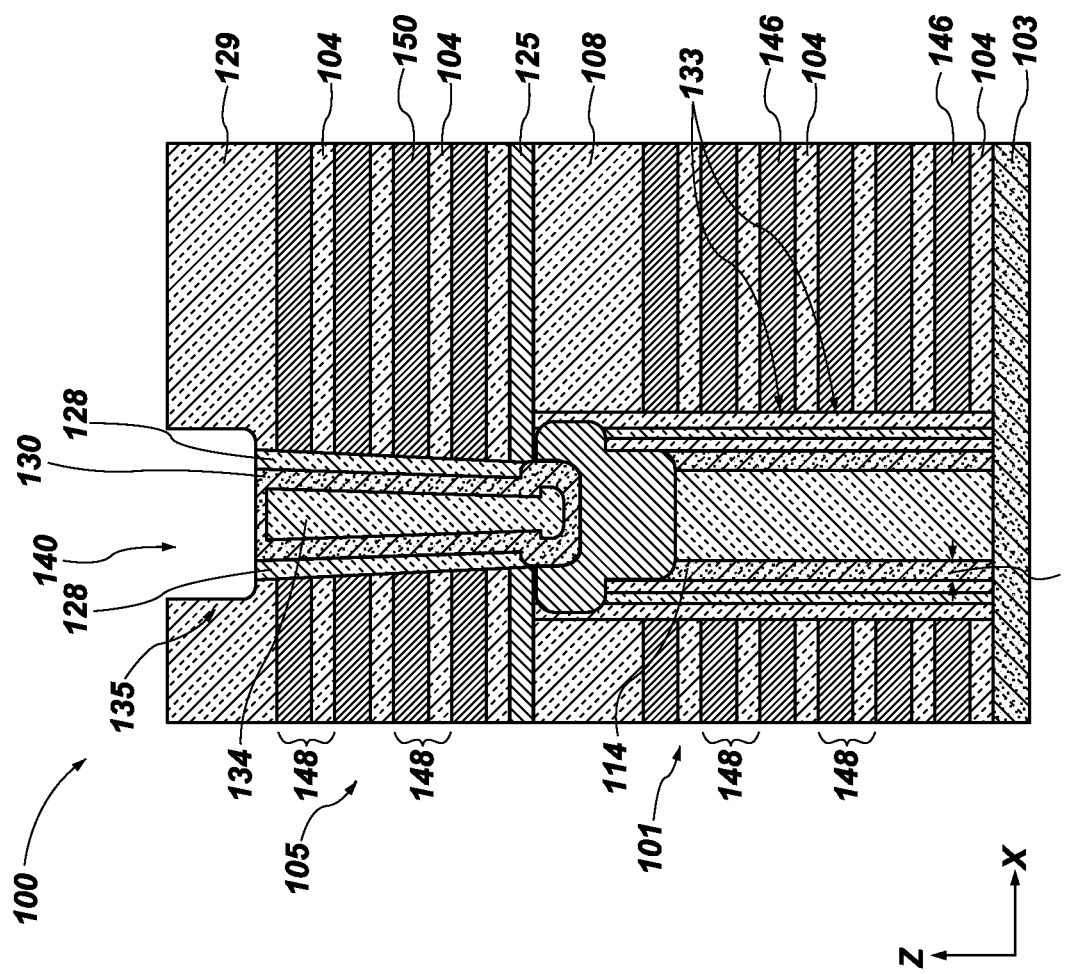

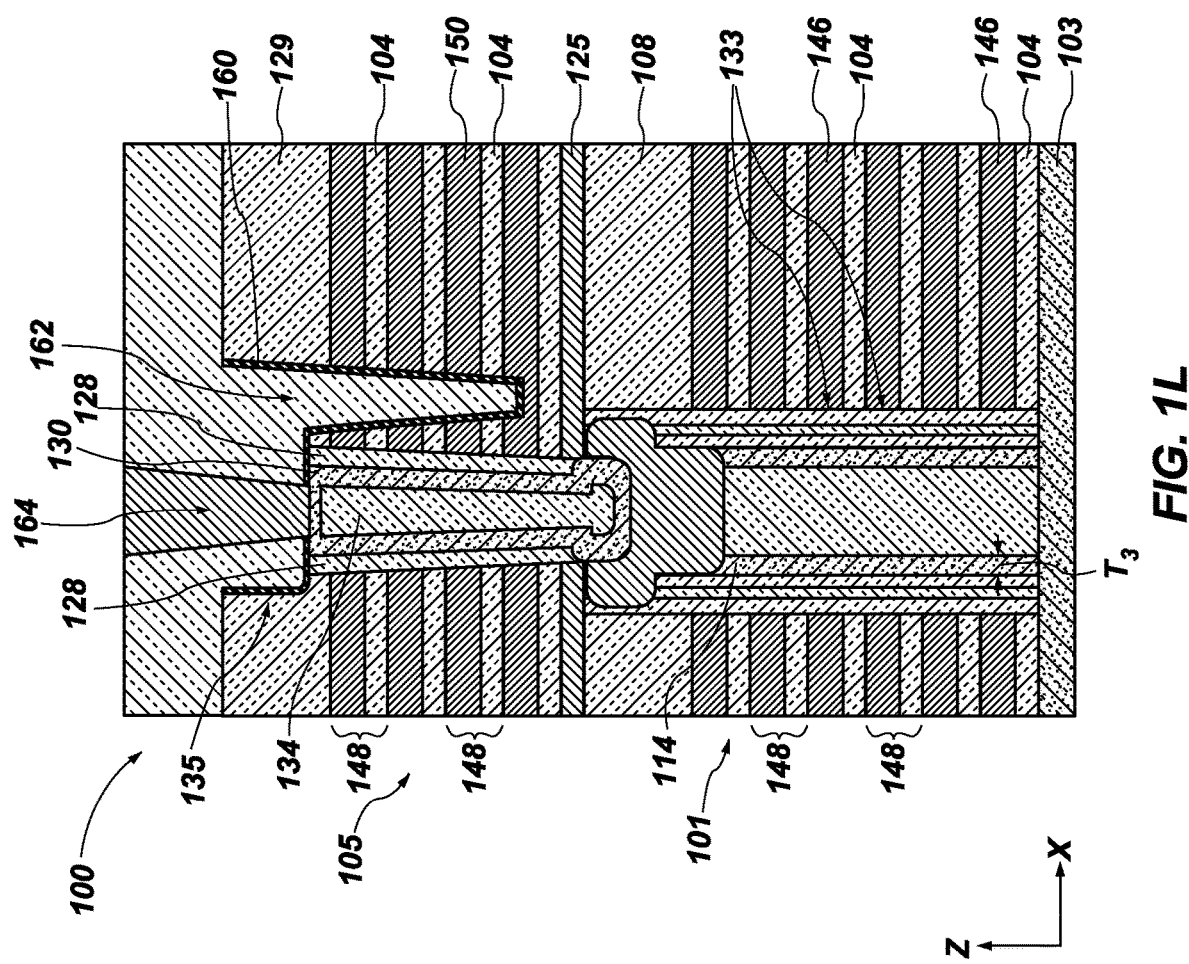

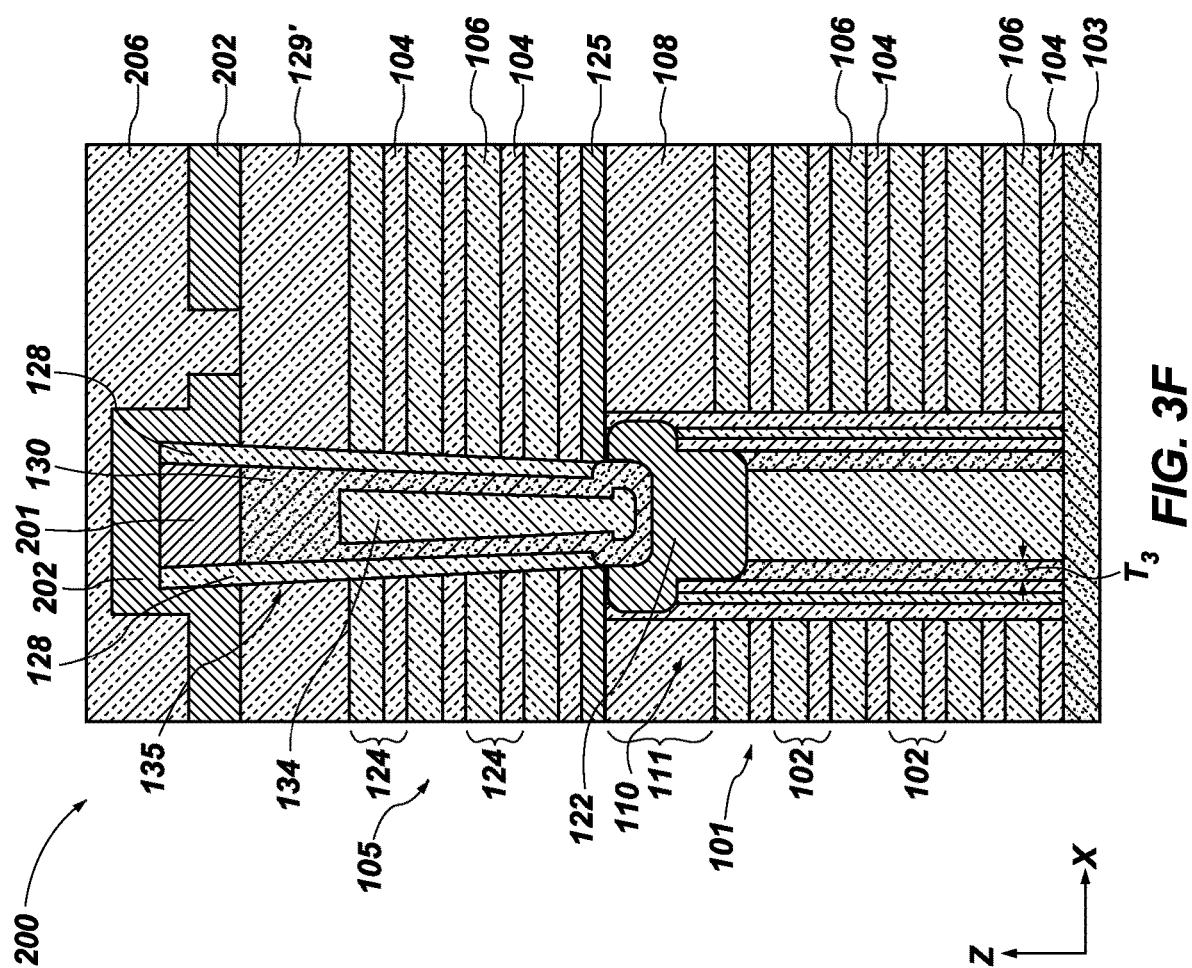

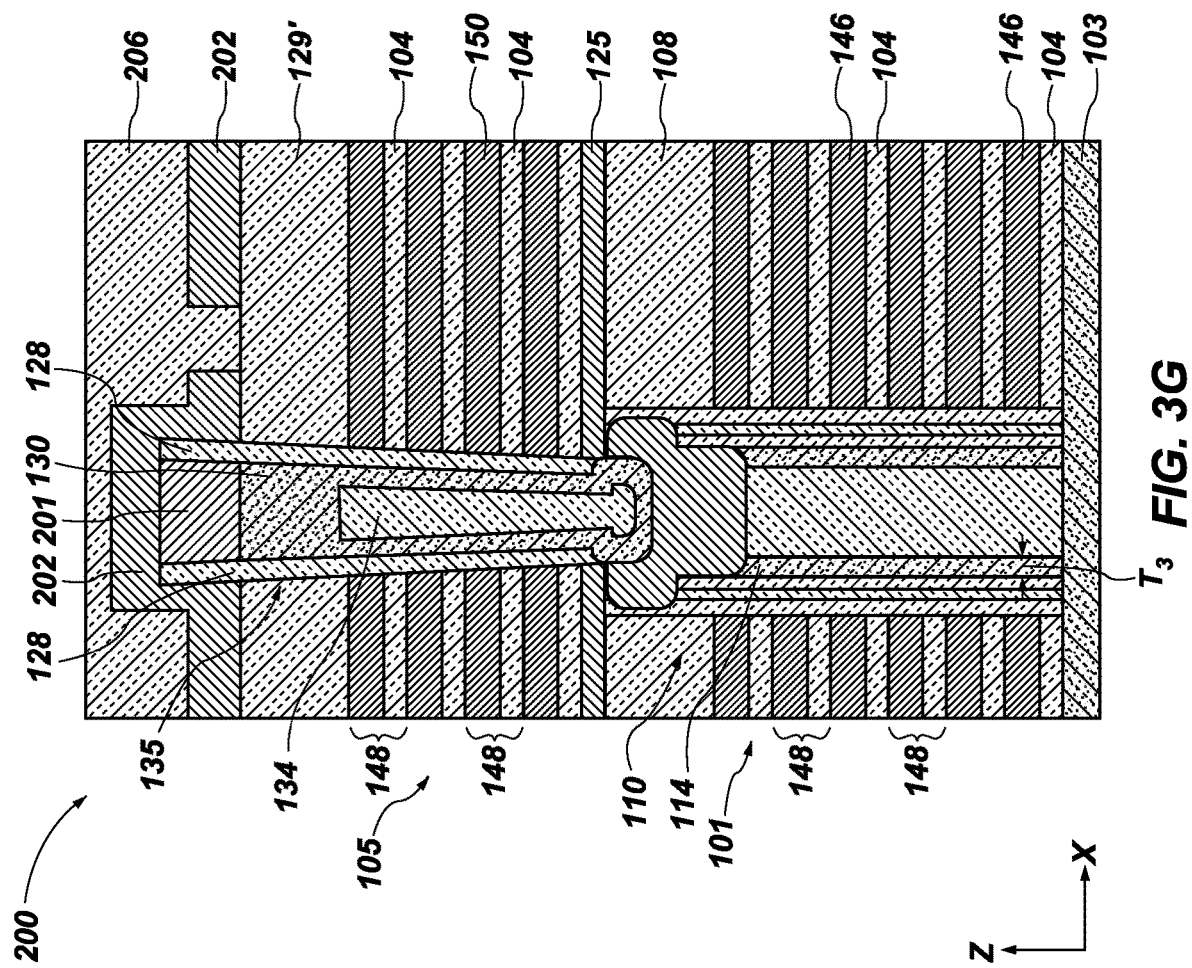

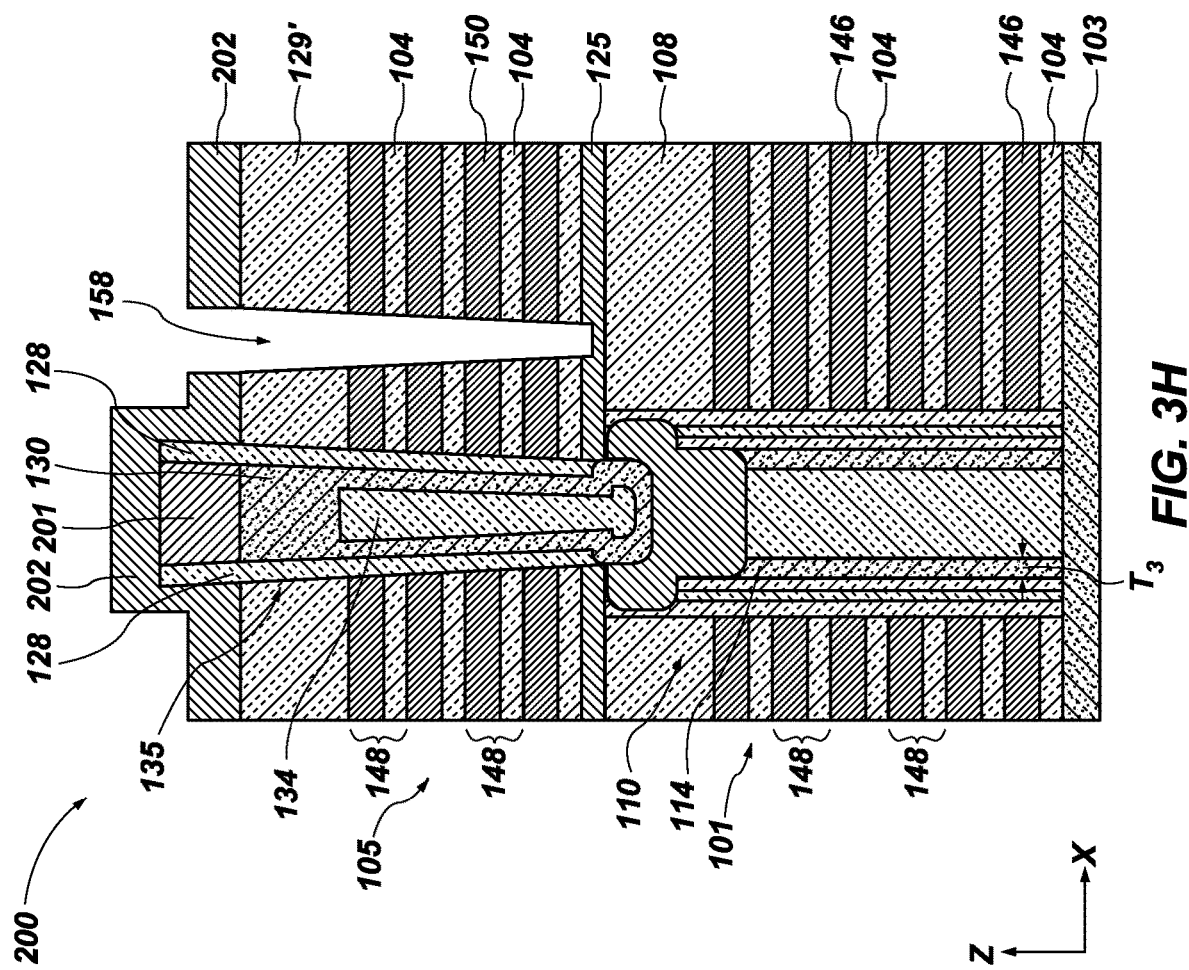

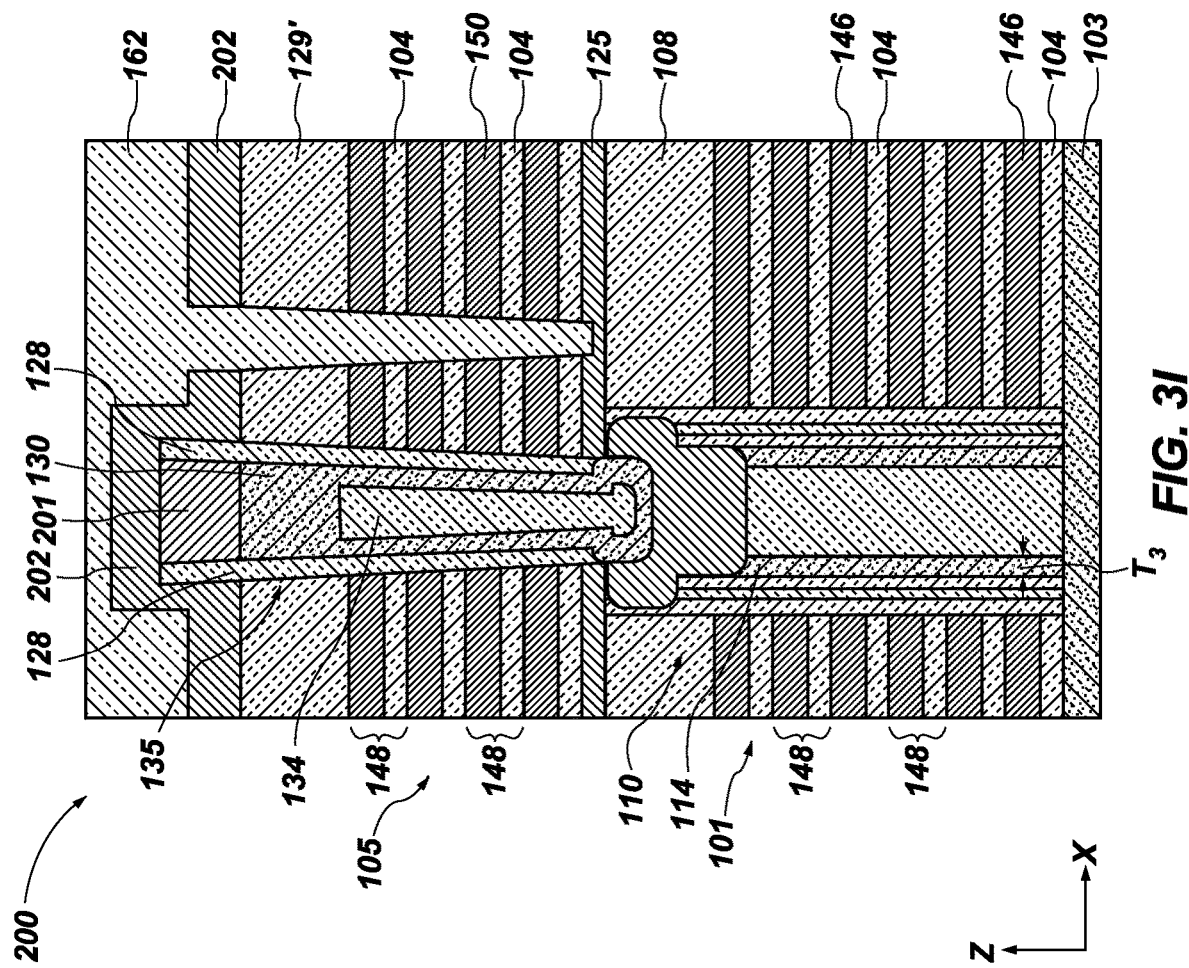

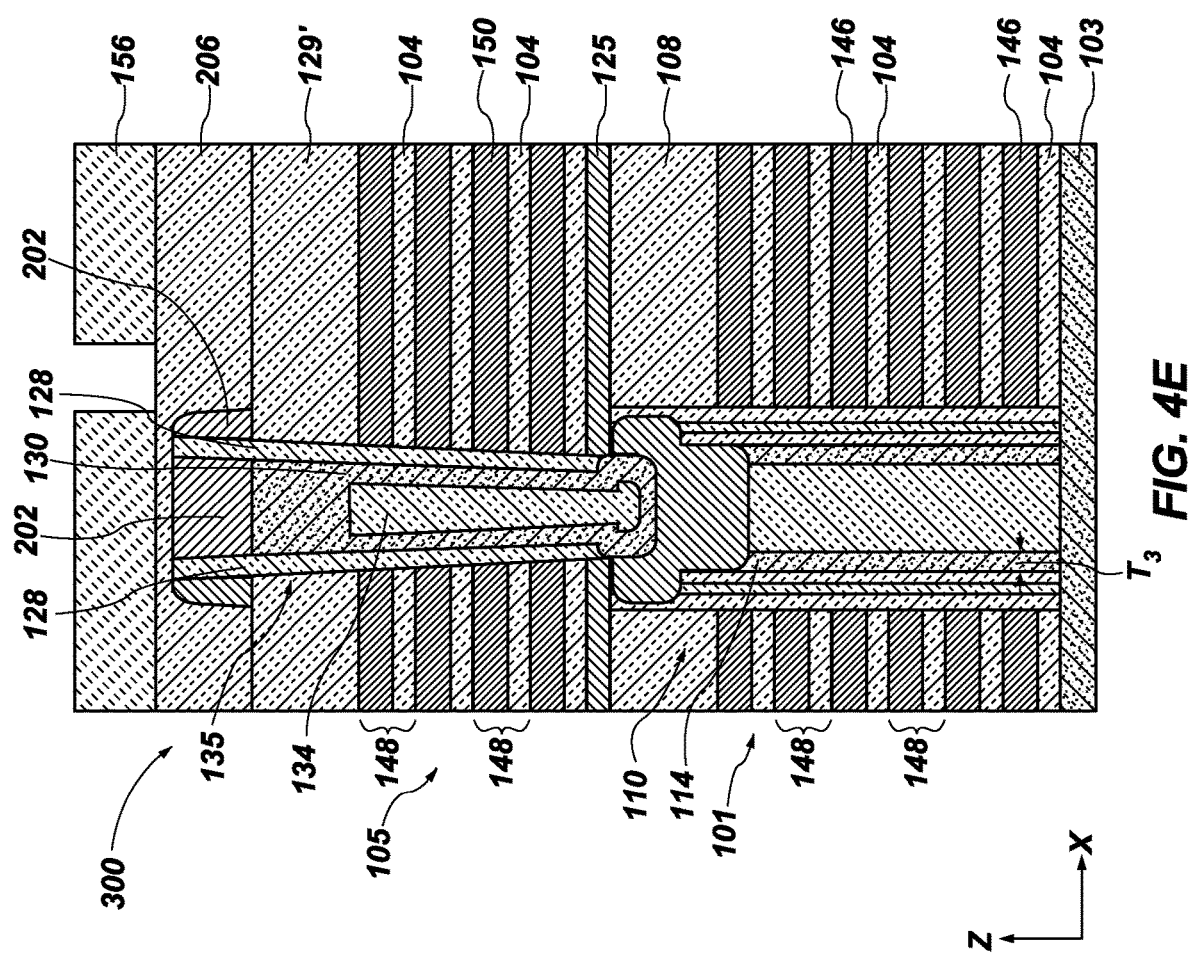

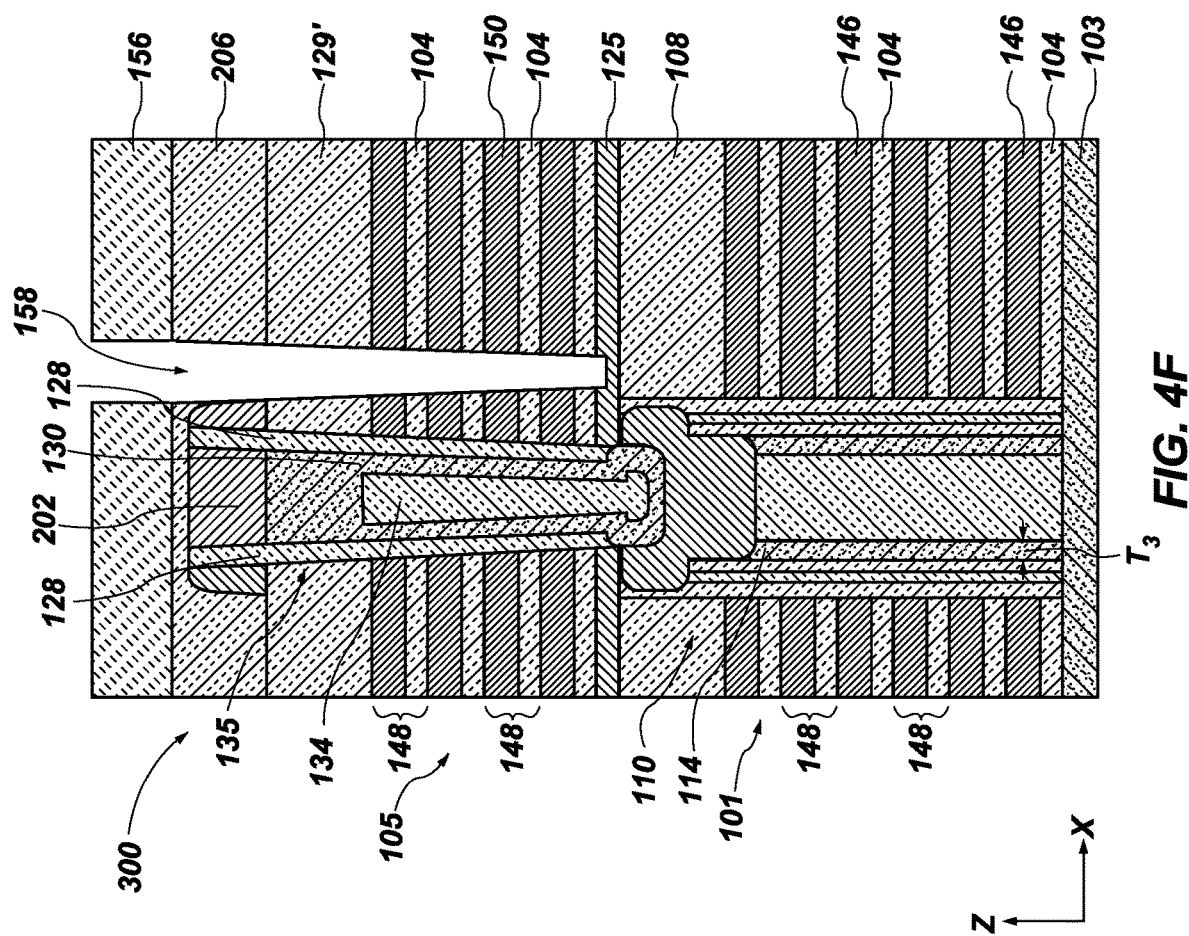

MICROELECTRONIC DEVICES INCLUDING SLOT STRUCTURES, AND RELATED ELECTRONIC SYSTEMS AND METHODS OF FORMING THE MICROELECTRONIC DEVICES

TECHNICAL FIELD

The disclosure, in various embodiments, relates generally to the field of microelectronic device design and fabrication. More specifically, the disclosure relates to microelectronic devices including slot structures, and related electronic systems and methods of forming the microelectronic devices.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in a stack of tiers of conductive structures (e.g., word lines) and dielectric materials at each junction of the vertical memory strings and the conductive structures. Such a configuration permits a greater number of switching devices (e.g., transistors) to be located in a unit of die area (i.e., length and width of active surface consumed) by building the array upwards (e.g., longitudinally, vertically) on a die, as compared to structures with conventional planar (e.g., two-dimensional) arrangements of transistors.

Conventional vertical memory arrays include electrical connections between the conductive structures and access lines (e.g., the word lines) so that memory cells in the vertical memory array can be uniquely selected for writing, reading, or erasing operations. One method of forming such an electrical connection includes forming a so-called "staircase" (or "stair step") structure at edges (e.g., horizontal ends) of the tiers of conductive structures. The staircase structure includes individual "steps" providing contact regions of the conductive structures upon which conductive contact structures can be positioned to provide electrical access to the conductive structures.

As vertical memory array technology has advanced, additional memory density has been provided by forming vertical memory arrays to include stacks comprising additional tiers of conductive structures and, hence, additional staircase structures and/or additional steps in individual staircase structures associated therewith. As the number of tiers of the conductive structures increases, processing conditions of the formation of aligned contacts to various components of the microelectronic device becomes increasingly difficult. In addition, other technologies to increase memory density have reduced the spacing between adjacent vertical memory strings. However, reducing the spacing between adjacent vertical memory strings may increase a difficulty of isolating the vertical memory strings.

BRIEF DESCRIPTION OF THE DRAWINGS

FIGS. 3A through 3K are simplified cross-sectional views showing a method of forming a microelectronic device structure, in accordance with other embodiments of the disclosure;

FIGS. 4A through 4G are simplified cross-sectional views showing a method of forming a microelectronic device structure, in accordance with yet other embodiments of the disclosure;

DETAILED DESCRIPTION

Figure 1A:
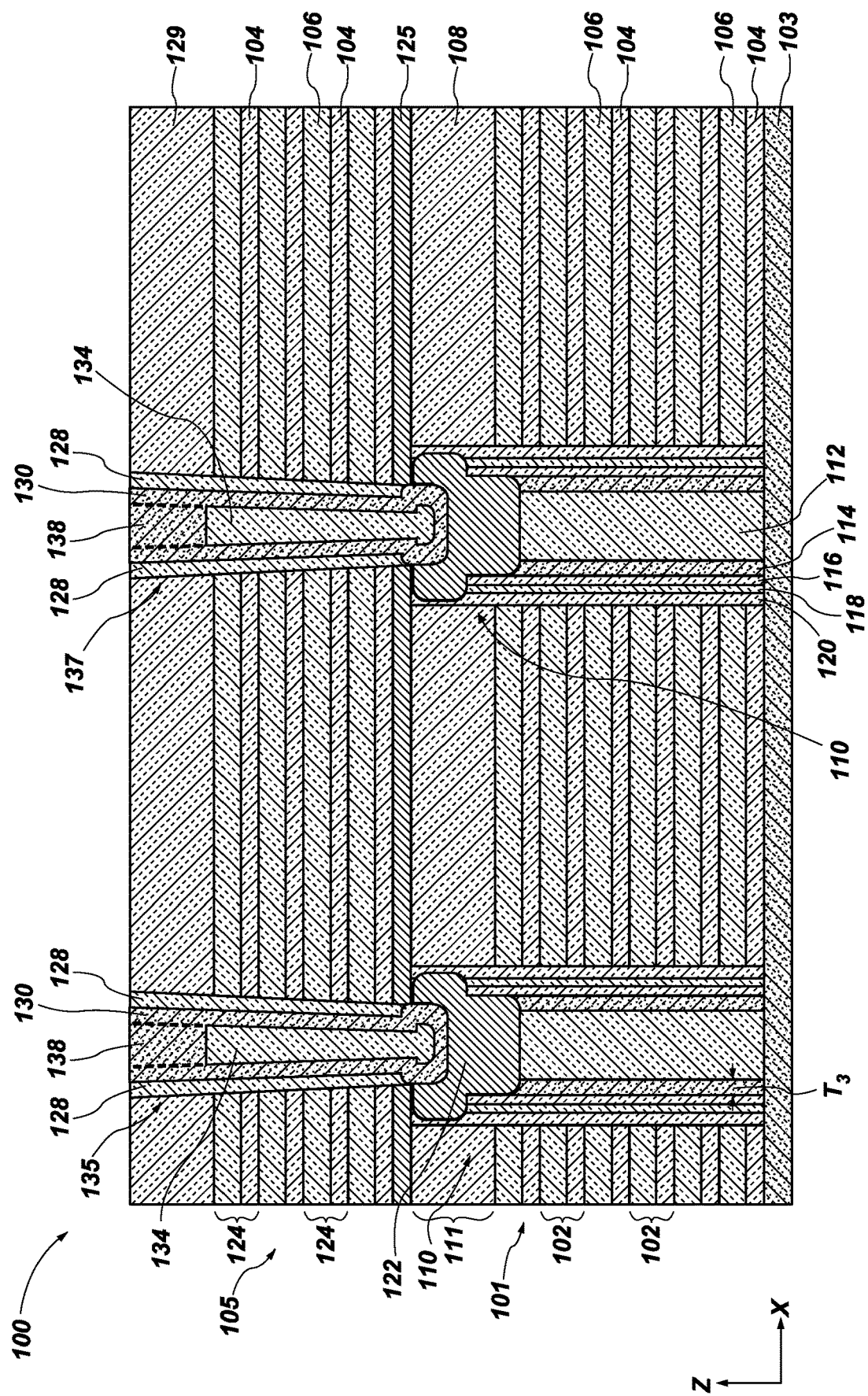
FIGS. 1A through 1N are simplified cross-sectional views (FIG. 1A, FIG. 1C, FIG. 1D, FIG. 1E, FIG. 1F, FIG. 1G, FIG. 1H, FIG. 1I, FIG. 1J, FIG. 1K, FIG. 1L, and FIG. 1N) and top-down views (FIG. 1B, FIG. 1J, and FIG. 1M) showing a method of forming a microelectronic device structure, in accordance with embodiments of the disclosure.

The illustrations included herewith are not meant to be actual views of any particular systems, microelectronic device structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device structure or microelectronic device (e.g., a memory device, such as a 3D NAND Flash memory device) or a complete microelectronic device. The structures described below do not form a complete microelectronic device. Only those process acts and structures necessary to understand the embodiments described herein are described in detail below. Additional acts to form a complete microelectronic device from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material, such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe— and Ni-based alloy, a Co— and Ni-based alloy, an Fe— and Co-based alloy, a Co— and Ni— and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes electrically insulative material, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

According to embodiments described herein, a microelectronic device comprises a stack structure comprising alternating conductive structures and insulative structures arranged in tiers, each tier comprising a conductive structure and an insulative structure. Memory cells extend through the stack structure and may comprise, for example, a channel material extending through the stack structure as part of a pillar structure. The memory cells may be arranged in rows and columns. The memory cells may be located at intersections between the conductive structures of the tiers and the pillar structures including the channel material, adjacent memory cells being separated from each other by one of the insulative structures. In some embodiments, the memory cells are horizontally (e.g., laterally) aligned with each other and in other embodiments the memory cells are horizontally offset from each other.

Another stack structure may vertically overlie the stack structure and may include additional conductive structures and additional insulative structures arranged in tiers. The microelectronic device may be separated into one or more block structures by slot structures containing a dielectric material. Each of the block structures may be separated into one or more sub-block structures by the slot structures extending through at least a portion of the other stack structure. Pillars extend through the other stack structure and vertically overlie the memory cells. The pillars may include a channel material electrically coupled to the channel material of the memory cells. The pillars that extend through the other stack structure may be substantially concentric with (e.g., aligned with) the underlying memory cells. Centering the pillar structures that extend through the other stack structure with the memory cells may facilitate an increased overlay margin between the memory cells and the pillar structures.

The microelectronic device may be formed by forming memory cells including a channel material extending through the stack structure and forming the other stack structure over the stack structure. The stack structure may comprise tiers comprising alternating insulative structures and nitride structures. The other stack structure may include tiers of alternating additional insulative structures and additional nitride structures. Pillar structures comprising a channel material may be formed over the memory cells of the stack structure and be in electrical communication with the channel material of the stack structure. The slot structure may be formed through the other stack structure to divide the microelectronic device into one or more sub-block structures. The nitride structures may be removed and replaced with conductive structures through a slit to form strings of memory cells. The additional nitride structures may simultaneously be removed and replaced with additional conductive structures through the slit to form select gate structures. The slot structures may be formed through at least a portion of the other stack structure to form one or more sub-block structures in each block structure. The slot structures may exhibit a non-linear shape that includes one or more arcuate surfaces defining a weave pattern between columns of the pillar structures of the other stack structure. The slot structures may be formed by self-aligning the slot structures with the pillar structures that extend through the other stack structure. A dielectric material, such as an oxide material, may be formed in the slots and exhibit a corresponding weave pattern, resulting in the slot structures. The weave pattern of the slot structures may optionally include protrusions. The pillar structures directly neighboring (e.g., adjacent to) the slot structures may be concentrically located over the underlying memory cells. In some embodiments, a distance between pillar structures of neighboring columns separated by one of the slot structures may be equal to a distance between neighboring pillar structures that are not separated by the slot structures. The self-alignment of the slot structures may facilitate increased overlay margin between the slot structures and the pillar structures.

Figure 1B:
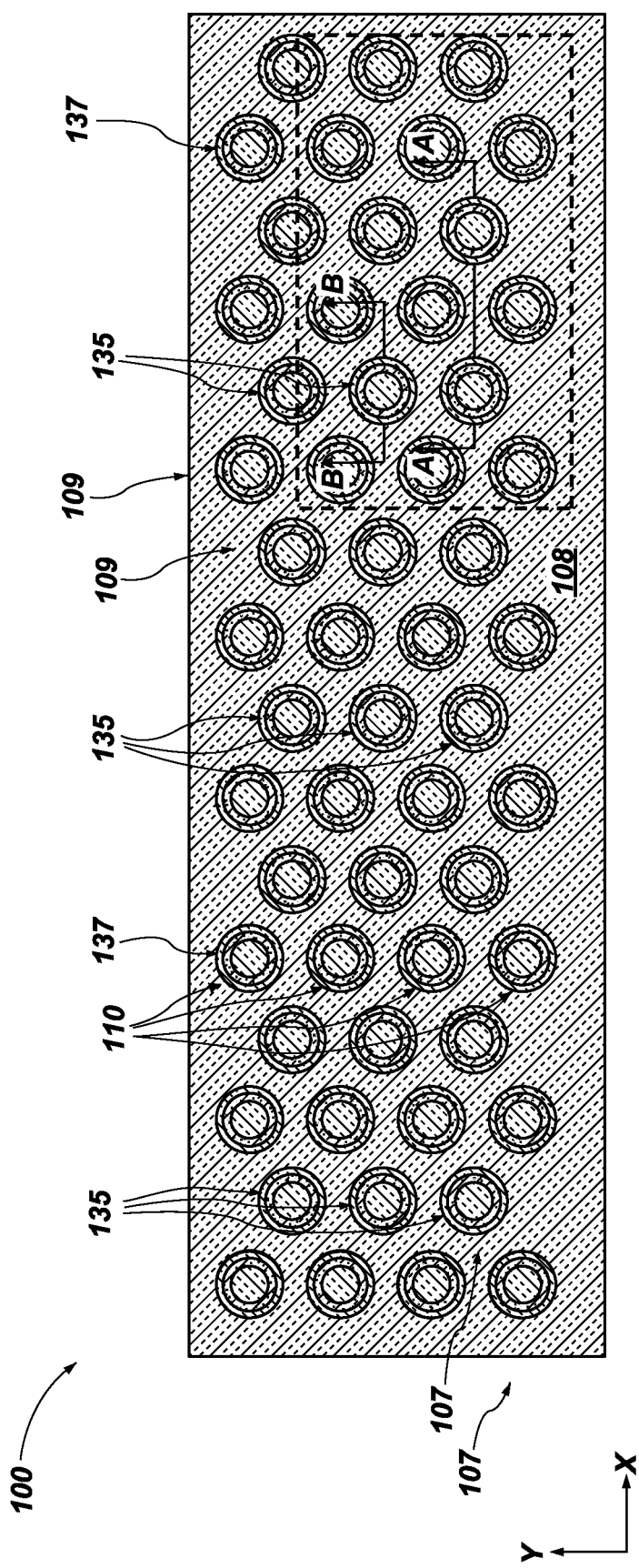
Figure 1C:
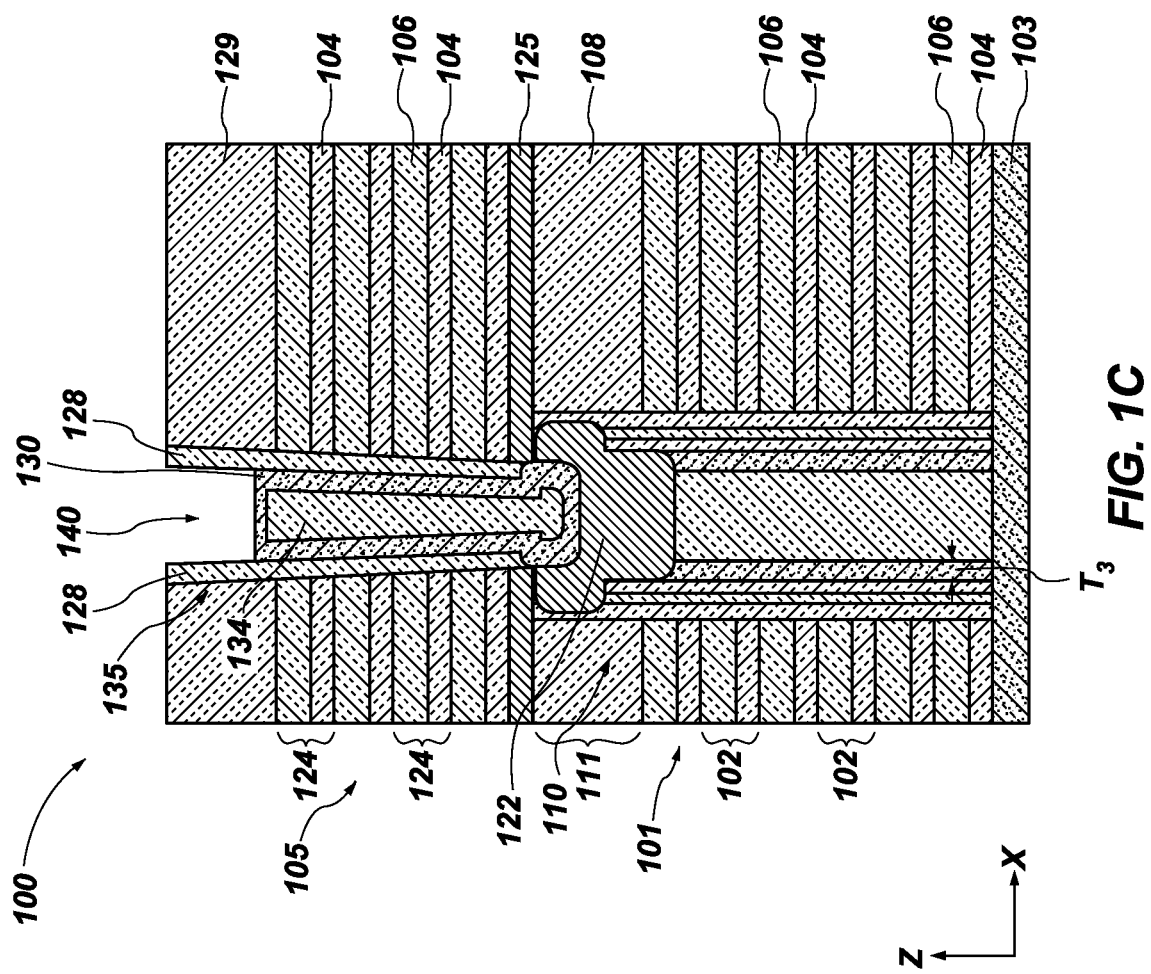
Figure 1E:
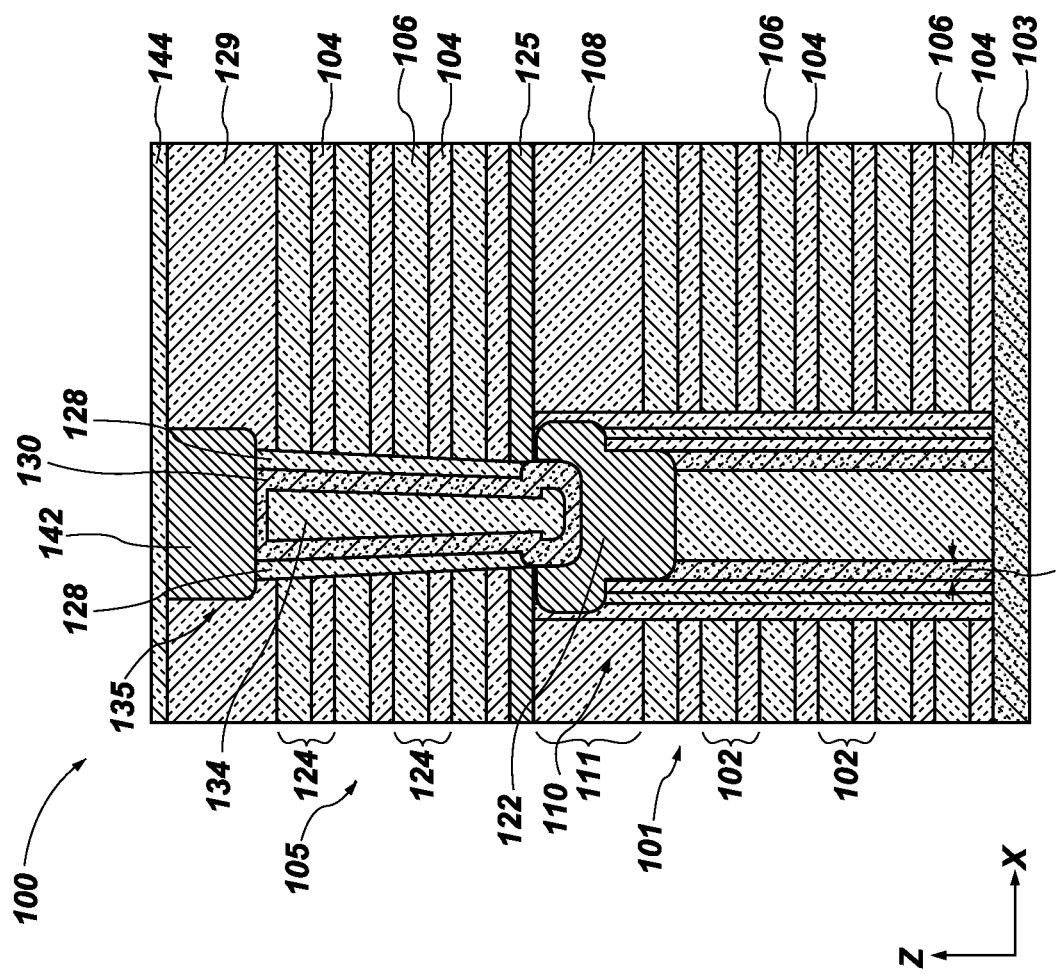
Figure 1G:
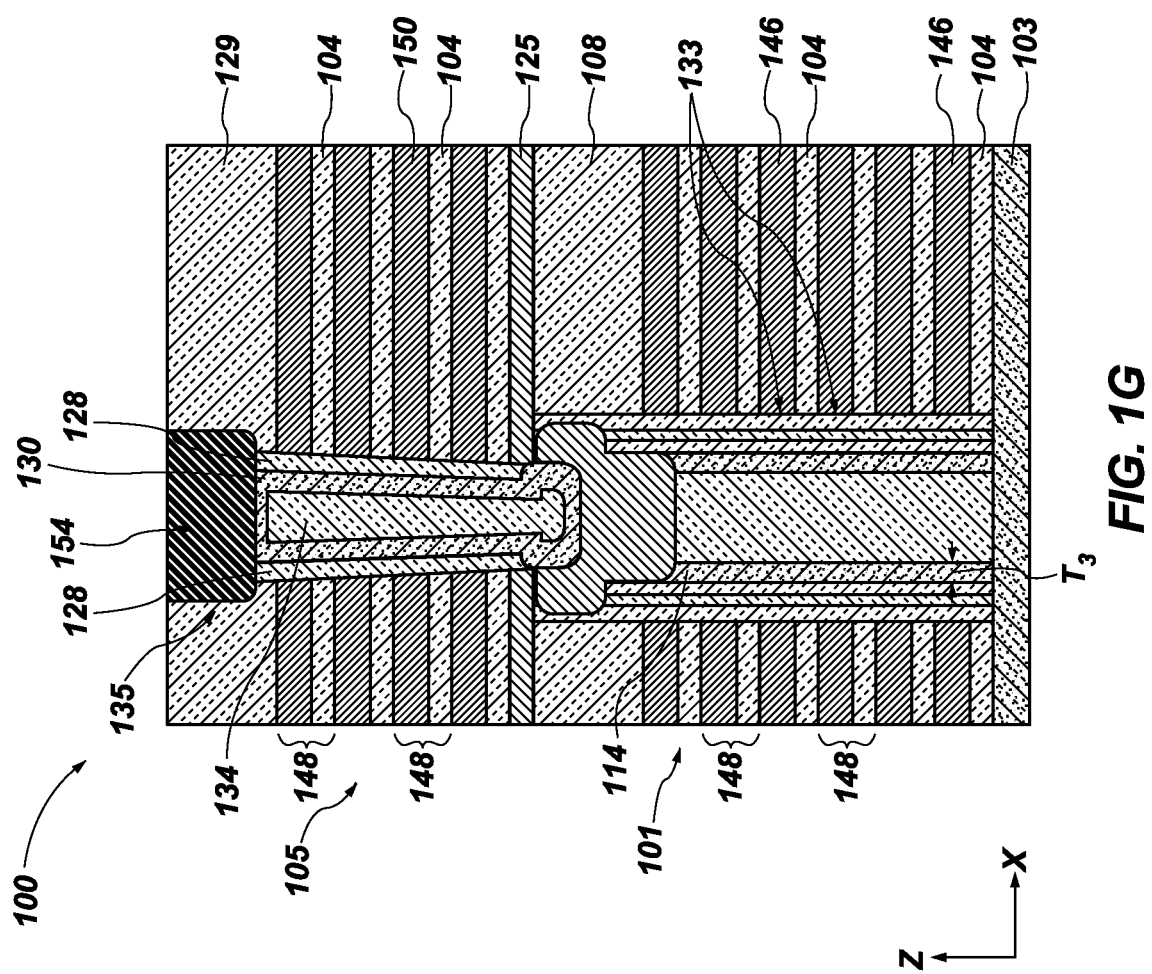
Figure 1H:
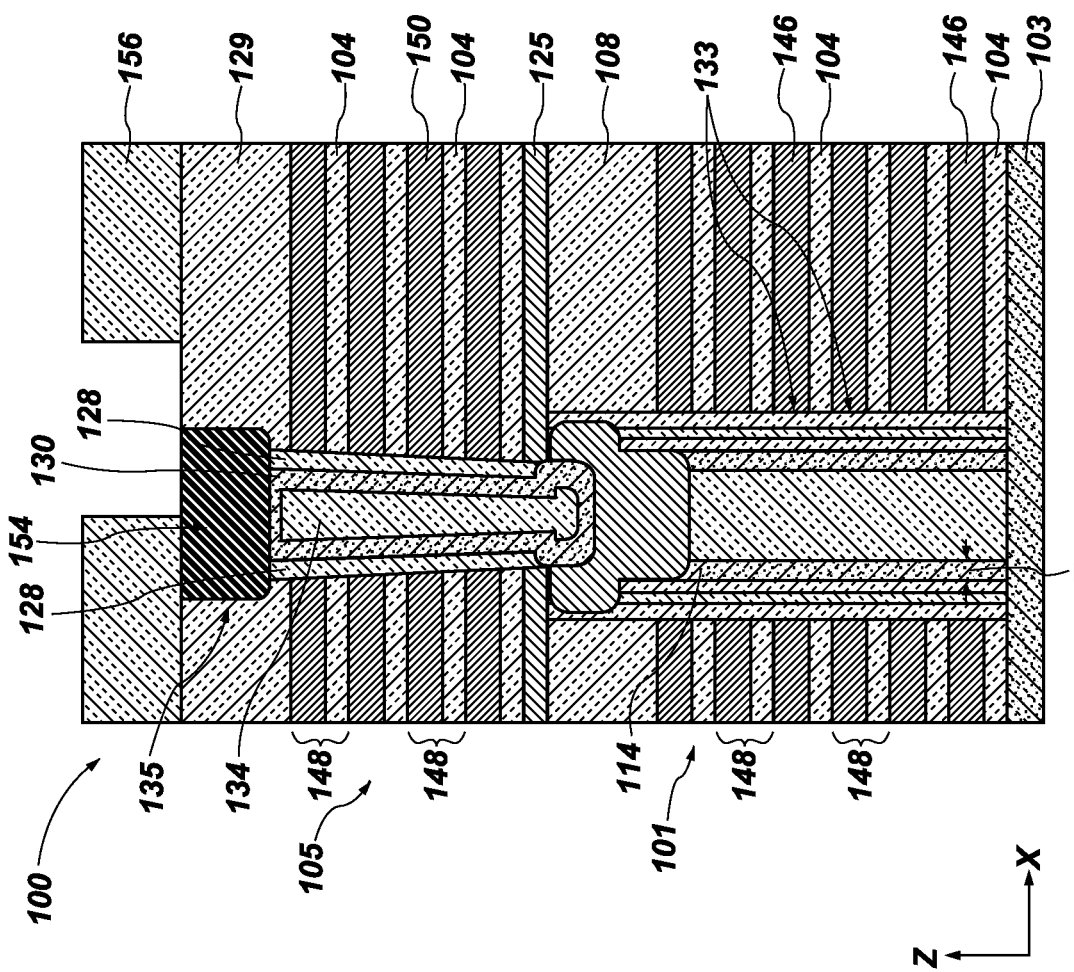
Figure 1I:
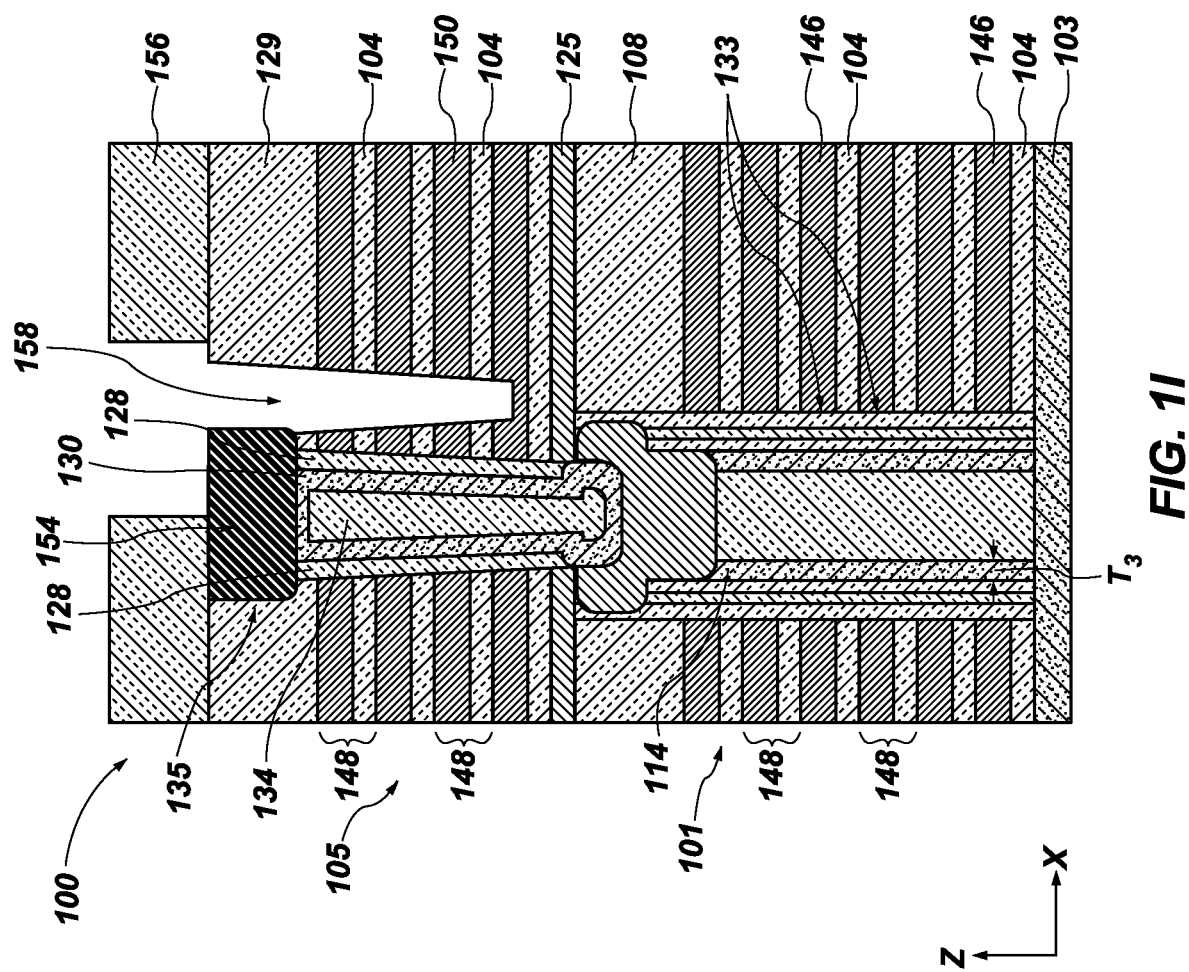
Figure 1J:
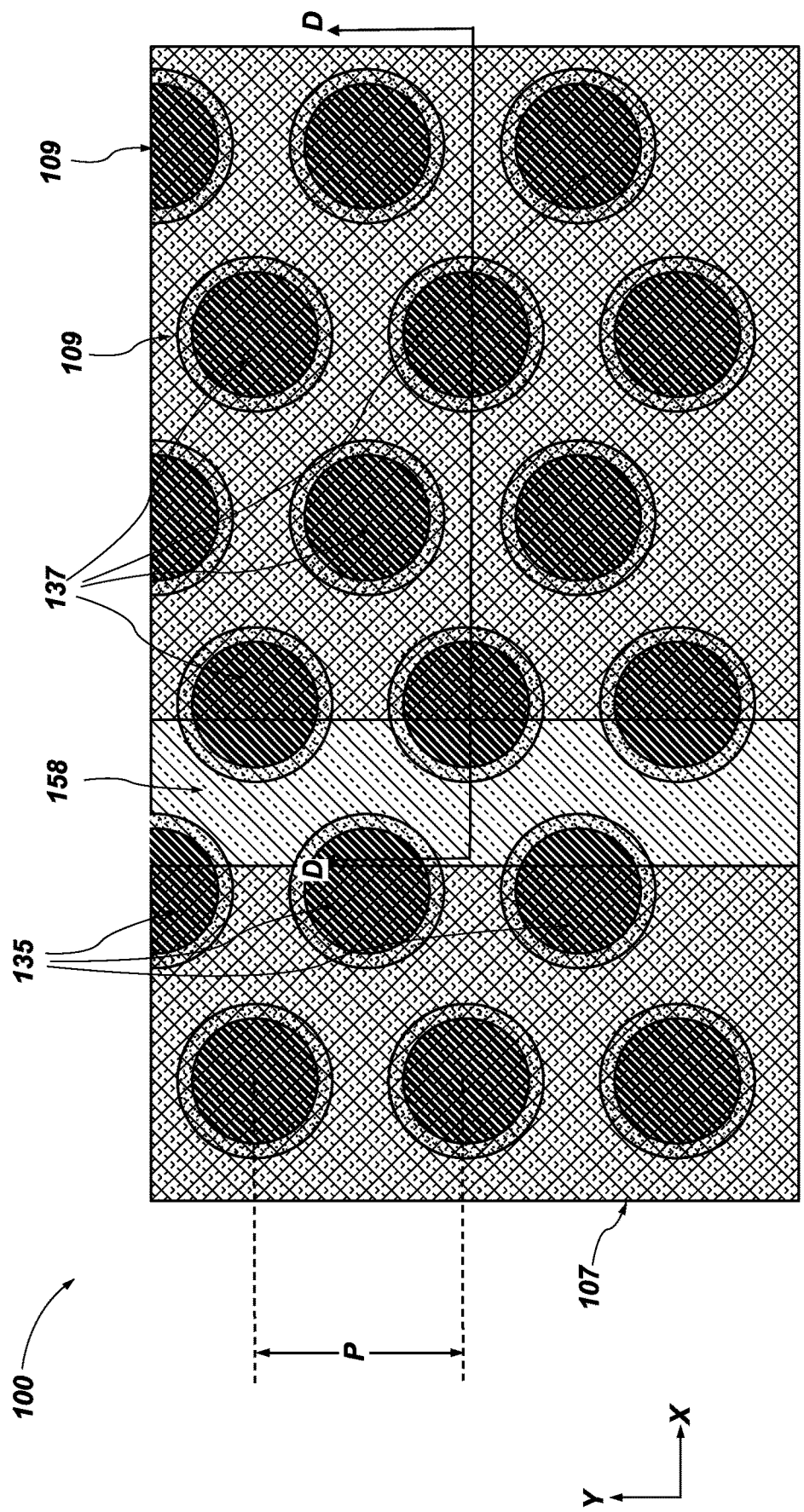
Figure 1K:
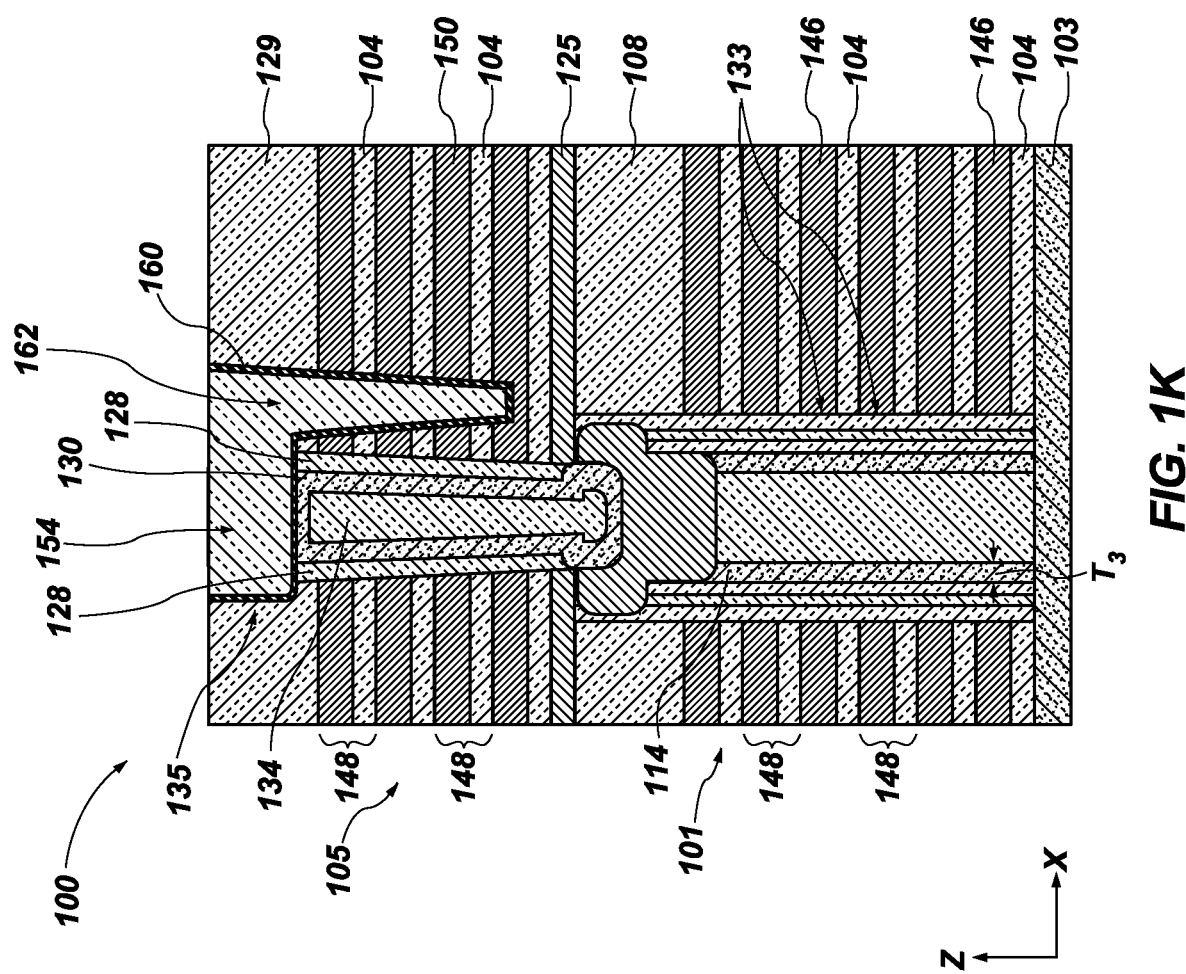
Figure 1M:
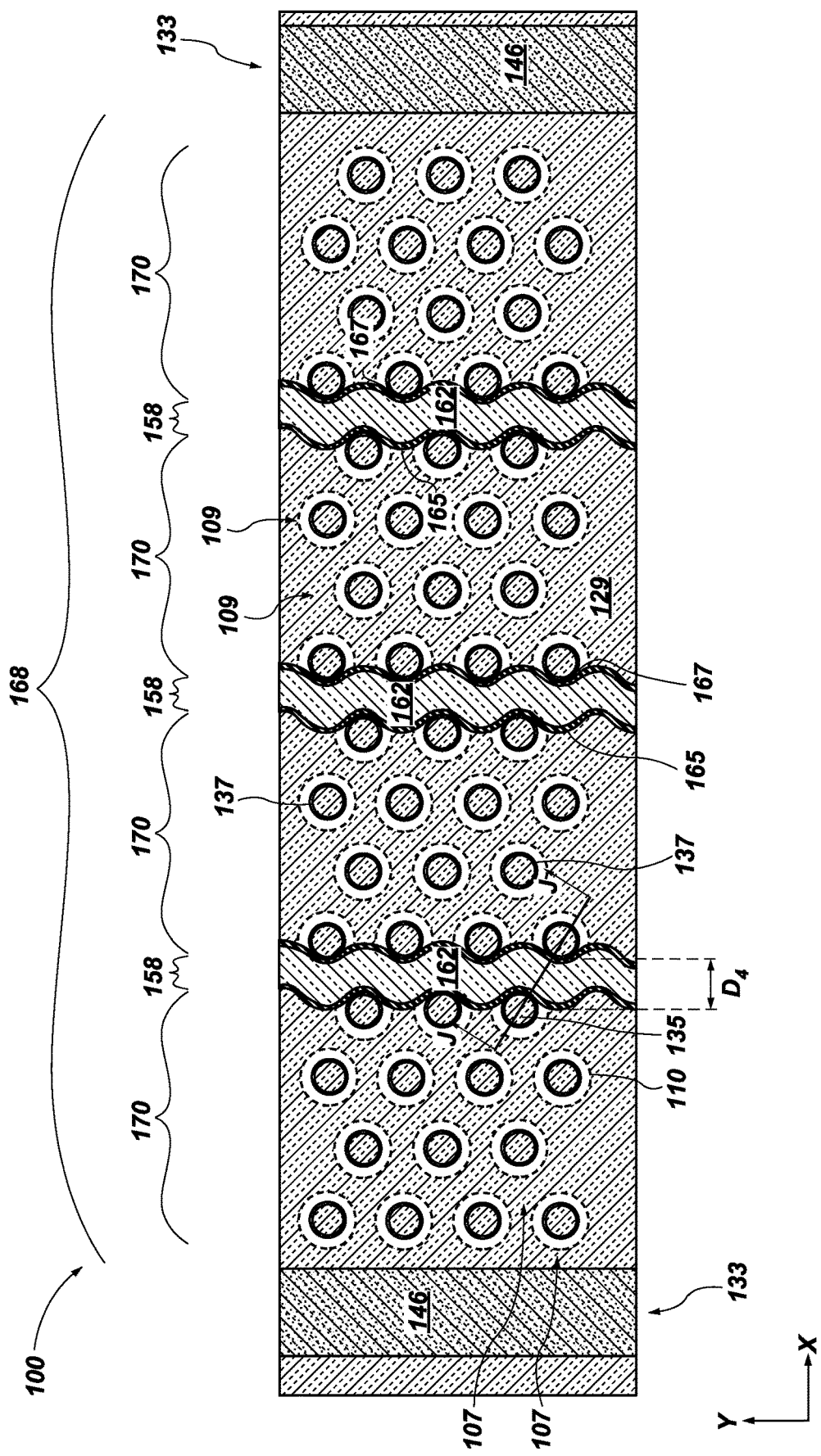
Figure 1N:
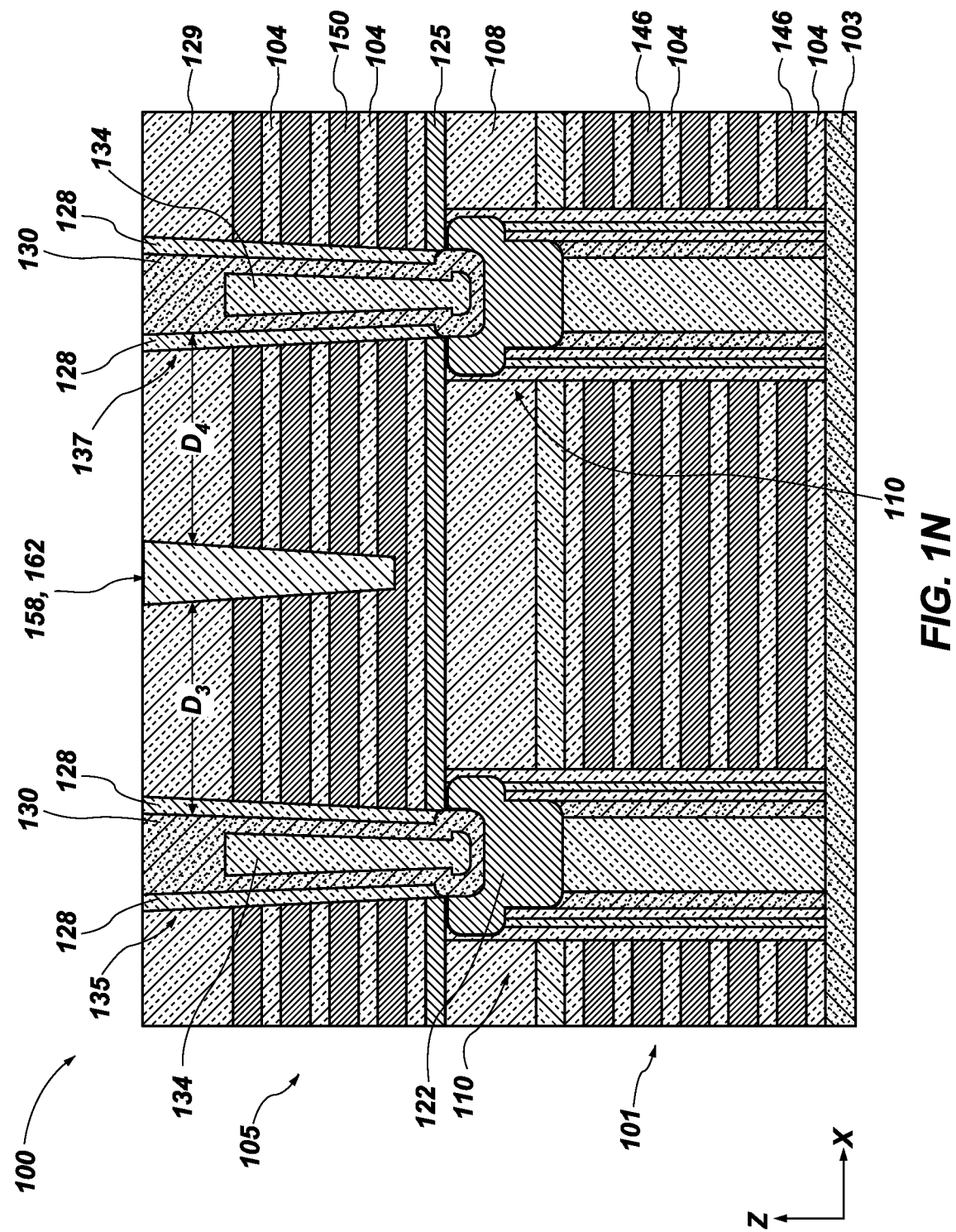

FIGS. 1A through 1N illustrate a method of forming a microelectronic device structure, in accordance with embodiments of the disclosure. FIG. 1A is a simplified partial cross-sectional view of a microelectronic device structure 100, in accordance with embodiments of the disclosure. The cross-section of FIG. 1A is taken through section line A-A of FIG. 1B. The microelectronic device structure 100 may include a stack structure 101 including a vertically (e.g., in the Z-direction) alternating sequence of insulative structures 104 and other insulative structures 106 arranged in tiers 102. Each of the tiers 102 may individually include a level of an insulative structure 104 directly vertically neighboring (e.g., adjacent) a level of the other insulative structures 106. The insulative structures 104 of the stack structure 101 may also be referred to herein as "insulative materials" and the other insulative structures 106 of the stack structure 101 may also be referred to herein as "other insulative materials."

The stack structure 101 includes a first deck structure vertically overlying a source structure 103 and tiers 102 of the insulative structures 104 and the other insulative structures 106. The source structure 103 may be formed of and include, for example, a semiconductor material doped with one or more P-type conductivity materials (e.g., polysilicon doped with at least one P-type dopant, such as one or more of boron, aluminum, and gallium) or one or more N-type conductivity materials (e.g., polysilicon doped with at least one N-type dopant, such as one or more of arsenic, phosphorous, antimony, and bismuth). In some embodiments, the stack structure 101 may be referred to herein as a deck structure or a first deck structure. Although FIG. 1A has been described and illustrated as including the stack structure 101 directly over (e.g., on) the source structure 103, the disclosure is not so limited. In some embodiments, the stack structure 101 overlies a deck structure comprising additional tiers 102 of insulative structures 104 and other insulative structures 106 separated from the stack structure 101 by at least one dielectric material.

The levels of the insulative structures 104 may be formed of and include, for example, at least one dielectric material, such as one or more of an oxide material (e.g., silicon dioxide ($SiO_2$)), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), and aluminum oxide ($Al_2O_3$). The levels of the other insulative structures 106 may be formed of and include an insulative material that is different than, and exhibits an etch selectivity with respect to, the insulative structures 104. In some embodiments, the other insulative structures 106 are formed of and include a nitride material (e.g., silicon nitride ($Si_3N_4$)) or an oxynitride material (e.g., silicon oxynitride).

A dielectric material 108 may be located over an uppermost one of the tiers 102. The dielectric material 108 may be formed of and include an electrically insulative material, such as, for example, one or more of phosphosilicate glass (PSG), borosilicate glass (BSG), fluorosilicate glass (FSG), borophosphosilicate glass (BPSG), and silicon dioxide. In some embodiments, the dielectric material 108 comprises the same material composition as the insulative structures 104.

Pillars 110 (e.g., cell pillars) of materials may vertically extend (e.g., in the Z-direction) through the stack structure 101. The materials of the pillars 110 may form memory cells (e.g., strings of memory cells). The pillars 110 may each individually comprise an insulative material 112, a channel material 114 horizontally neighboring the insulative material 112, a tunnel dielectric material 116 (also referred to as a "tunneling dielectric material") horizontally neighboring the channel material 114, a memory material 118 horizontally neighboring the tunnel dielectric material 116, and a dielectric blocking material 120 (also referred to as a "charge blocking material") horizontally neighboring the memory material 118. The dielectric blocking material 120 may be horizontally neighboring one of the levels of other insulative structures 106 of one of the tiers 102 of the stack structure 101. The channel material 114 may be horizontally interposed between the insulative material 112 and the tunnel dielectric material 116; the tunnel dielectric material 116 may be horizontally interposed between the channel material 114 and the memory material 118; the memory material 118 may be horizontally interposed between the tunnel dielectric material 116 and the dielectric blocking material 120; and the dielectric blocking material 120 may be horizontally interposed between the memory material 118 and a level of the other insulative structure 106.

The insulative material 112 may be formed of and include an electrically insulative material such as, for example, phosphosilicate glass (PSG), borosilicate glass (BSG), fluorosilicate glass (FSG), borophosphosilicate glass (BPSG), silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), a dielectric carbon nitride material (e.g., silicon carbon nitride (SiCN)), a dielectric carboxynitride material (e.g., silicon carboxynitride (SiOCN)), or combinations thereof.

The channel material 114 may be formed of and include one or more of a semiconductor material (at least one elemental semiconductor material, such as polycrystalline silicon; at least one III-V compound semiconductor material, at least one II-VI compound semiconductor material, at least one organic semiconductor material, GaAs, InP, GaP, GaN, other semiconductor materials), and an oxide semiconductor material.

The tunnel dielectric material 116 may be formed of and include a dielectric material through which charge tunneling can be performed under suitable electrical bias conditions, such as through hot-carrier injection or by Fowler-Nordheim tunneling induced charge transfer. By way of non-limiting example, the tunnel dielectric material 116 may be formed of and include one or more of silicon oxide, silicon nitride, silicon oxynitride, dielectric metal oxides (such as aluminum oxide and hafnium oxide), dielectric metal oxynitride, dielectric metal silicates, alloys thereof, and/or combinations thereof.

The memory material 118 may comprise a charge trapping material or a conductive material. The memory material 118 may be formed of and include one or more of silicon nitride, silicon oxynitride, polysilicon (doped polysilicon), a conductive material (tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), a polycrystalline semiconductive material or an amorphous semiconductor material including at least one elemental semiconductor element or at least one compound semiconductor material, conductive nanoparticles (e.g., ruthenium nanoparticles), or metal dots.

The dielectric blocking material 120 may be formed of and include a dielectric material such as, for example, one or more of an oxide (e.g., silicon dioxide), a nitride (silicon nitride), and an oxynitride (silicon oxynitride), or another material. In some embodiments the tunnel dielectric material 116, the memory material 118, and the dielectric blocking material 120 together may comprise a structure configured to trap a charge, such as, for example, an oxide-nitride-oxide (ONO) structure. The above-mentioned components of the stack structure 101 may be formed by conventional techniques.

After forming the pillars 110, a portion of the pillars 110 may be removed to recess the pillars 110 relative to an uppermost surface of the dielectric material 108. In some embodiments, a portion of the insulative material and the channel material 114 may be recessed vertically lower (e.g., in the Z-direction) than the other components of the pillars 110 (e.g., the tunnel dielectric material 116, the memory material 118, the dielectric blocking material 120). In some embodiments, a conductive material 122 may be formed within the recesses to form a so-called "conductive plug structure." The conductive material 122 may be formed of and include, a polysilicon or another material formulated to exhibit an etch selectivity with respect to the material of the dielectric material 108 and, in some embodiments, with respect to one or more of the materials of the pillar 110. In some embodiments, the conductive material 122 is electrically connected to (e.g., in electrical communication with) the channel material 114. In some embodiments, after forming the conductive material 122, the microelectronic device structure 100 may be exposed to a chemical mechanical planarization (CMP) process to remove conductive material from outside surfaces of the recesses (e.g., on an upper surface of the dielectric material 108).

With continued reference to FIG. 1A, after forming the conductive material 122, another stack structure 105 (e.g., an upper stack structure, a select gate drain (SGD) stack structure) (which may also be referred to herein as a "second deck structure") may be formed over the stack structure 101. The other stack structure 105 may include alternating levels of additional insulative structures 104 and the additional other insulative structures 106. The alternating level of additional insulative structures 104 and the additional other insulative structures 106 may be formed over an optional etch stop material 125. The alternating levels of the insulative structures 104 and the other insulative structures 106 may be arranged in tiers 124. The dielectric material 108 between the stack structure 101 and the other stack structure 105 may be referred to as an interdeck region 111. The other stack structure 105 may include an uppermost insulative structure 129 having a greater thickness in a vertical direction (e.g., in the Z-direction) than other insulative structures 104 of the other stack structure 105.

The etch stop material 125 may be formed of and include, for example, a material exhibiting an etch selectivity with respect to the insulative structures 104 and the other insulative structures 106. In some embodiments, the microelectronic device structure 100 may not include (e.g., lacks) the etch stop material 125 between the stack structure 101 and the other stack structure 105. In some such embodiments, only the dielectric material 108 may intervene between the stack structure 101 and the other stack structure 105. The etch stop material 125 may be formed adjacent to (e.g., on) the stack structure 101 by conventional techniques.

Upper pillar structures may vertically extend (e.g., in the Z-direction) through the another stack structure 105. The upper pillar structures may include first upper pillar structures 135 and second upper pillar structures 137 (collectively referred to as upper pillar structures 135, 137). The upper pillar structures 135, 137 may be horizontally aligned with (e.g., in each of the X-direction and the Y-direction) a center of the vertically underlying (e.g., in the Z-direction) pillars 110. In other words, each of the upper pillar structures 135, 137 may be centered over a respective pillar 110. The upper pillar structures 135, 137 may extend into the conductive material 122, and may be substantially concentric (e.g., located centrally) with the underlying pillars 110. The upper pillar structures 135, 137 may each individually include a first liner material 128, a channel material 130 horizontally neighboring the first liner material 128, an insulative material 134 horizontally neighboring the channel material 130, and a plug material 138 overlying the insulative material 134 and horizontally neighboring the channel material 130. The first liner material 128 may be horizontally neighboring one of the levels of other insulative structures 106 of one of the tiers 124 of the other stack structure 105. The channel material 130 may be horizontally interposed between the first liner material 128 and the insulative material 134. The insulative material 134 may also vertically overlie (e.g., in the Z-direction) the channel material 130, such as the horizontally extending portion of the channel material 130 over conductive material 122. The plug material 138 may be horizontally interposed between adjacent portions of the channel material 130.

The first liner material 128 may be formed of and include, for example, an insulative material, such as one or more of the materials described above with reference to the insulative material 112. In some embodiments, the first liner material 128 comprises silicon dioxide. The channel material 130 may be in electrical communication with the channel material 114 through the conductive material 122. The channel material 130 may comprise one or more of the materials described above with reference to the channel material 114. In some embodiments, the channel material 130 comprises the same material composition as the channel material 114. In some embodiments, the channel material 130 may be continuous with the channel material 114. Since the channel material 130 may comprise the same material composition as the channel material 114 and the channel material 130 is in electrical communication with the channel material 114 through the conductive material 122, as used herein, the channel material 114, the conductive material 122, and the channel material 130 may be collectively referred to as a channel region. The channel material 130 may be formed of and include, a polysilicon or another material formulated to exhibit an etch selectivity with respect to the material of the first liner material 128.

The insulative material 134 may be formed of and include one or more of the materials described above with reference to the insulative material 112. In some embodiments, the insulative material 134 comprises substantially the same material composition as the insulative material 112. In some embodiments, the insulative material 134 comprises silicon dioxide. In some embodiments, the microelectronic device structure 100 is exposed to a planarization process, such as a CMP process, after forming the insulative material 134. After forming the insulative material 134, at least a portion of the insulative material 134 may be removed from within the upper pillar structures 135, 137 to form a recess. A conductive material may be formed in the recess to form the plug material 138. The conductive material of the plug material 138 may be the same as or different than the material of the channel material 130. The plug material 138 may be formed of and include, a polysilicon or another conductive material formulated to exhibit an etch selectivity with respect to the material of the dielectric material 108 and, in some embodiments, with respect to one or more of the materials of the pillar 110. In some embodiments, the plug material 138 comprises one or more of polysilicon, tungsten, molybdenum, tungsten silicide, or silicon germanium. The plug material 138 is shown in FIG. 1A with dashed lines and using the same cross-hatching as the material of the channel material 130, indicating the material of the plug material 138 may be the same as the material of the channel material 130. However, the material of the plug material 138 may, alternatively, be different than the material of the channel material 130. In subsequent drawings, the plug material 138 is shown as being the same material as the channel material 130. Therefore, the same cross-hatching is used for the channel material 130 and the plug material 138 in subsequent drawings. The above-mentioned components of the another stack structure 105 may be formed by conventional techniques.

FIG. 1B is a top-down view of the microelectronic device structure 100 of FIG. 1A. Referring to FIG. 1B, pillars 110 may be aligned with each other (e.g., in the Y-direction). The pillars 110 may be arranged in a so-called weave pattern (e.g., a hexagonal close-packed arrangement), which may facilitate an increased density of the pillars 110 (and the resulting memory cells) in the stack structure 101. The pillars 110 may be arranged in rows 107 extending in a first horizontal (e.g., lateral) direction (e.g., in the X-direction) and columns 109 extending in a second horizontal direction (e.g., in the Y-direction). The pillars 110 of a column 109 may be horizontally aligned (e.g., in the Y-direction). Similarly, the pillars 110 of a row 107 may be horizontally aligned (e.g., in the X-direction).

With continued reference to FIG. 1B, the first upper pillar structures 135 and the second upper pillar structures 137 may be similarly arranged in rows 107 extending in a first horizontal (e.g., lateral) direction (e.g., in the X-direction) and columns 109 extending in a second horizontal direction (e.g., in the Y-direction). The first upper pillar structures 135 of a column 109 may be horizontally aligned (e.g., in the Y-direction) with one another. Similarly, the second upper pillar structures 137 may be horizontally aligned (e.g., in the Y-direction) with one another. Similarly, the upper pillar structures 135, 137 of a row 107 may be horizontally aligned (e.g., in the X-direction). As shown in FIG. 1B, the first upper pillar structures 135 may exist at 9 locations. The remaining upper pillar structures may be second upper pillar structures 137.

With reference to FIG. 1C, the first upper pillar structure 135 of microelectronic device structure 100 from FIG. 1A and taken through section line B-B of FIG. 1B is shown. A portion of the channel material 130 and a portion of the plug material 138 of the first upper pillar structure 135 may be removed (e.g., etched) from within the first upper pillar structure 135 to form a recess. In some embodiments, the recess is formed by an etch process including, but not limited to, a wet etch process or a vapor etch process. The first liner material 128 may not be substantially removed by the etching process, and may remain on the sidewalls of the first upper pillar structure 135.

With reference to FIG. 1D, a portion of the first liner material 128, and a portion of the uppermost insulative structure 129 may be removed (e.g., etched) to form an opening 140. The opening 140 may be formed by an etch process including, but not limited to, a wet etch process or a vapor etch process. In some embodiments, the etch process is a wet etch process. In other embodiments, the etch process is a vapor etch process. A dimension $D_1$ (e.g., a diameter) of the opening 140 within the uppermost insulative structure 129 may be within a range of from about 10 nm to about 40 nm, such as about 20 nm. A dimension $D_2$ (e.g., a depth) of the opening 140 within the uppermost insulative structure 129 may be within a range of from about 10 nm to about 40 nm, such as about 20 nm. The dimension $D_1$ and the dimension $D_2$ may be substantially the same as each other as a result of the etch process performed.

After forming the opening 140 in the uppermost insulative structure 129, a sacrificial structure 142 may be formed in the opening 140. With reference to FIG. 1E, the sacrificial structure 142 may substantially completely fill the opening 140. The sacrificial structure 142 may be formed of and include, a nitride material. In some embodiments, the microelectronic device structure 100 is exposed to a planarization process, such as a CMP process, after forming the sacrificial structure 142. An oxide material 144 may be formed adjacent to (e.g., over) the sacrificial structure 142 and the uppermost insulative structure 129. The oxide material 144 may be formed of and include, a silicon oxide material.

With reference to FIG. 1F, the microelectronic device structure 100 is subjected to a so-called "replacement gate" or "gate last" process. The "replacement gate" process may include forming a slit (not shown in the perspective of FIG. 1F) through the stack structure 101 and the other stack structure 105 to divide the microelectronic device into one or more block structures. The other insulative structures 106 may be removed and replaced with conductive structures 146 through the slit to form memory cells 133. By way of example only, the other insulative structures 106 may be removed by a wet etch process, such as a so-called "wet nitride strip." The additional other insulative structures 106 may simultaneously be removed and replaced with additional conductive structures 150 through the slit to form tiers 148. The sacrificial structure 142 may protect the underlying pillar structures and memory cells 133 during the replacement gate process. Some of the resulting conductive structures 146 of the stack structure 101 may serve as dummy structures (e.g., inactive structures) while others of the conductive structures 146 are active structures (e.g., local word lines). The conductive structures 146 may, for example, be formed of and include tungsten. The additional conductive structures 150 of the other stack structure 105 may serve as select gate structures, such as select gate drain (SGD) structures. While the method described herein and illustrated in FIGS. 1A-1K includes forming the conductive structures 146 and additional conductive structures 150 by a replacement gate process, the conductive structures 146 and additional conductive structures 150 may alternatively be formed by a floating gate process.

With reference to FIG. 1F, after performing the replacement gate process, the oxide material 144 and the sacrificial structure 142 may be removed (e.g., exhumed) from the opening 140 of the microelectronic device structure 100. By way of example only, the sacrificial structure 142 may be removed by a wet etch process, such as a so-called "wet nitride strip."

With reference to FIG. 1G, a hard mask material 154 may be formed in the opening 140 of the microelectronic device structure 100. The hard mask material 154 may substantially fill (e.g., back-fill) the opening 140. The hard mask material 154 may be formed of and include one or more of magnesium oxide ($MgO_x$), aluminum oxide (AlOx), and tungsten-doped carbon (W-doped carbon). In some embodiments, the microelectronic device structure 100 is exposed to a planarization process, such as a CMP process, after forming the hard mask material 154.

Referring to FIG. 1H, a mask material 156 may be formed adjacent (e.g., over) the uppermost insulative structure 129 and the hard mask material 154. The mask material 156 may be formed of and include one or more of a photoresist material, a dielectric antireflective coating (DARC) material, magnesium oxide (MgOx), and doped carbon (such as tungsten-doped carbon, tantalum-doped carbon, boron-doped carbon, or silicon-doped carbon). The mask material 156 may be patterned by conventional techniques to expose a portion of the hard mask material 154 and the uppermost insulative structure 129.

Slots 158 may be formed through at least a portion of the other stack structure 105 to form one or more sub-block structures in each block structure, as shown in FIG. 1I and FIG. 1J. The slots 158 may be located and formed in proximity to the first upper pillar structure 135. The location of the slots 158 may be determined by the location of the first upper pillar structures 135. By using the hard mask material 154 and the mask material 156 as a mask, the slots 158 may be self-aligned proximal to the first upper pillar structures 135. With collective reference to FIG. 1I and FIG. 1J, the slots 158 may be formed through tiers 148 of alternating levels of the insulative structures 104 and the additional conductive structures 150 of the other stack structure 105. The slots 158 may extend at least partially into the tiers 148 of the other stack structure 105, and terminating in one of the additional conductive structures 150. In some embodiments, the slots 158 terminate within a lowermost one of the tiers 148 of the other stack structure 105, shown in FIG. 1I. The slots 158 may, however, terminate within another of the additional conductive structures 150 of the other stack structure 105 depending on the number of additional conductive structures 150 to be segmented into sub-block structures. FIG. 1J is a partial top-down view of the microelectronic device structure 100. With collective reference to FIGS. 1I and 1J, a portion of each of the slots 158 may extend vertically over (e.g., in the Z-direction) a portion of each of the pillars 110 underlying the first upper pillar structures 135. The slots 158 may also extend vertically over (e.g., in the Z-direction) at least a portion of each of the pillars 110 underlying the second upper pillar structures 137 neighboring the slots 158. The slots 158 may be sized and shaped to facilitate electrical isolation of the additional conductive structures 150 in the other stack structure 105 and may be physically spaced from the upper pillar structures 135, 137. As will be described below with reference to FIG. 1M, the slots 158, which are defined by exposed sidewalls of the uppermost insulative structure 129, the hard mask material 154, and the tiers of oxide material 144, exhibit a so-called "weave" pattern wherein the slots 158 are not defined by a substantially straight line (e.g., extending in the Y-direction). As discussed below, a dielectric material (e.g., an oxide material) is subsequently formed in the slots 158 to produce slot structures 162.

The hard mask material 154 and the mask material 156 may be removed, enlarging the opening 140. With reference to FIG. 1K, a liner 160 may be (optionally) conformally formed in the opening 140 and the slots 158. After forming the liner 160 (if present), the opening 140 and the slots 158 may be substantially filled with the dielectric material, which is formed over the liner 160. The dielectric material may be formed of and include a silicon oxide. In some embodiments, the dielectric material may be formed in the opening 140 and the slots 158 without first forming the liner 160. The dielectric material may form a weave pattern in the slots 158, producing the slot structures 162.

With reference to FIG. 1L, conductive contacts 164 may be formed over and in electrical communication with the plug material 138. The conductive contacts 164 and the plug material 138 may be in electrical communication with the channel material 130. The conductive contacts 164 may comprise an electrically conductive material, such as one or more of the materials described above with reference to the conductive structures 146. In some embodiments, the conductive contacts 164 comprise substantially the same material composition as the conductive structures 146. In some embodiments, the conductive contacts 164 comprise tungsten.

With reference to FIG. 1M, the slot structures 162 may segment block structure 168 into sub-block structures 170, each defined within horizontal boundaries between neighboring slot structures 162. The slot structures 162 may exhibit the weave pattern wherein the slot structures 162 are not defined by a substantially straight line (e.g., extending in the Y-direction). Rather, the slot structures 162 may be configured to extend between neighboring columns of the pillars 110 and the first upper pillar structures 135 and may exhibit a shape to at least partially conform to the layout (e.g., the shape) of the memory cells 133 and the first upper pillar structures 135. For example, the slot structures 162 may include crest regions 165 (e.g., convex region) extending in a direction away from a horizontally neighboring (e.g., in the X-direction) pillar 110 and upper pillar structures 137 and may include corresponding valley regions 167 (e.g., concave region) horizontally neighboring (e.g., in the X-direction) the crest regions 165.

The weave pattern of the slot structures 162 may be located between first upper pillar structures 135 that are concentric (e.g., centrally located) with corresponding memory cells 133, the memory cells 133 directly underneath the first upper pillar structures 135. By utilizing the location of the first upper pillars structures 135 when forming the slots 158, the slot structures 162 may be formed proximate the first upper pillar structures 135 centered over the memory cells 133, eliminating overlay error between the first upper pillar structures 135 and the slot structures 162. The slot structures 162 may, therefore, be referred to as "self-aligned." FIG. 1N is a simplified partial cross-sectional view of the microelectronic device structure 100 of FIG. 1M taken through section line C-C. FIG. 1N shows a distance $D_3$ between the first upper pillar structure 135 and the slot structures 162, and a distance $D_4$ between the second upper pillar structure 137 and the slot structures 162. In some embodiments, the distance $D_3$ is equal to the distance $D_4$.

Figure 2A:
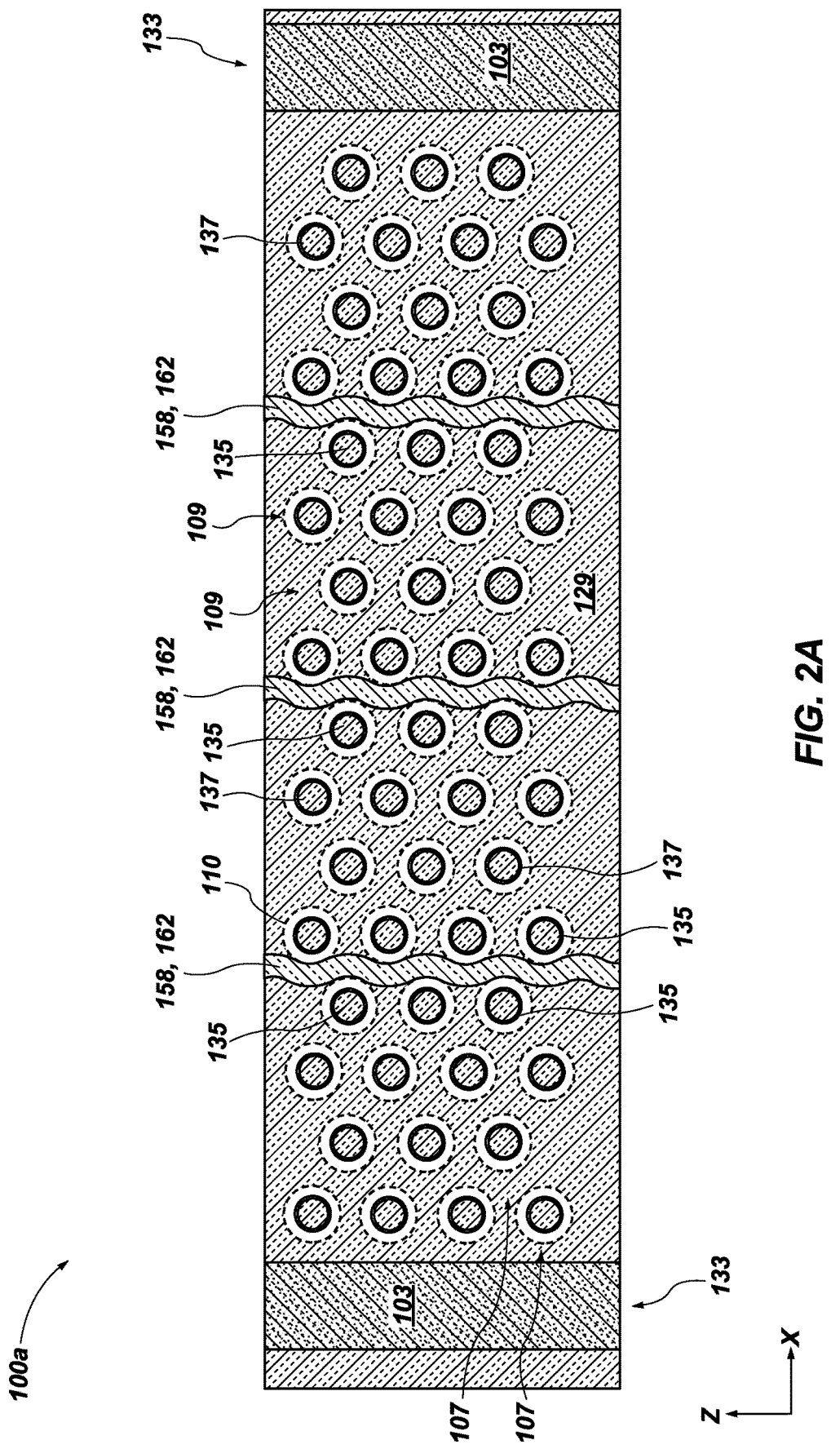
FIGS. 2A through 2C are top-down views of a microelectronic device structure, in accordance with embodiments of the disclosure.
Figure 2B:
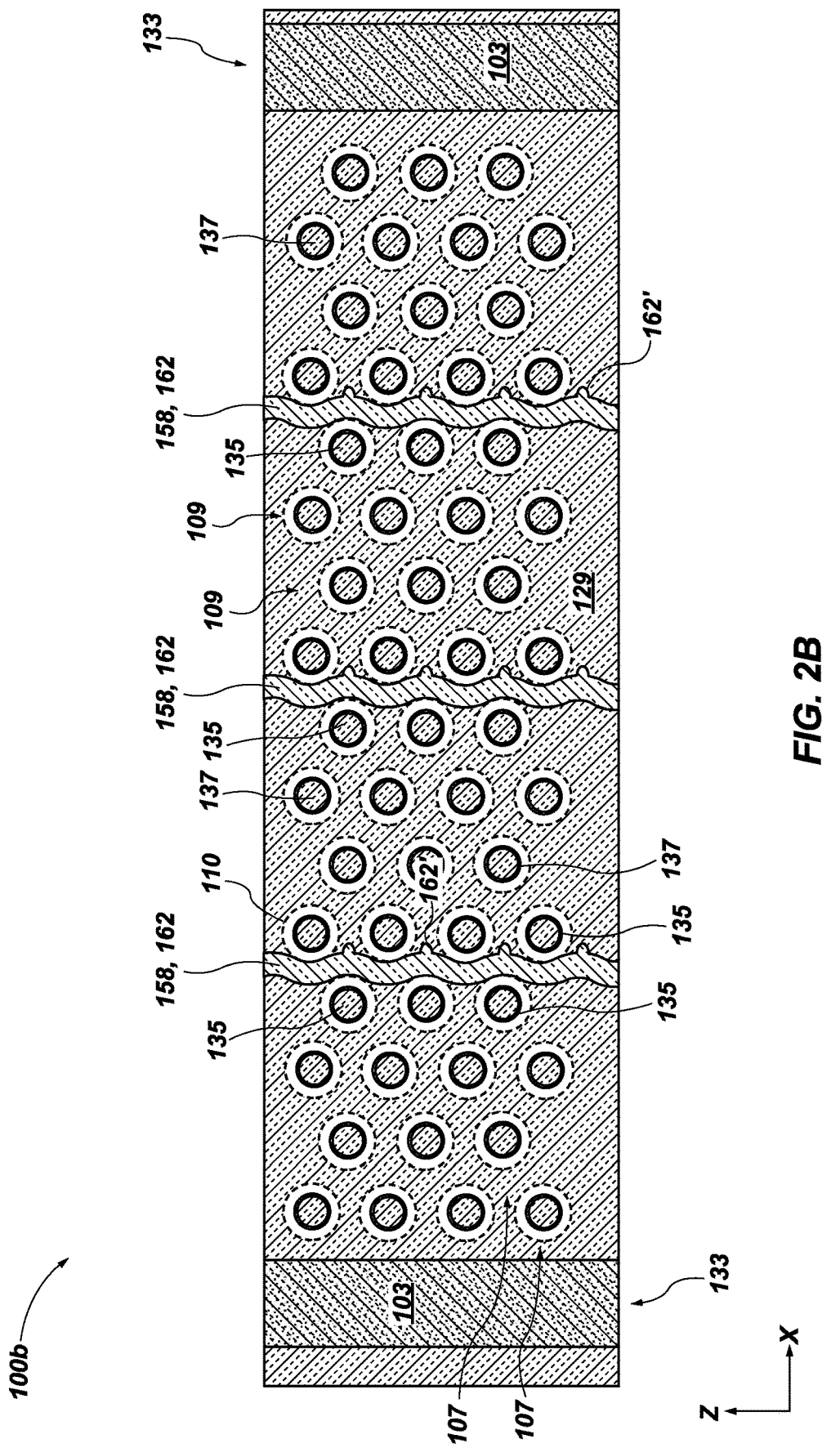
Figure 2C:
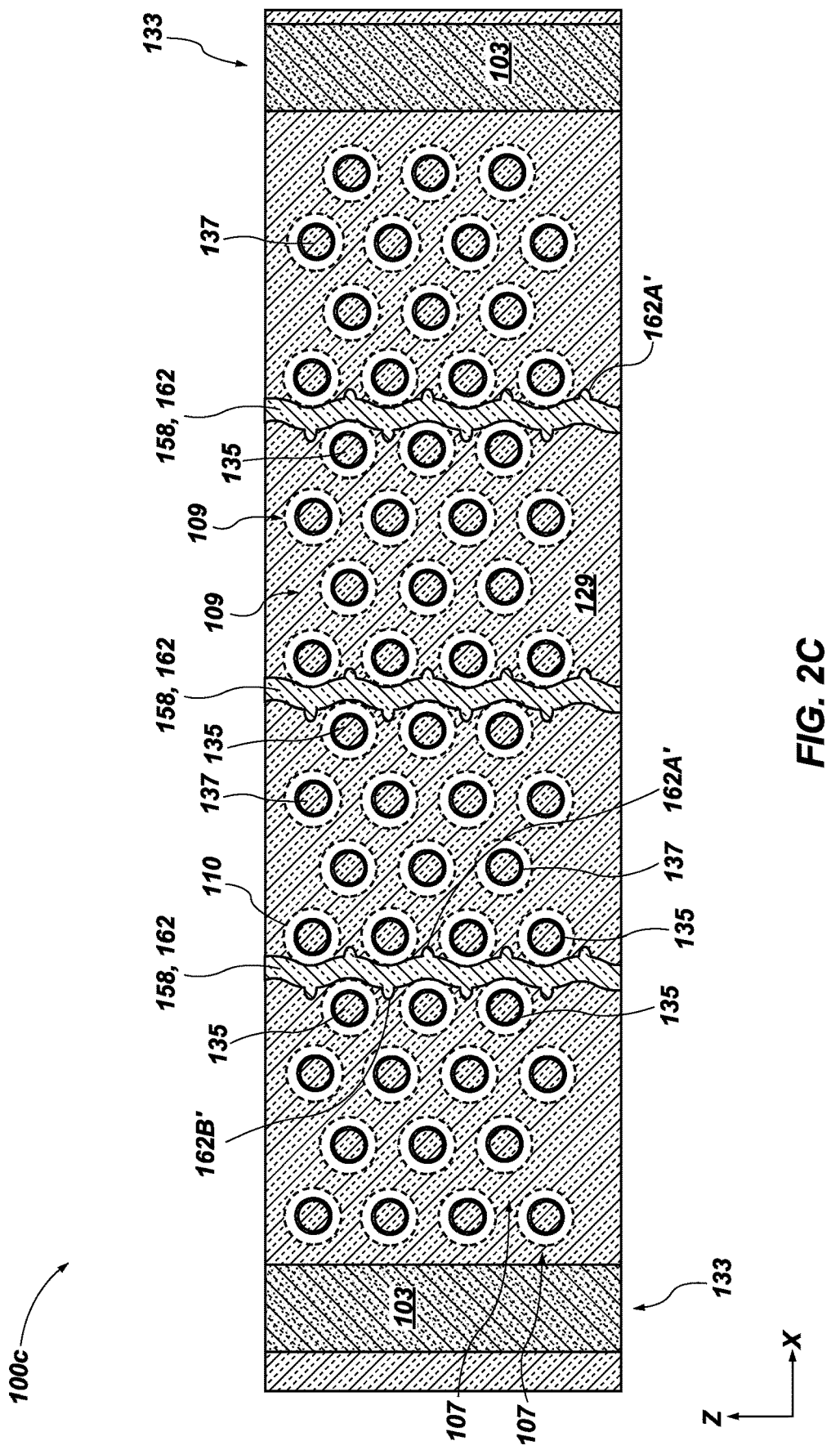

As described above, the slot structures 162 formed proximal to the first upper pillar structures 135, and the first upper pillar structures 135 centered on the pillars 110 may facilitate reducing (e.g., eliminating) overlay error between the slot structures 162 and the first upper pillar structures 135 of the microelectronic device structure 100 compared to conventional microelectronic device structures. Further, since the first upper pillar structures 135 are centered over the pillars 110, overlay margin between the outer diameter of the first upper pillar structures 135 and the outer diameter of the pillars 110 may be improved. While FIG. 1M shows the weave pattern of the slot structures 162 as including substantially arcuate surfaces, the slot structures 162 may include protrusions (e.g., lateral protrusions) depending on the distance between adjacent first upper pillar structures 135 and the distance between adjacent second upper pillar structures 137 and the method for forming the slot structures 162. FIGS. 2A-2C are partial top-down views of microelectronic device structures 100a, 100b, and 100c. Each of FIGS. 2A-2C show a resulting weave pattern of the slot structures 162 in the slots 158. The slot structures 162 may include substantially arcuate surfaces (FIG. 2A), or may include the protrusions (FIGS. 2B and 2C).

With reference to FIG. 2A, the microelectronic device structure 100a includes the weave pattern of the slot structures 162 in the slots 158 that exhibits an equal amplitude in the positive X-direction and the negative X-direction from a center line that is equal distance between the first upper pillar structures 135 and the second upper pillar structures 137. The weave pattern of the slot structures 162 includes substantially arcuate surfaces, with no additional material extending between adjacent first upper pillar structures 135 and adjacent second upper pillar structures 137.

With reference to FIG. 2B, the microelectronic device structure 100b includes the weave pattern of the slot structures 162 in the slots 158 that exhibits an equal amplitude in the positive X-direction and the negative X-direction from a center line that is equal distance between the first upper pillar structures 135 and the second upper pillar structures 137. The weave pattern of the slot structures 162 also includes lateral protrusions 162' of the material of the slot structures 162 that extend from the peak of the weave pattern and extend between the second upper pillar structures 137 (e.g., in the positive X-direction). As the dielectric material is formed within the slots 158, portions of the dielectric material may form between laterally adjacent first upper pillar structures 135, producing the lateral protrusions 162'.

With reference to FIG. 2C, the microelectronic device structure 100c includes the weave pattern of the slot structures 162 that exhibits an equal amplitude in the positive X-direction and the negative X-direction from a center line that is equal distance between the first upper pillar structures 135 and the second upper pillar structures 137. The weave pattern of the slot structures 162 also includes lateral protrusions 162A' that extend from the peak of the weave pattern and in between the second upper pillar structures 137 (e.g., in the positive X-direction). Additionally, the weave pattern of the slot structures 162 includes lateral protrusions 162B' that extend from the peak of the weave pattern and extend between the first upper pillar structures 135 (e.g., in the negative X-direction). As the dielectric material is formed within the slots 158, portions of the dielectric material may form between laterally adjacent first upper pillar structures 135 and laterally adjacent second upper pillar structures 137, producing the lateral protrusions 162A', 162B'.

FIGS. 3A-3K, 4A-4G, and 5A-5F show embodiments of microelectronic devices including the self-aligned slot structures 162 that are similar to the microelectronic device structure 100. In addition, the methods shown in FIGS. 3A-3K, 4A-4G, and 5A-5F are similar to the methods for forming the microelectronic device structure 100. A shape (e.g., profile) of a mask material overlying the channel material 130 and the insulative material 134 may be adjusted to change the location and profile of the slot structures 162. For example, the mask material may exhibit a so-called "collar," "mushroom," or "umbrella" shape in cross section, which determines the location and profile of the slot structures 162.

Figure 3A:
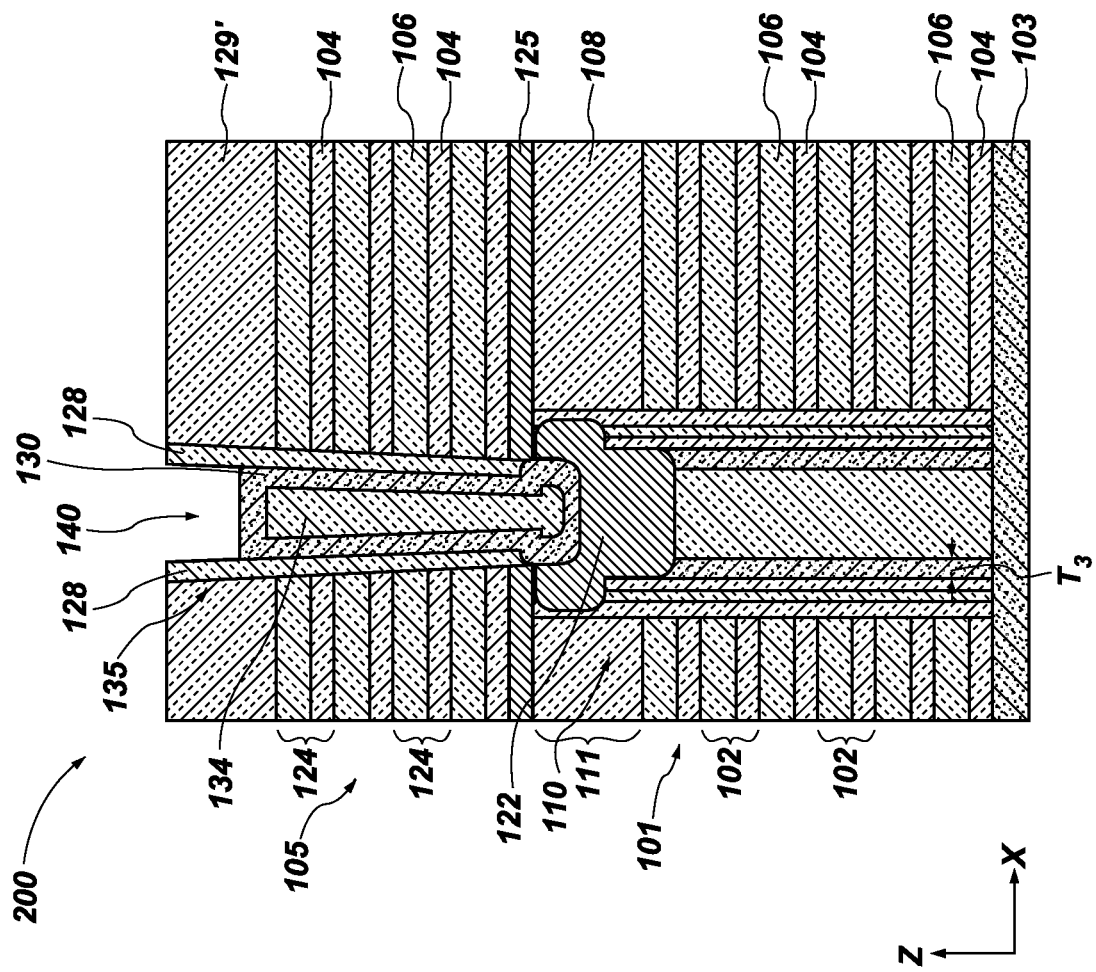

FIG. 3A shows a first upper pillar structure 135 of microelectronic device structure 200 taken through section line B-B of FIG. 1B. The microelectronic device structure 200 shown in FIG. 3A is similar to microelectronic device structure 100 of FIG. 1C, with the difference being the other stack structure 105 may include an uppermost insulative structure 129'. The uppermost insulative structure 129' may have a thickness in the vertical direction (e.g., in the Z-direction) the same as or greater than the uppermost insulative structure 129 of the embodiment shown with reference to FIG. 1C of the other stack structure 105. The method of forming the microelectronic device structure 200 may otherwise be similar to the method of forming the microelectronic device structure 100 described above. Only method acts that differ substantially from the method of forming the microelectronic device structure 100 are described. After forming the plug material 138, a portion of the channel material 130, and a portion of the plug material 138 of the first upper pillar structure 135 may be removed (e.g., etched) from within the first upper pillar structure 135 to form a recess. In some embodiments, the recess is formed by an etch process including, but not limited to, a wet etch process or a vapor etch process. The first liner material 128 may not be substantially removed by the etching process, and may remain within the first upper pillar structure 135.

Figure 3B:
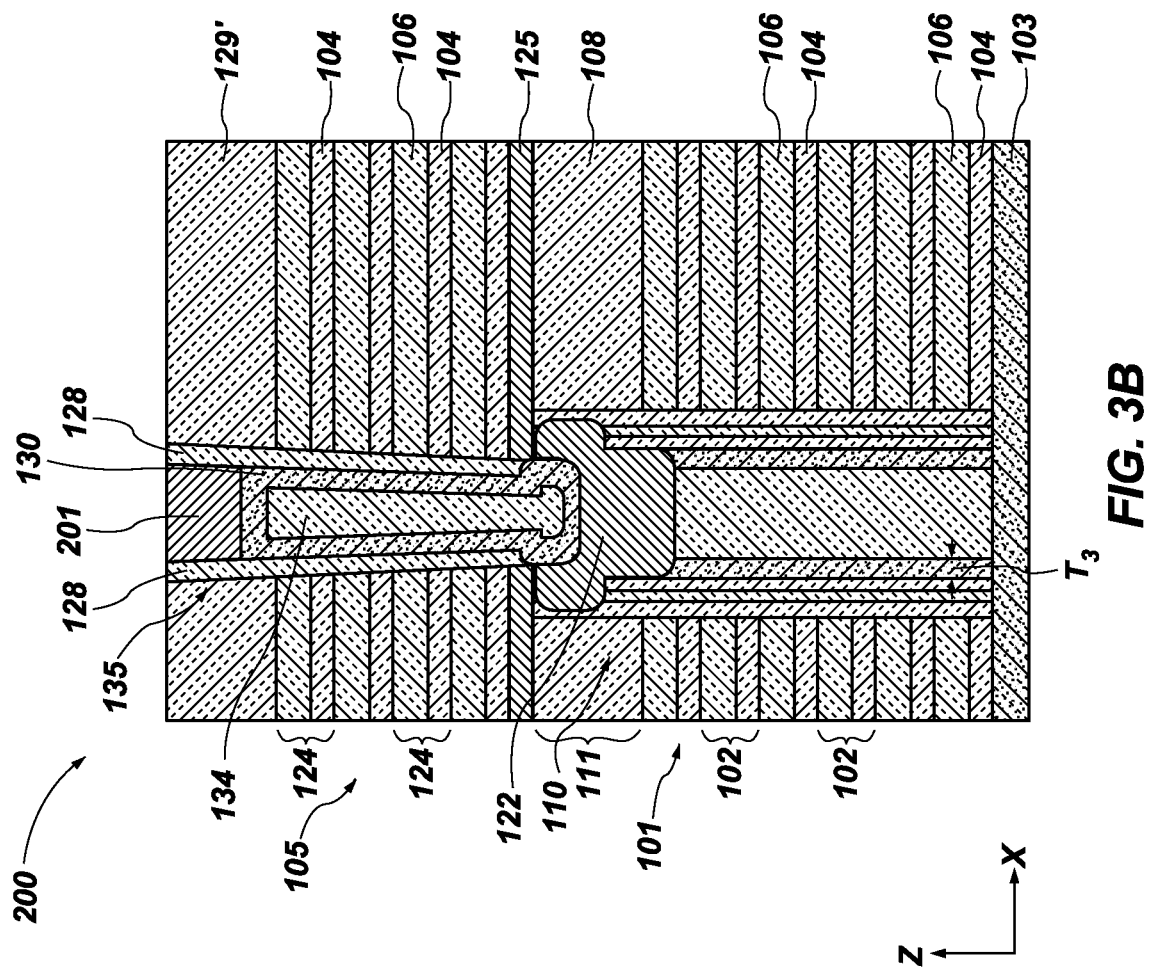

With reference to FIG. 3B, a hard mask material 201 may be formed in the recess overlying the plug material 138 and adjacent to (e.g., within) the first liner material 128. The hard mask material 201 may be formed of and include at least one of, carbon nitride ($C_xN_y$), aluminum oxide ($AlO_x$), and magnesium oxide ($MgO_x$). In some embodiments, the microelectronic device structure 200 is exposed to a planarization process, such as a CMP process, after forming the hard mask material 201.

Figure 3C:
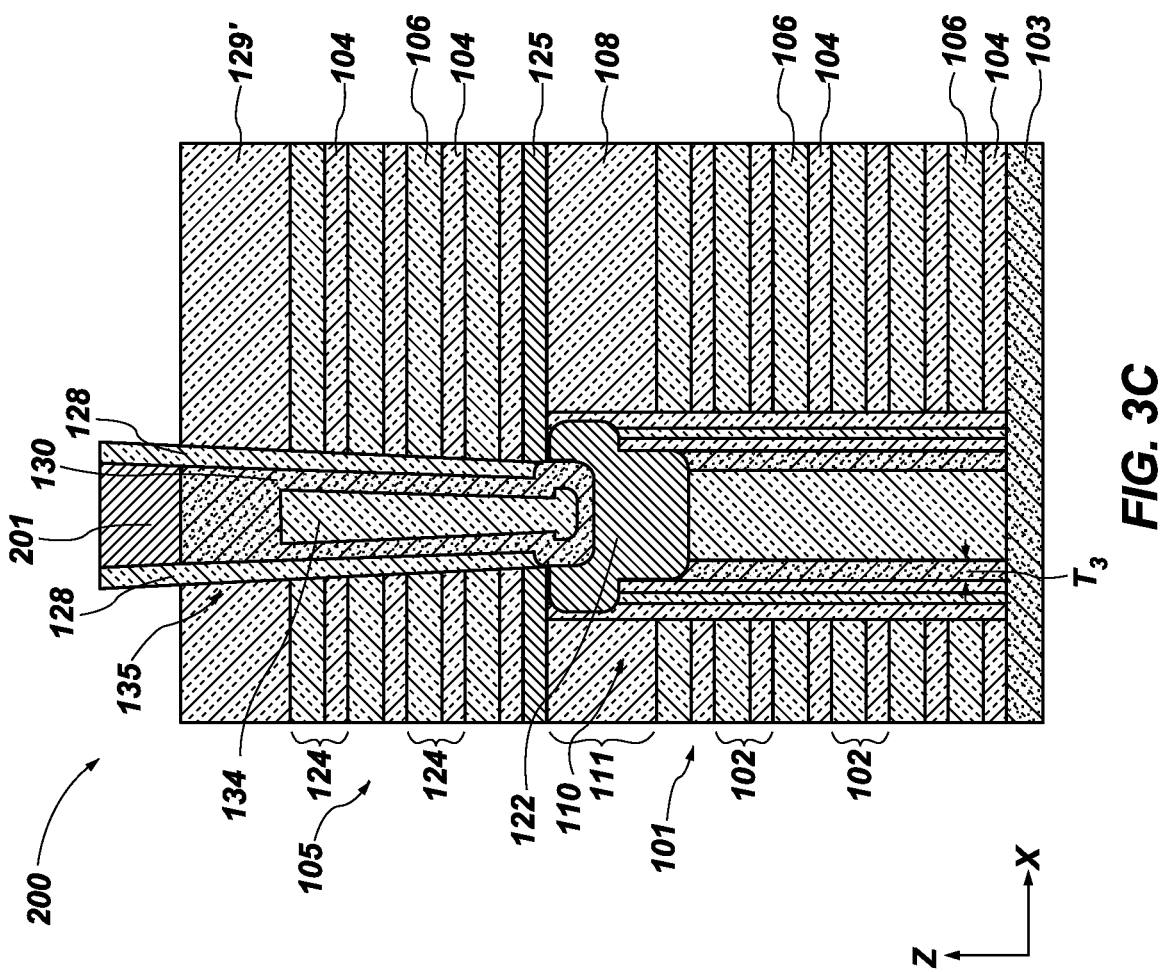

With reference to FIG. 3C, a portion of the uppermost insulative structure 129' may be removed. In some embodiments, the portion of the uppermost insulative structure 129' is removed by an etch process including, but not limited to, a wet etch process or a vapor etch process. The first liner material 128 and the hard mask material 201 may not be substantially removed by the etching process.

Figure 3D:
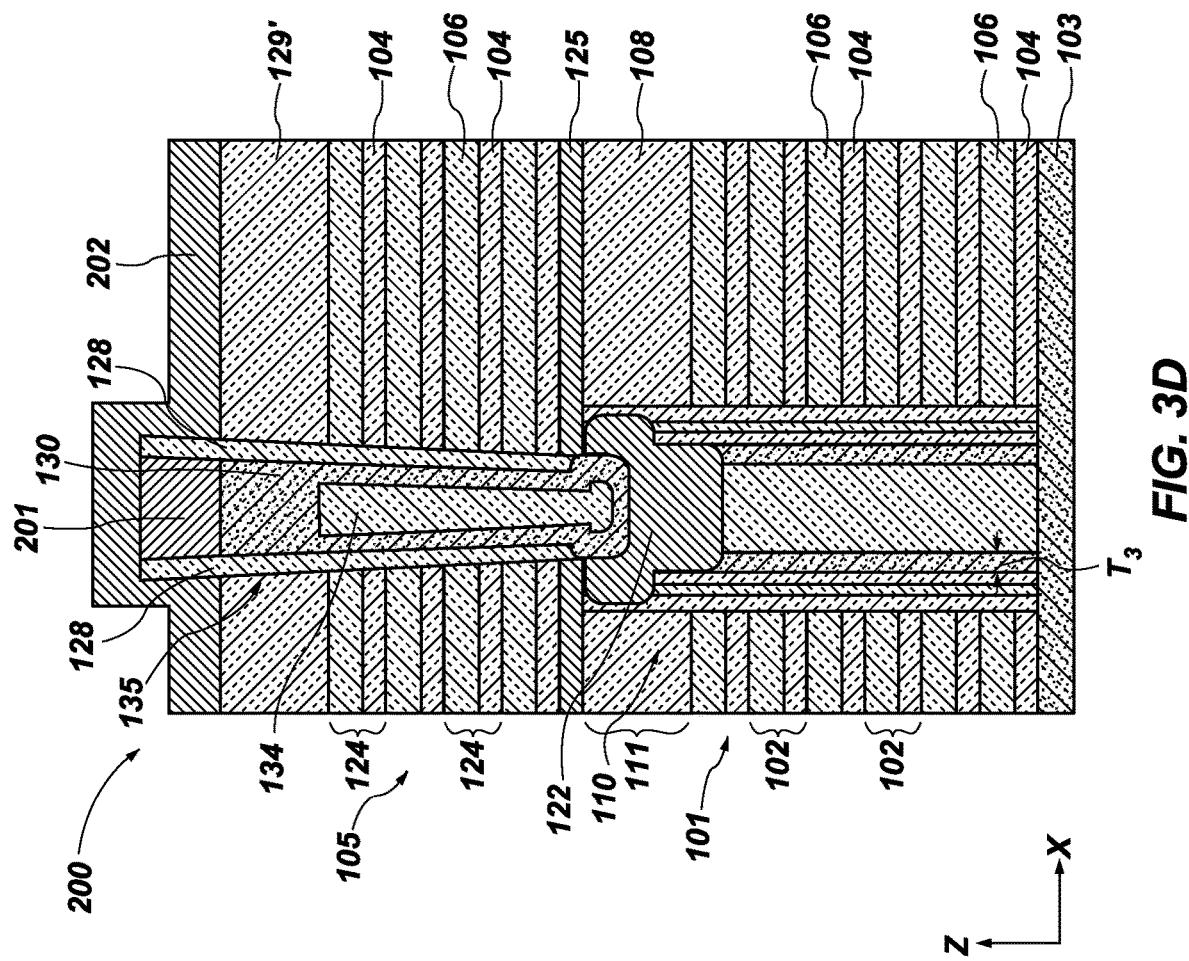

With reference to FIG. 3D, another hard mask material 202 may be conformally formed over the top surface of the uppermost insulative structure 129' and over the exposed portions of the first liner material 128 and the already present hard mask material 201, forming a so-called "collar." The another hard mask material 202 may substantially cover the first upper pillar structure 135 including the exposed portions of the first liner material 128. The another hard mask material 202 may exhibit squared corners over the portion of the first liner material 128 formed over the first upper pillar structure 135.

Figure 3E:
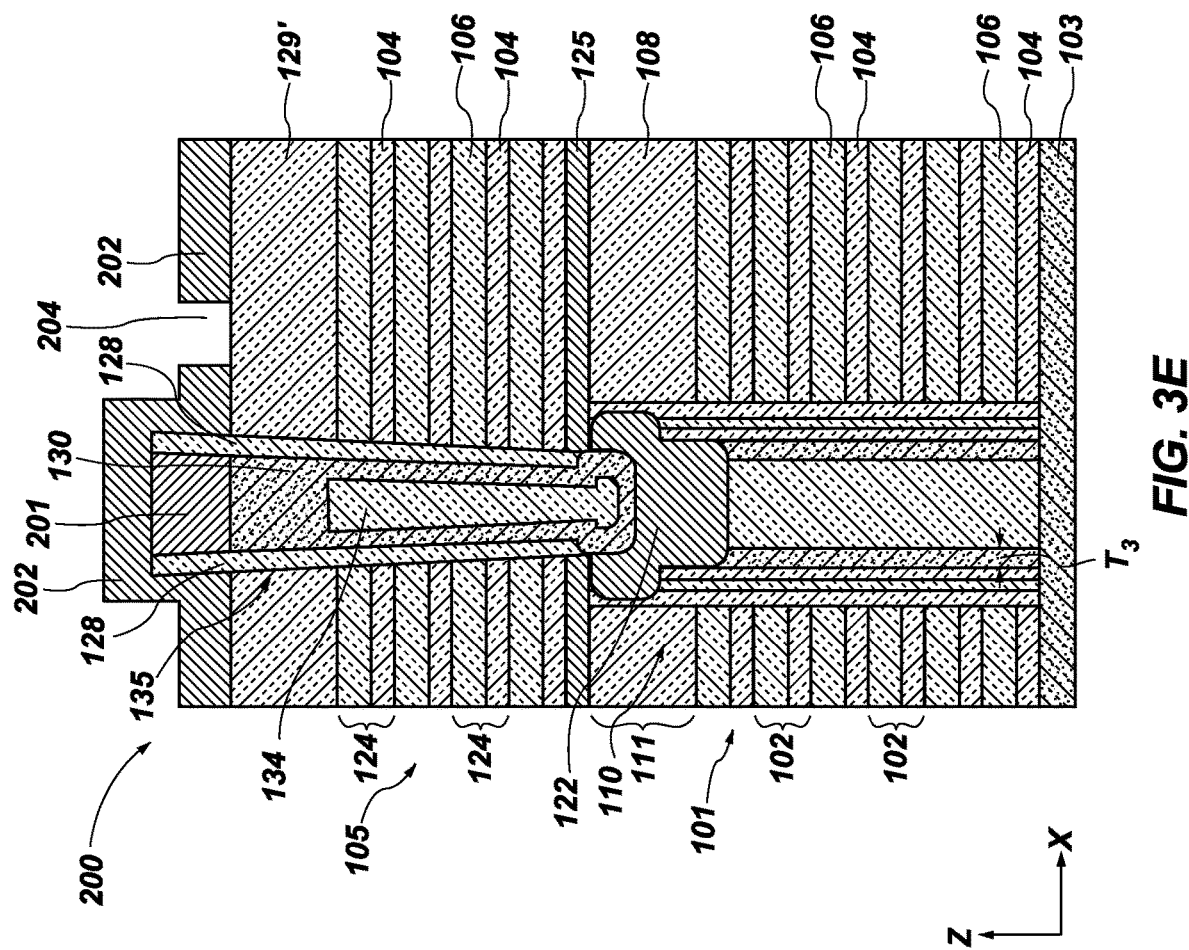

With reference to FIG. 3E, the another hard mask material 202 may be masked and etched (e.g., patterned) to form an opening 204 in the another hard mask material 202. The uppermost insulative structure 129' underlying the opening 204 formed in the another hard mask material 202 may be exposed.

With collective reference to FIGS. 3F and 3G, an oxide material 206 may be formed over the another hard mask material 202 and within the opening 204 in the another hard mask material 202. The oxide material 206 may substantially fill the entire area of the opening 204. As described above with reference to FIGS. 1E and 1F, microelectronic device structure 200 is subjected to a "replacement gate" or "gate last" process to remove and replace the other insulative structures 106 of the stack structure 101 with conductive structures 146, and the additional other insulative structures 106 of the other stack structure 105 with additional conductive structures 150. With reference to FIG. 3G, the microelectronic device structure 200 includes conductive structures 146 of tiers 148. The additional other insulative structures 106 may simultaneously be removed and replaced with additional conductive structures 150 to form tiers 148. The oxide material 206 may be subsequently removed from over the another hard mask material 202 and removed from within the opening 204 in the another hard mask material 202.

With reference to FIG. 3H, the oxide material 206 may be removed from over the another hard mask material 202 and removed from within the opening 204 in the another hard mask material 202. Slots 158 may be formed through at least a portion of the other stack structure 105 to form one or more sub-block structures in each block structure. The slots 158 may be formed through tiers 148 of alternating levels of the insulative structures 104 and the additional conductive structures 150 of the other stack structure 105, segmenting the block structure into one or more sub-block structures. The slots 158 are formed by removing portions of the tiers 148 of the insulative structures 104 and the additional conductive structures 150. In some embodiments, the slots 158 terminate within a lowermost one of the tiers 148 of the other stack structure 105. In other embodiments, the slots 158 terminate within at least one of the additional conductive structures 150 of at least one of the tiers 148 of the other stack structure 105. The slots 158 may be sized and shaped to facilitate electrical isolation of the additional conductive structures 150 and may be physically spaced from the upper pillar structures 135, 137.

With reference to FIG. 3I, the dielectric material of the slot structures 162 may be formed over the another hard mask material 202 and substantially fill the slots 158. While not illustrated in FIG. 3I, a liner 160 may (optionally) be formed in the opening 204 and the slots 158 before forming the dielectric material in the slots 158. The slot structures 162 may the weave pattern wherein the slot structures 162 are not defined by a substantially straight line (e.g., extending in the Y-direction). The weave pattern is shown and described in detail above with reference to microelectronic device structure 100 and FIG. 1M.

Figure 3J:
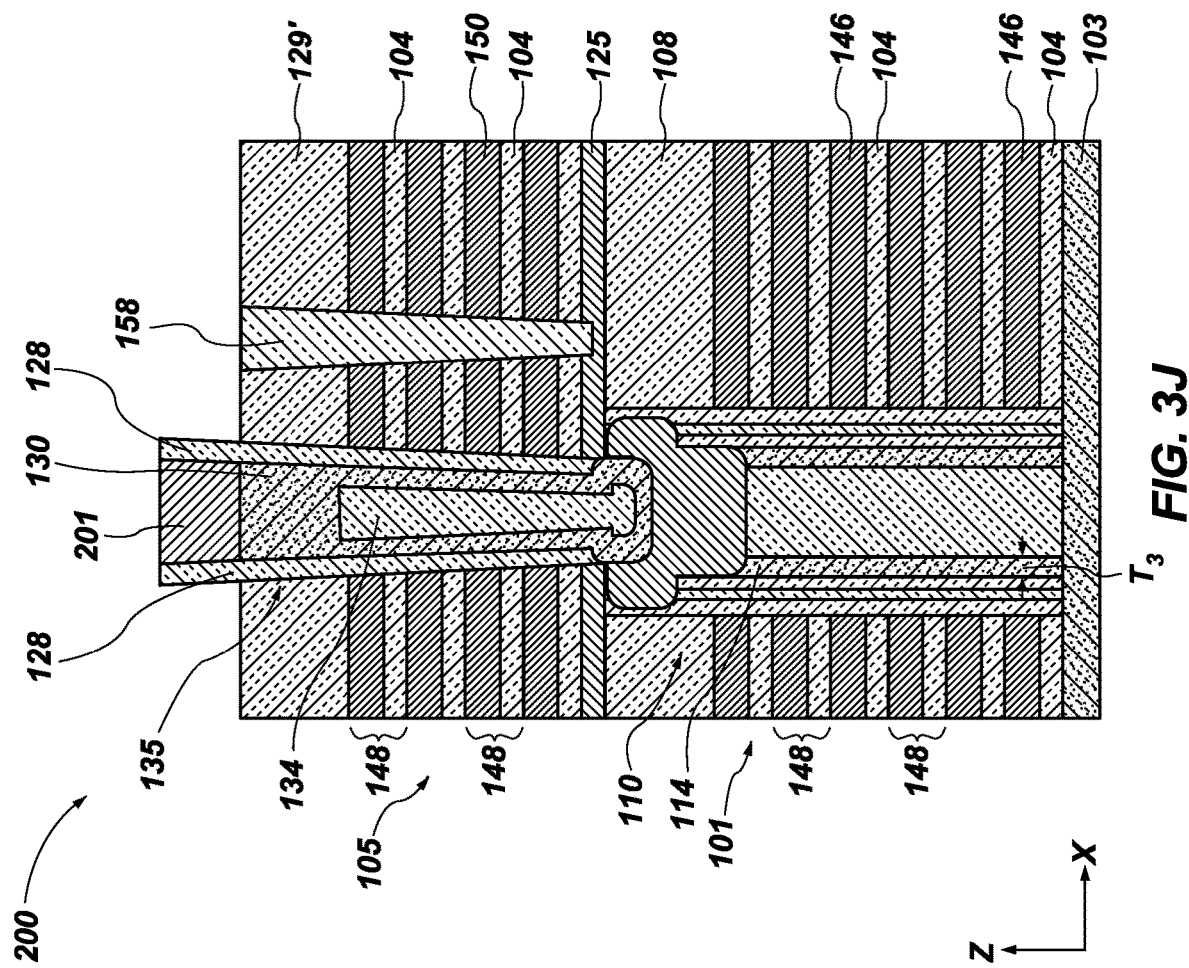

With reference to FIG. 3J, the dielectric material on the another hard mask material 202, the dielectric material within the opening 204, the another hard mask material 202, and first liner material 128 may be removed from the top surface of the uppermost insulative structure 129'. The dielectric material may remain in the slots 158. The slots 158 filled with the dielectric material (i.e., the slot structures 162) may exhibit the weave pattern wherein the slots 158 are not defined by a substantially straight line (e.g., extending in the Y-direction). The weave pattern is shown and described in detail above with reference to microelectronic device structure 100 and FIG. 1M.

Figure 3K:
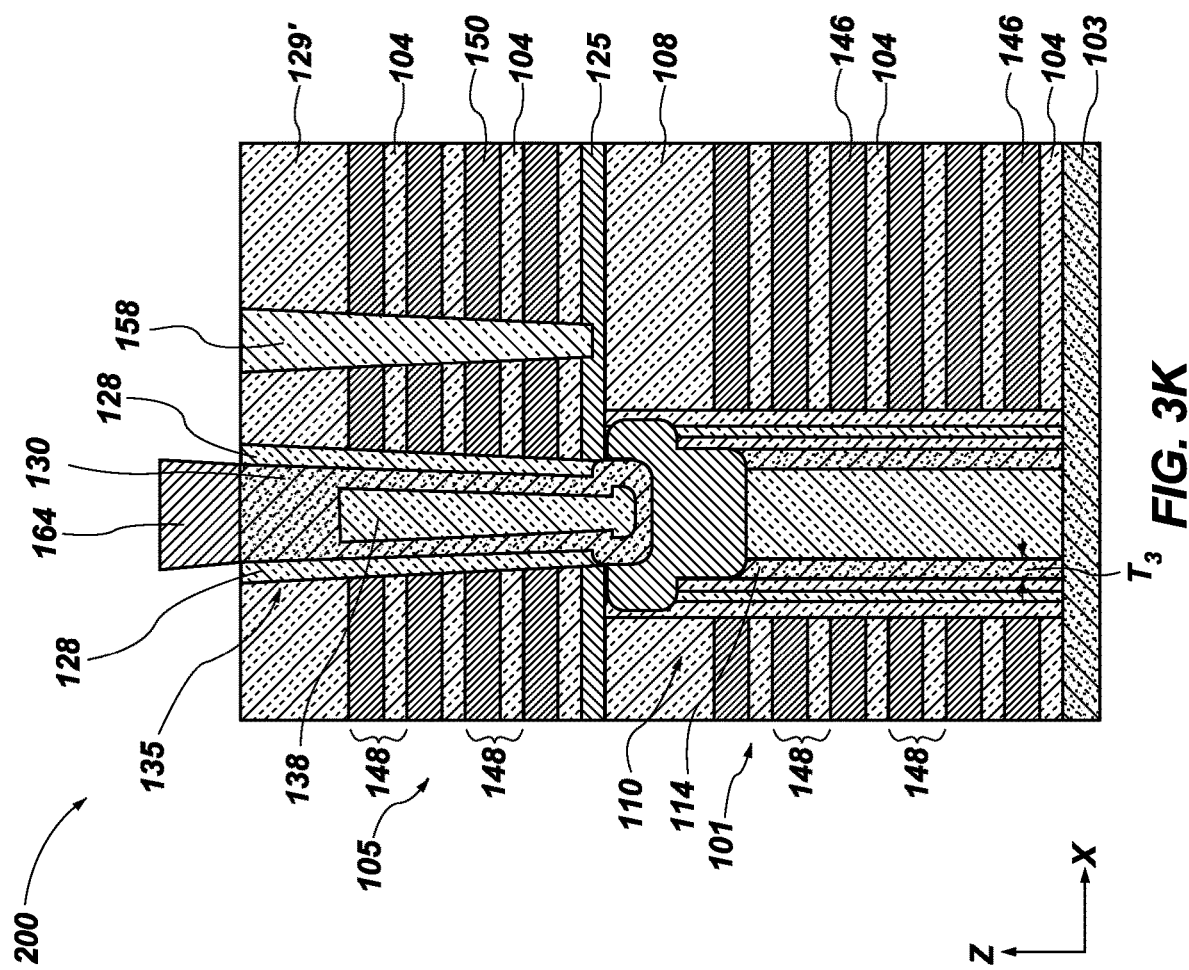

With reference to FIG. 3K, conductive contacts 164 may be formed over and in electrical communication with the plug material 138. The conductive contacts 164 and the plug material 138 may be in electrical communication with the channel material 130. The conductive contacts 164 may comprise an electrically conductive material, such as one or more of the materials described above with reference to the conductive structures 146. In some embodiments, the conductive contacts 164 comprise substantially the same material composition as the conductive structures 146. In some embodiments, the conductive contacts 164 comprise tungsten.

Figure 4A:
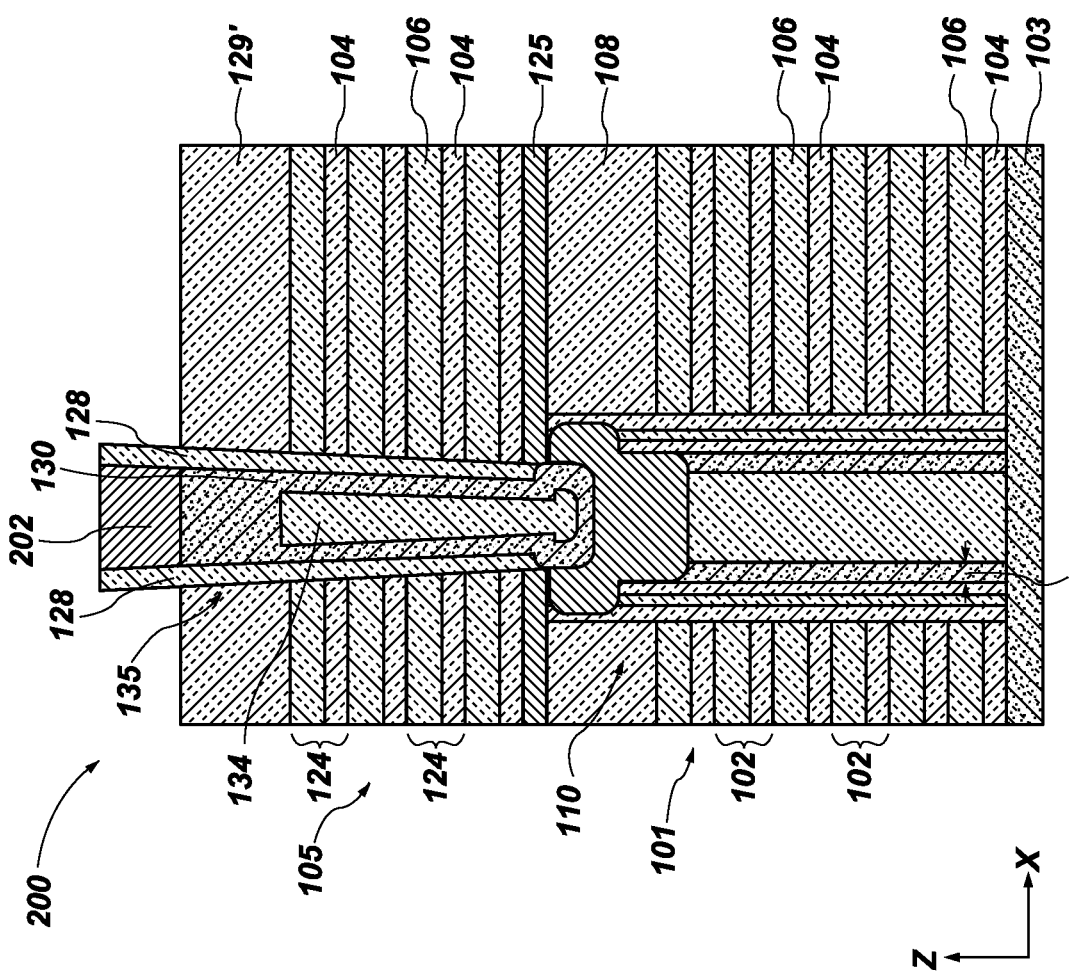

FIG. 4A shows a first upper pillar structure 135 of microelectronic device structure 300 taken through section line B-B of FIG. 1B. Microelectronic device structure 300 is similar to microelectronic device structure 200 of FIG. 3C. The method of forming the microelectronic device structure 300 may be similar to the method of forming the microelectronic device structures 100, 200. Only method acts and details that differ substantially from the method of forming the microelectronic device structures 100, 200 are described. A portion of the uppermost insulative structure 129' may be removed as shown in FIG. 4A and described with reference to FIGS. 3A-3C. In some embodiments, the uppermost insulative structure 129' is removed by an etch process including, but not limited to, a wet etch process or a vapor etch process. The first liner material 128 and the another hard mask material 202 may not be substantially removed by the etching process.

Figure 4B:
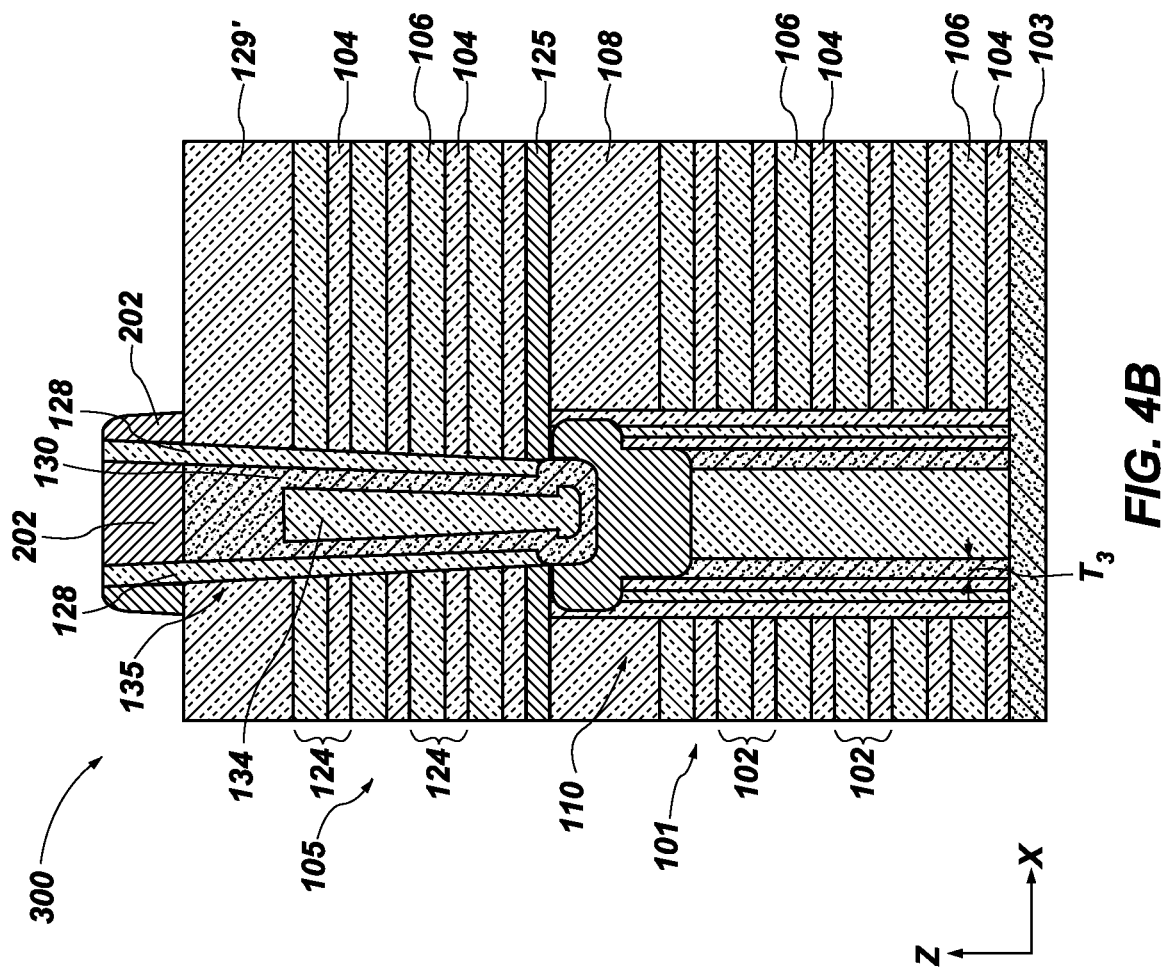

With reference to FIG. 4B, the another hard mask material 202 may be conformally formed over the top surface of the uppermost insulative structure 129', as described above for FIG. 3D. The another hard mask material 202 may be formed over exposed portions of the first liner material 128. Portions of the another hard mask material 202 may be removed from the top surface of the uppermost insulative structure 129', such that the another hard mask material 202 exhibits a mushroom-like shape defined by rounded corners shown in FIG. 4B. The another hard mask material 202 may only cover a portion of the uppermost insulative structure 129'.

Figure 4C:
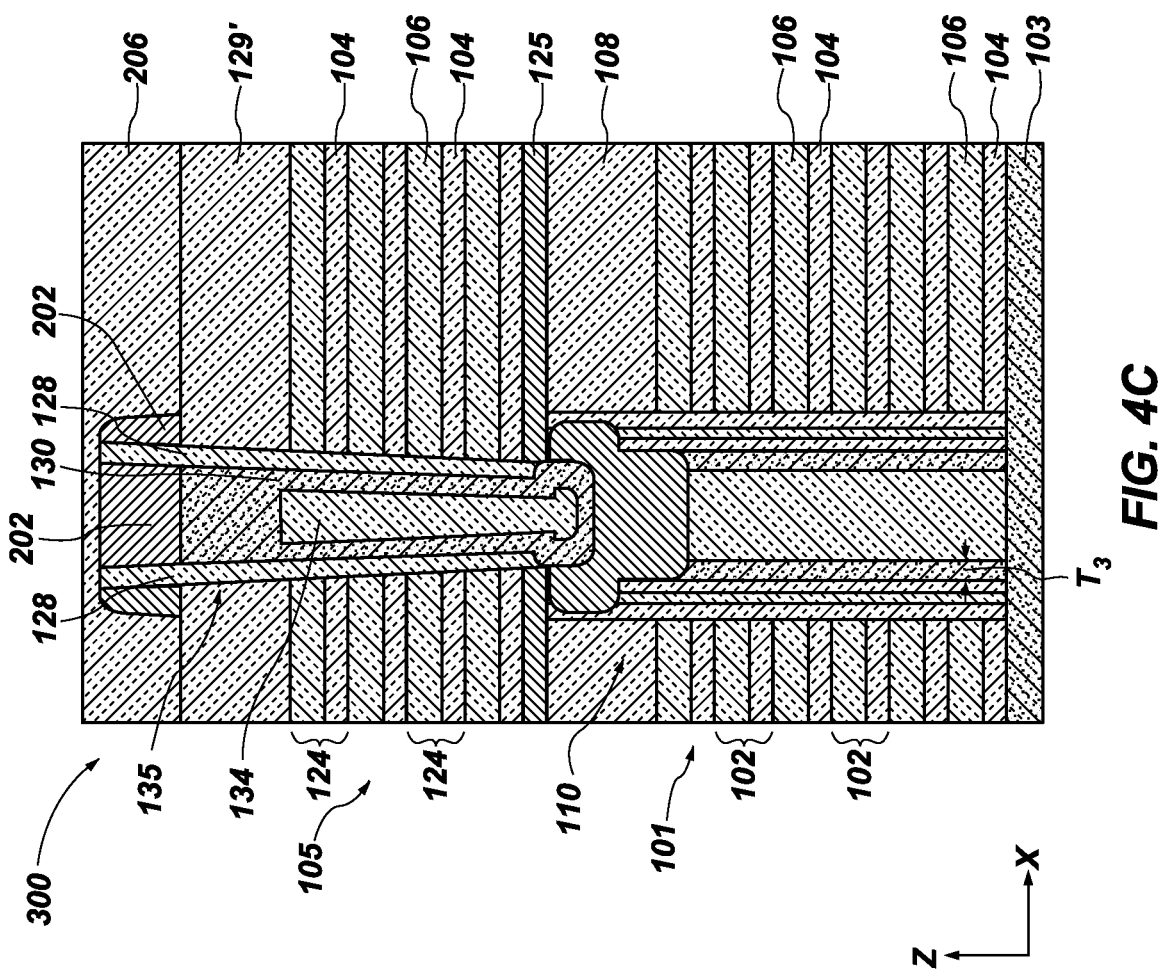
Figure 4D:
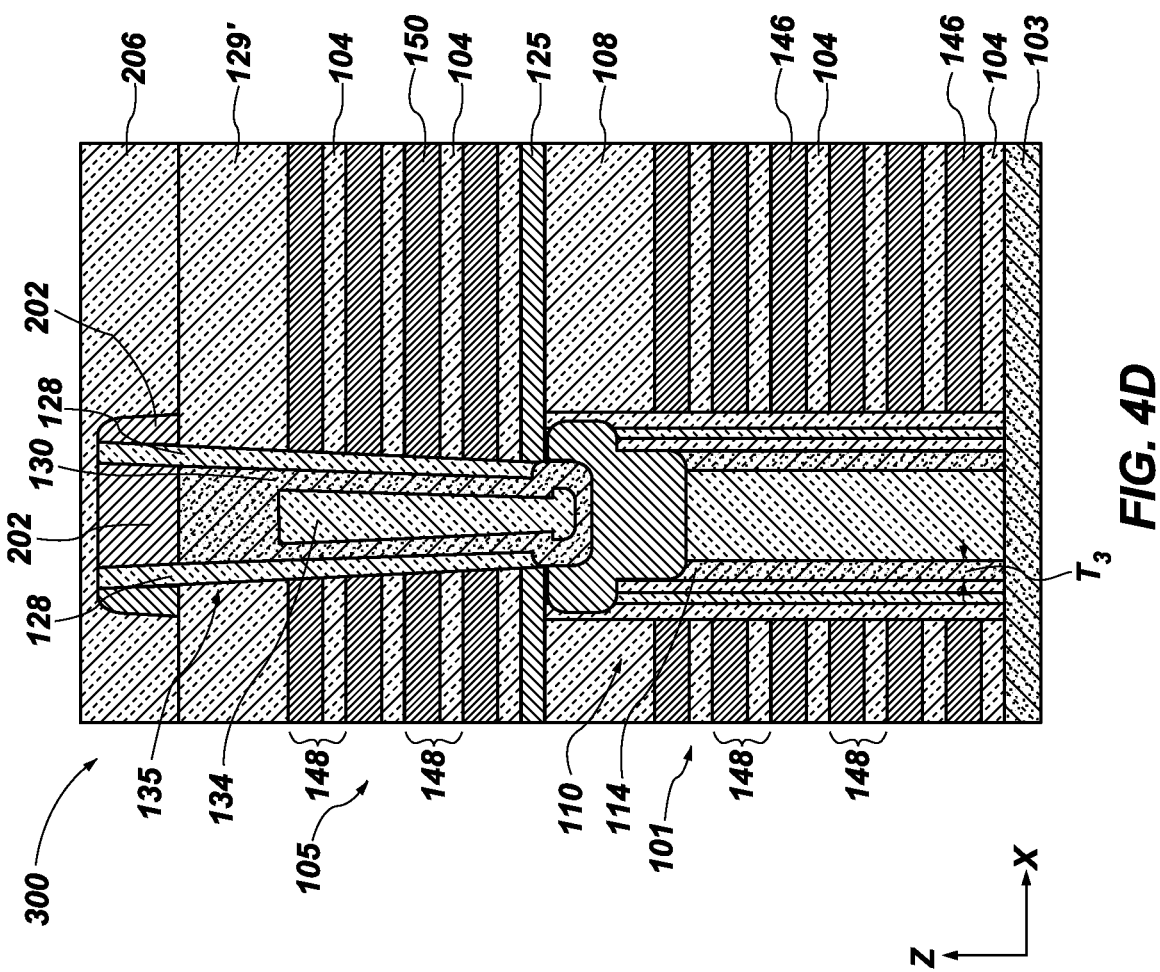

With collective reference to FIGS. 4C and 4D, an oxide material 206 may be formed over the another hard mask material 202. As described above with reference to FIGS. 1E and 1F, microelectronic device structure 300 is subjected to a "replacement gate" or "gate last" process. With reference to FIG. 4D, the microelectronic device structure 300 includes conductive structures 146 of tiers 148. The additional other insulative structures 106 may simultaneously be removed and replaced with additional conductive structures 150 to form tiers 148.

With reference to FIG. 4E, a mask material 156 may be formed adjacent (e.g., over) and patterned over the oxide material 206 and the another hard mask material 202. The mask material 156 may be formed of and include one or more of a photoresist material, a dielectric antireflective coating (DARC) material, magnesium oxide (MgOx) and tungsten-doped carbon (W-doped carbon).

With reference to FIG. 4F, slots 158 may be formed through the opening of the mask material 156, through the oxide material 206, and through the tiers 148 of alternating levels of the insulative structures 104 and the additional conductive structures 150 of the other stack structure 105. In some embodiments, the slots 158 are formed by removing portions of the tiers 148 of the insulative structures 104 and the additional conductive structures 150. In some embodiments, the slots 158 terminate within a lowermost one of the tiers 148 of the other stack structure 105. In other embodiments, the slots 158 terminate within at least one of the additional conductive structures 150 of at least one of the tiers 148 of the other stack structure 105. The slots 158 may be located adjacent to (e.g., neighboring) the first upper pillar structures 135. The position of the slots 158 may be determined by the position of the remaining another hard mask material 202.

Figure 4G:
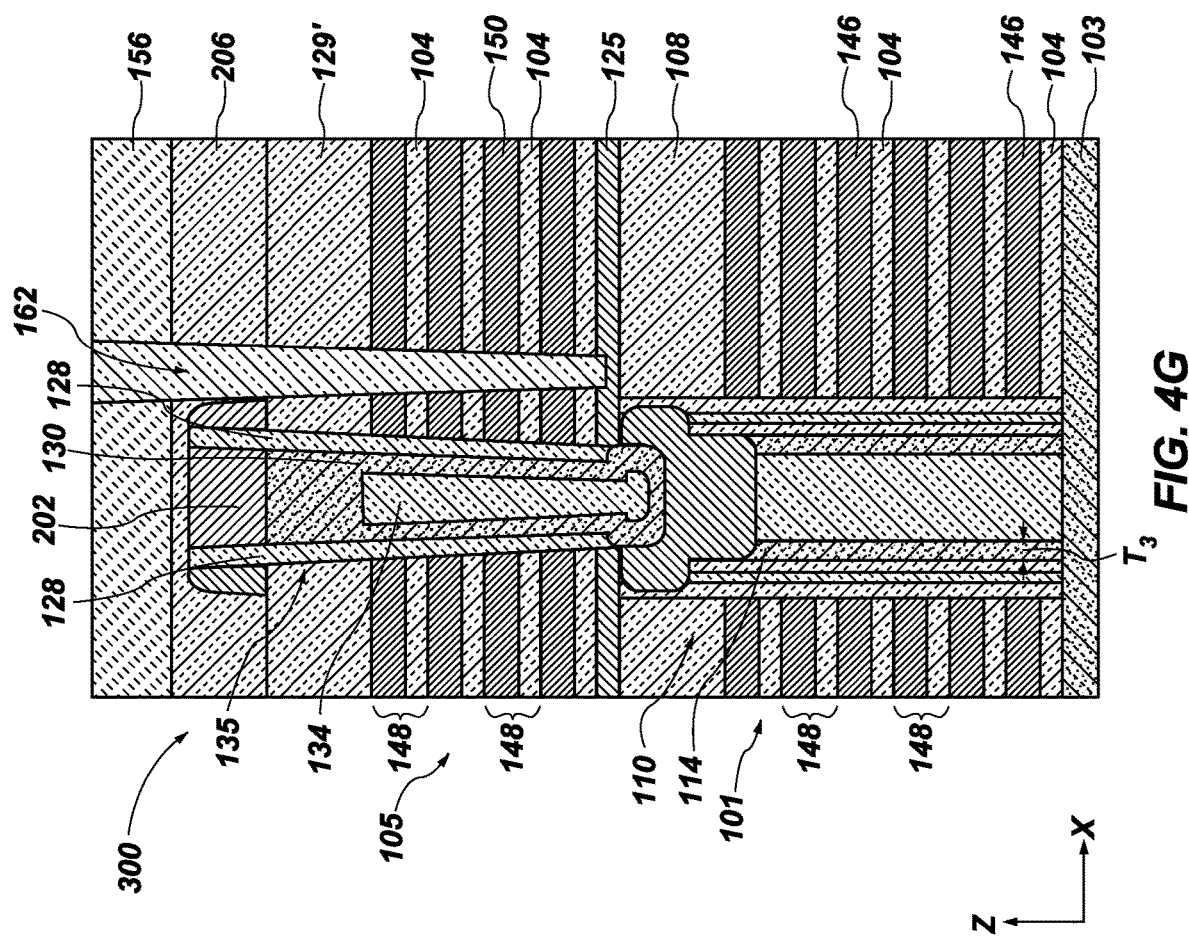

With reference to FIG. 4G, the dielectric material may be formed within the opening of the mask material 156, the opening of the oxide material 206, and may substantially fill the slots 158, producing the slot structures 162. The slot structures 162 may be adjacent to the another hard mask material 202. The dielectric material within the opening of the mask material 156, the another hard mask material 202, and first liner material 128 may be removed from the top surface of the uppermost insulative structure 129'. The dielectric material may remain in the slots 158. The slot structures 162 may exhibit the weave pattern wherein the slot structures 162 are not defined by a substantially straight line (e.g., extending in the Y-direction). The weave pattern is shown and described in detail above with reference to microelectronic device structure 100 and FIG. 1M. While not illustrated in FIG. 4G, a liner 160 may (optionally) be formed in the slots 158 before forming the slot structures 162.

Subsequently, an upper portion of the slot structures 162, the mask material 156, the oxide material 206, the another hard mask material 202, and first liner material 128 may be removed from the top surface of the uppermost insulative structure 129'. The dielectric material may remain in the slots 158, resulting in the same structure as shown in FIG. 3J. The resulting slot structures 162 may exhibit the weave pattern wherein the slot structures 162 are not defined by a substantially straight line (e.g., extending in the Y-direction). The weave pattern is shown and described in detail above with reference to microelectronic device structure 100 and FIG. 1M.

After forming the weave pattern in microelectronic device structure 300, conductive contacts 164 may be formed over and in electrical communication with the plug material 138 (see FIG. 3K), as described in detail above for the microelectronic device structures 100, 200. The conductive contacts 164 and the plug material 138 may be in electrical communication with the channel material 130. The conductive contacts 164 may comprise an electrically conductive material, such as one or more of the materials described above with reference to the conductive structures 146. In some embodiments, the conductive contacts 164 comprise substantially the same material composition as the conductive structures 146. In some embodiments, the conductive contacts 164 comprise tungsten.

Figure 5A:
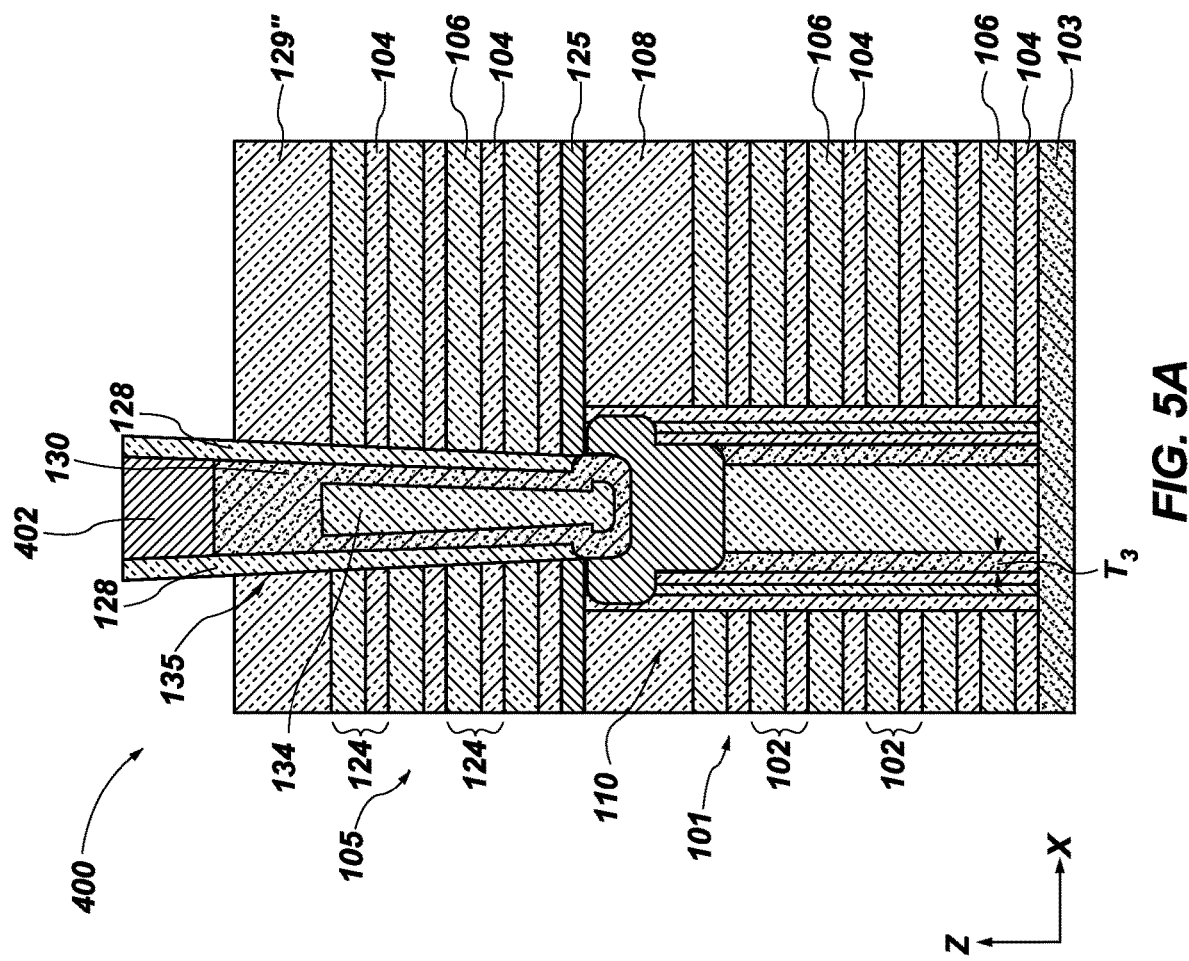
FIGS. 5A through 5F are simplified cross-sectional views showing a method of forming a microelectronic device structure, in accordance with still other embodiments of the disclosure.
Figure 5B:
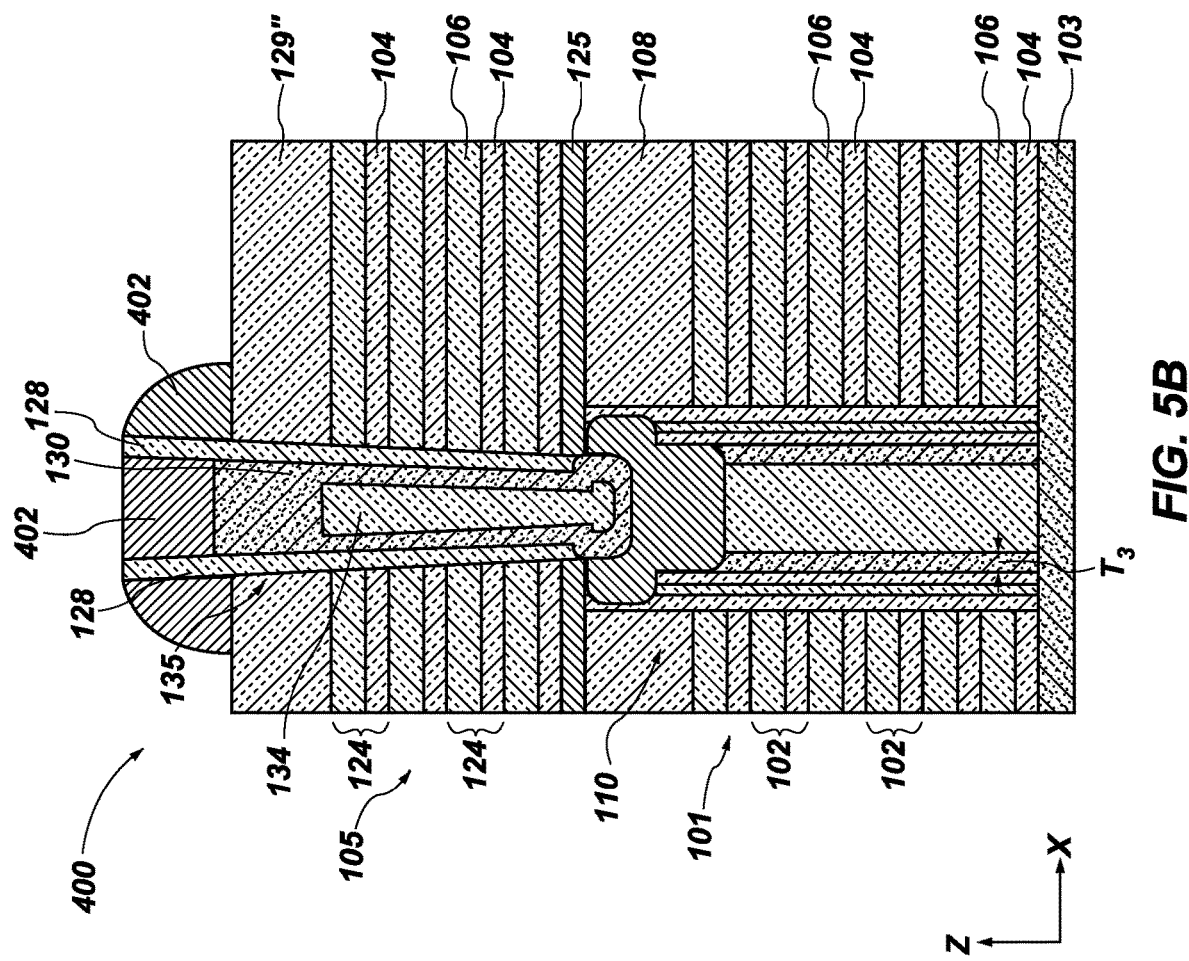

FIG. 5A shows a first upper pillar structure 135 of microelectronic device structure 400 taken through section line B-B of FIG. 1B. The microelectronic device structure 400 shown in FIG. 5A is similar to microelectronic device structure 200 of FIG. 3A, with the difference being the other stack structure 105 may include an uppermost insulative structure 129". The uppermost insulative structure 129" may have a thickness in the vertical direction (e.g., in the Z-direction) the same as or greater than the uppermost insulative structure 129 of the embodiment shown and described with reference to FIG. 1C of the other stack structure 105. The method of forming the microelectronic device structure 400 may be similar to the method of forming the microelectronic device structures 200, 300. Only method acts and details that differ substantially from the method of forming the microelectronic device structures 200, 300 are described. A portion of the uppermost insulative structure 129" may be removed as shown in FIG. 5A and described with reference to FIGS. 3A-3C. In some embodiments, the uppermost insulative structure 129" is removed by an etch process including, but not limited to, a wet etch process or a vapor etch process. The first liner material 128 and another hard mask material 402 may not be substantially removed by the etching process. An additional portion of the another hard mask material 402 may be conformally formed over the top surface of the uppermost insulative structure 129" and the initial portion of the another hard mask material 402. The another hard mask material 402 may also be formed over exposed portions of the first liner material 128. Portions of the another hard mask material 402 may be removed, forming a dome-like shape defined by rounded corners as shown in FIG. 5B. The another hard mask material 402 may only cover a portion of the uppermost insulative structure 129".

Figure 5C:
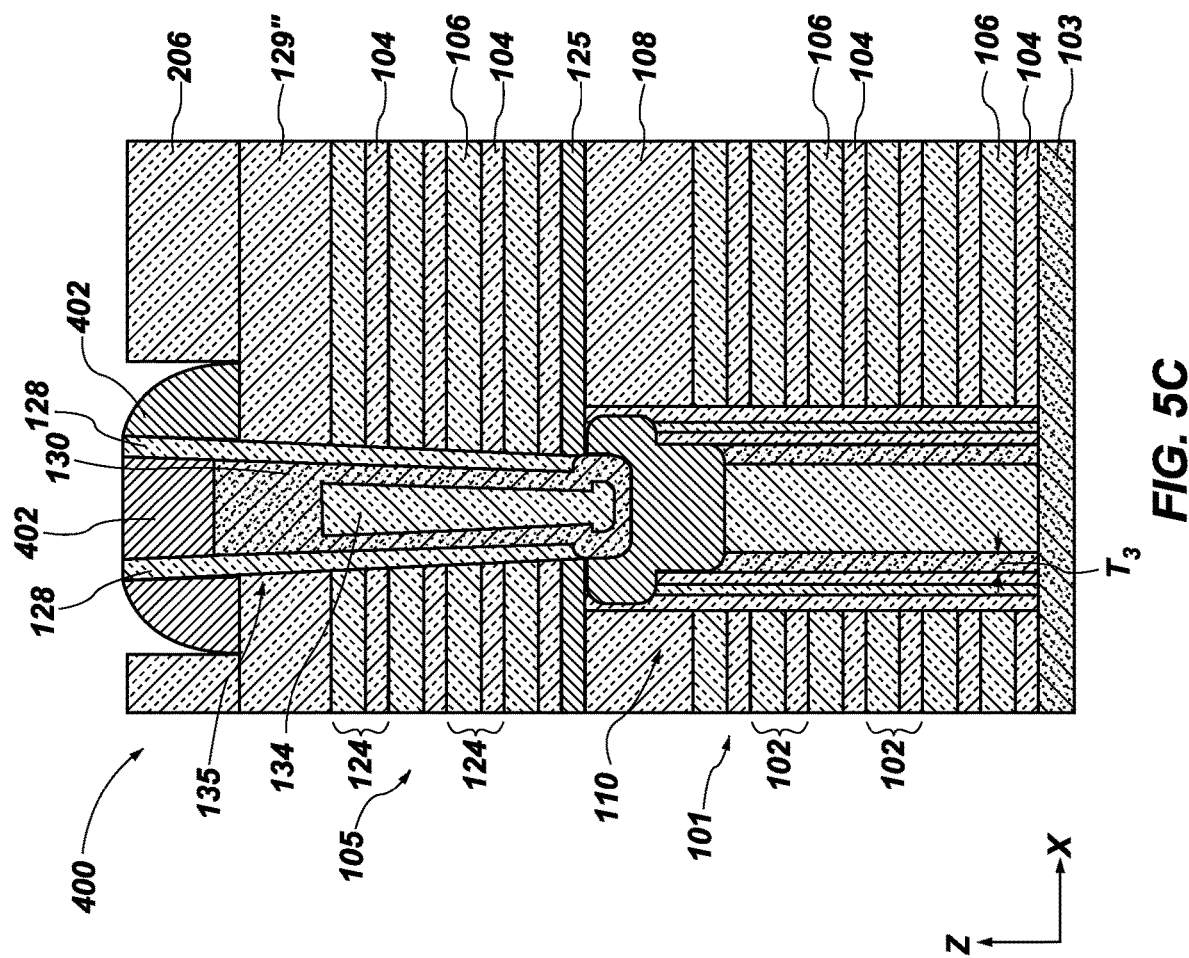
Figure 5D:
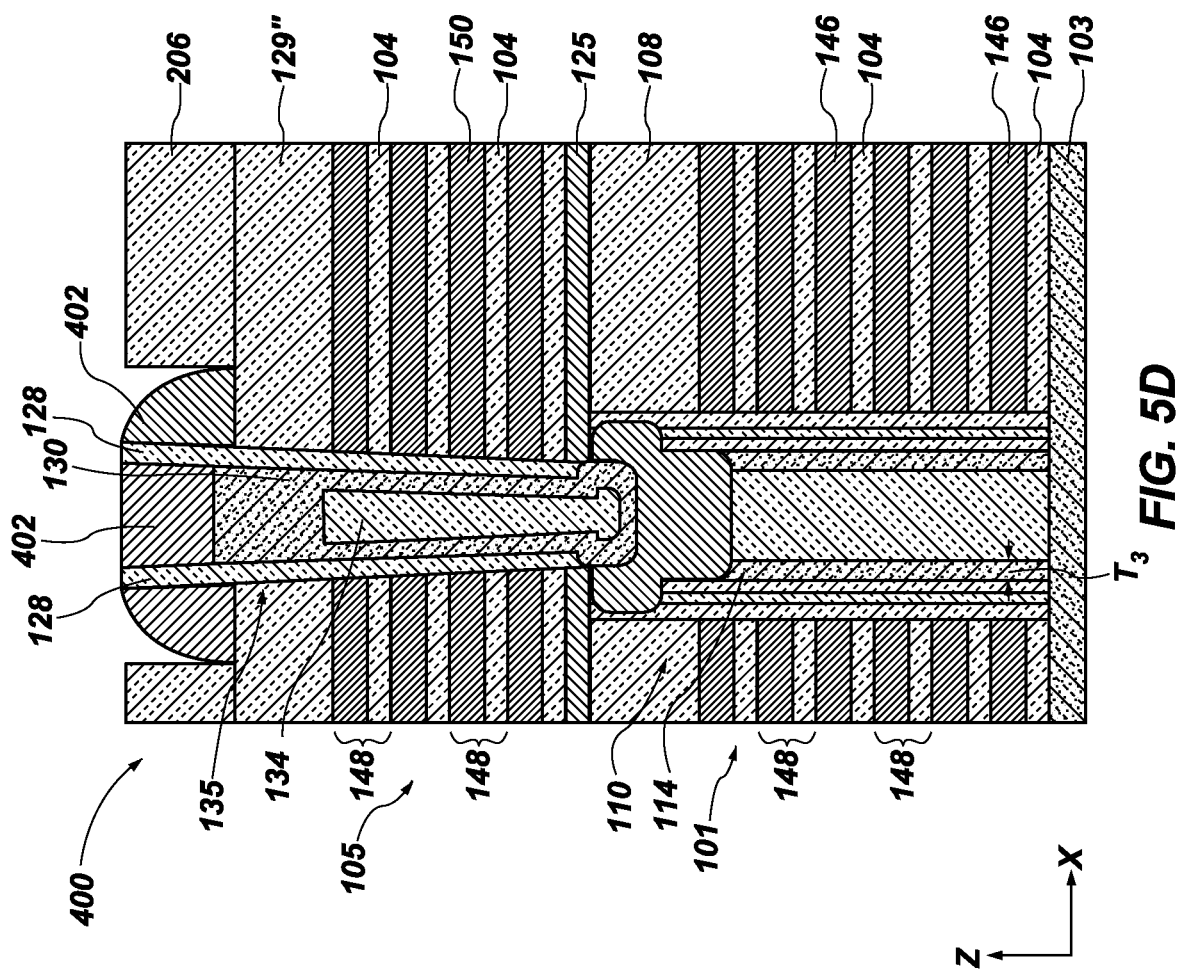

With collective reference to FIGS. 5C and 5D, an oxide material 206 may be formed over the another hard mask material 402. As described above with reference to FIGS. 1E and 1F, the microelectronic device structure 400 is subjected to a "replacement gate" or "gate last" process. With reference to FIG. 5D, the microelectronic device structure 400 includes conductive structures 146 of tiers 148. The additional other insulative structures 106 may simultaneously be removed and replaced with additional conductive structures 150 to form tiers 148.

Figure 5E:
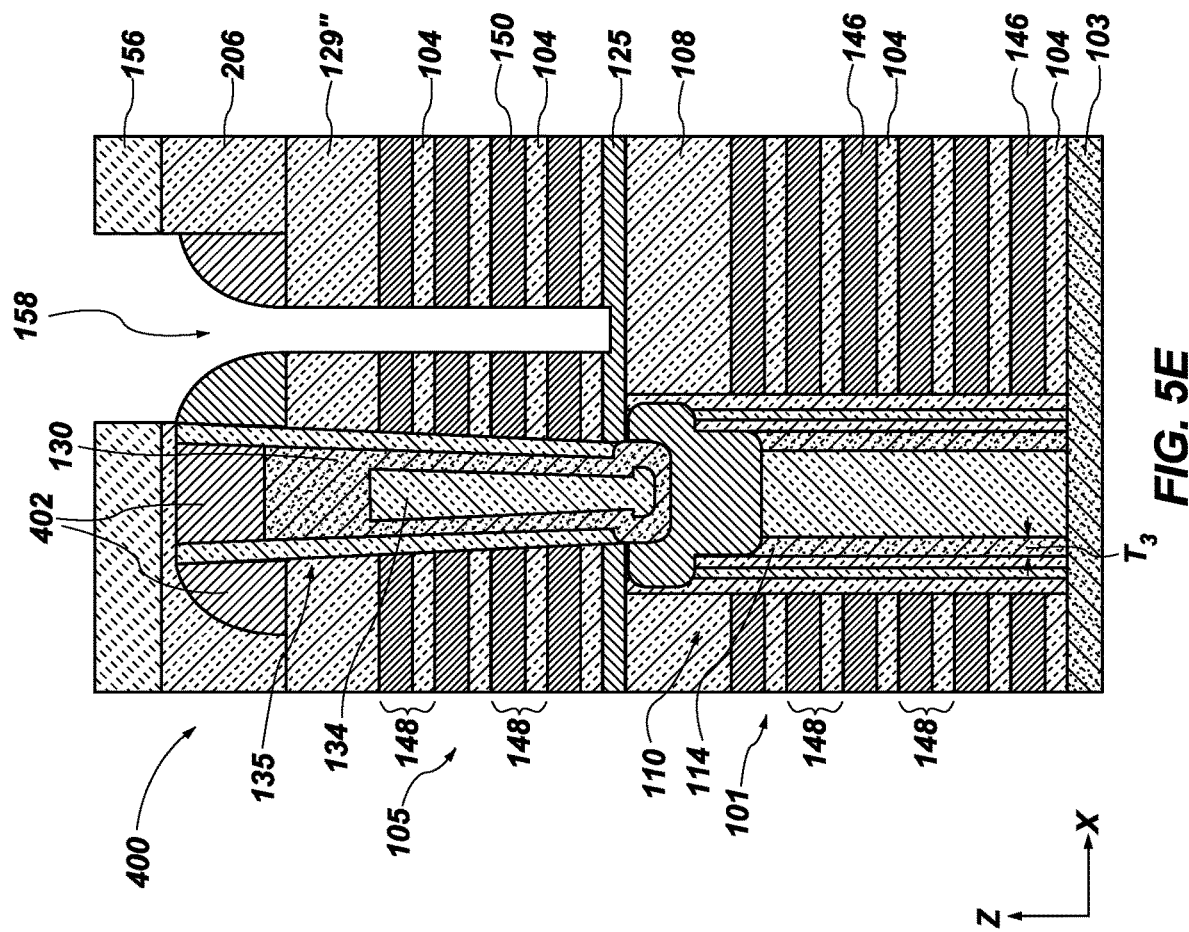

With reference to FIG. 5E, a mask material 156 may be formed adjacent (e.g., over) the oxide material 206 and the another hard mask material 402 and patterned. The mask material 156 may be formed of and include one or more of a photoresist material, a dielectric antireflective coating (DARC) material, magnesium oxide (MgOx) and tungsten-doped carbon (W-doped carbon). The slots 158 may be formed through the opening of the mask material 156, through the oxide material 206, and through the tiers 148 of alternating levels of the insulative structures 104 and the additional conductive structures 150 of the other stack structure 105. In some embodiments, the slots 158 are formed by sequentially removing the tiers 148 of the insulative structures 104 and the additional conductive structures 150. In some embodiments, the slots 158 terminate within a lowermost one of the tiers 148 of the other stack structure 105. In other embodiments, the slots 158 terminate within at least one of the additional conductive structures 150 of at least one of the tiers 148 of the other stack structure 105. The slots 158 may be located adjacent to (e.g., neighboring) the first upper pillar structures 135. The another hard mask material 402 may determine the position of the slots 158.

Figure 5F:
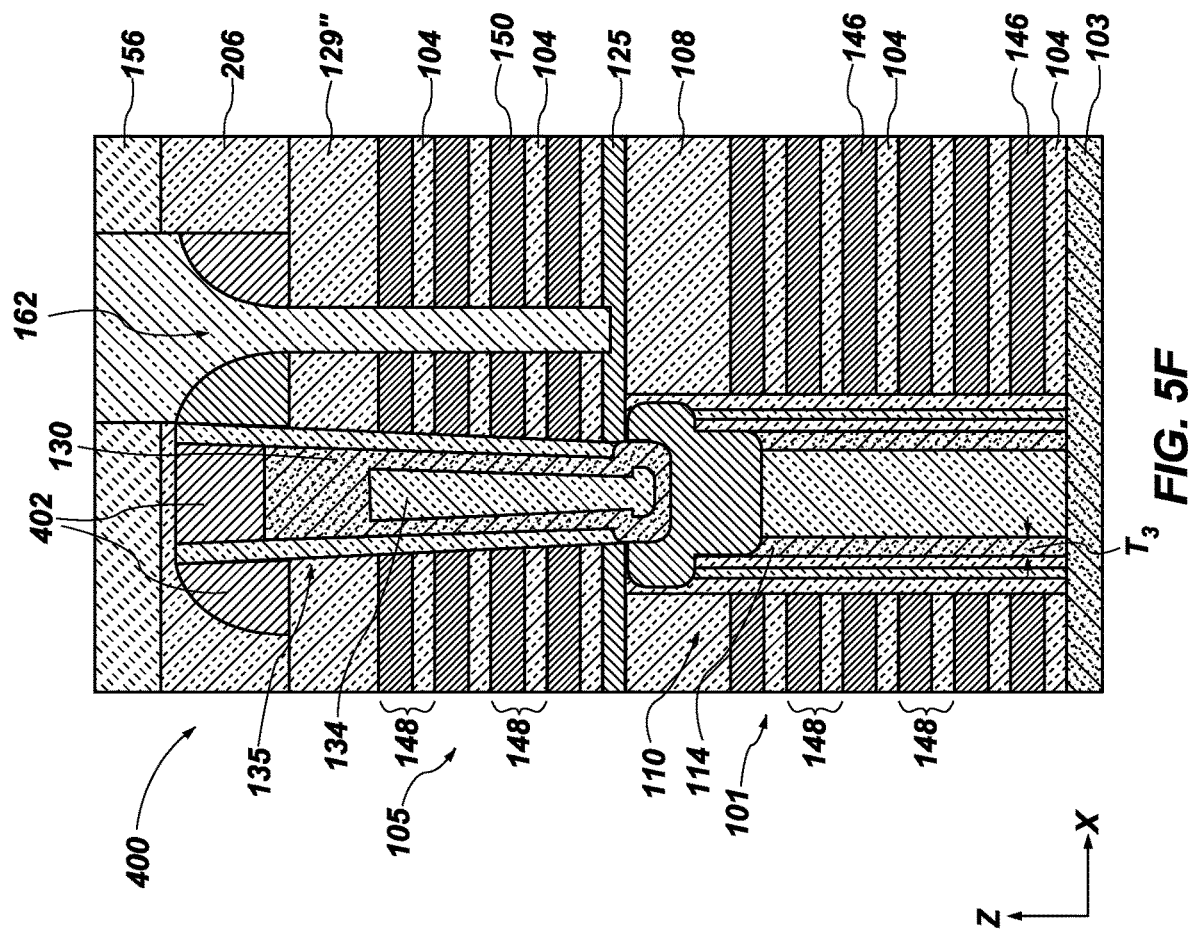

With reference to FIG. 5F, the dielectric material may be formed within the opening of the photoresist mask material 156 and the opening of the oxide material 206, forming the slot structures 162 as previously described. The slot structures 162 may be adjacent to the another hard mask material 402. While not illustrated in FIG. 5F, a liner 160 may (optionally) be formed in the slots 158 before forming the slot structures 162.

Subsequently, an upper portion of the dielectric material, the photoresist mask material 156, the oxide material 206, the another hard mask material 402, and first liner material 128 may be removed from the top surface of the uppermost insulative structure 129". The dielectric material may remain in the slots 158, resulting in the same structure as shown in FIG. 3J. The resulting slot structures 162 may exhibit the weave pattern wherein the slot structures 162 are not defined by a substantially straight line (e.g., extending in the Y-direction). The weave pattern is shown and described in detail above with reference to microelectronic device structure 100 and FIG. 1M.

After forming the weave pattern in microelectronic device structure 400, conductive contacts 164 may be formed over and in electrical communication with the plug material 138 (see FIG. 3K). The conductive contacts 164 and the plug material 138 may be in electrical communication with the channel material 130. The conductive contacts 164 may comprise an electrically conductive material, such as one or more of the materials described above with reference to the conductive structures 146. In some embodiments, the conductive contacts 164 comprise substantially the same material composition as the conductive structures 146. In some embodiments, the conductive contacts 164 comprise tungsten.

The microelectronic device structures 100, 200, 300, 400, microelectronic devices, and systems according to embodiments of the disclosure advantageously reduce the overlay error between the slot structures 162 and the upper pillar structures 135, 137, and advantageously facilitate an increase in overlay margin between the upper pillar structures 135, 137 and the pillars 110. In conventional microelectronic devices, pillar bending may be present in which the pillar to pillar distance increases due to a stress-induced displacement of the pattern at the top of the microelectronic device. The microelectronic devices and systems according to embodiments of the disclosure containing the self-aligned slot structures 162 will be substantially unaffected by pillar bending because the distance from the upper pillar structure to the self-aligned slot 158 is fixed. Additionally, if the distance between the upper pillar structures is desired to be changed, the amplitude of the weave pattern of the slot structures 162 may be increased and yet remain aligned with the upper pillar structures. The methods of forming the microelectronic devices and systems according to embodiments of the disclosure facilitate the formation of microelectronic devices and systems having one or more of improved overlay margin and alignment as compared to conventional devices.

Figure 6:
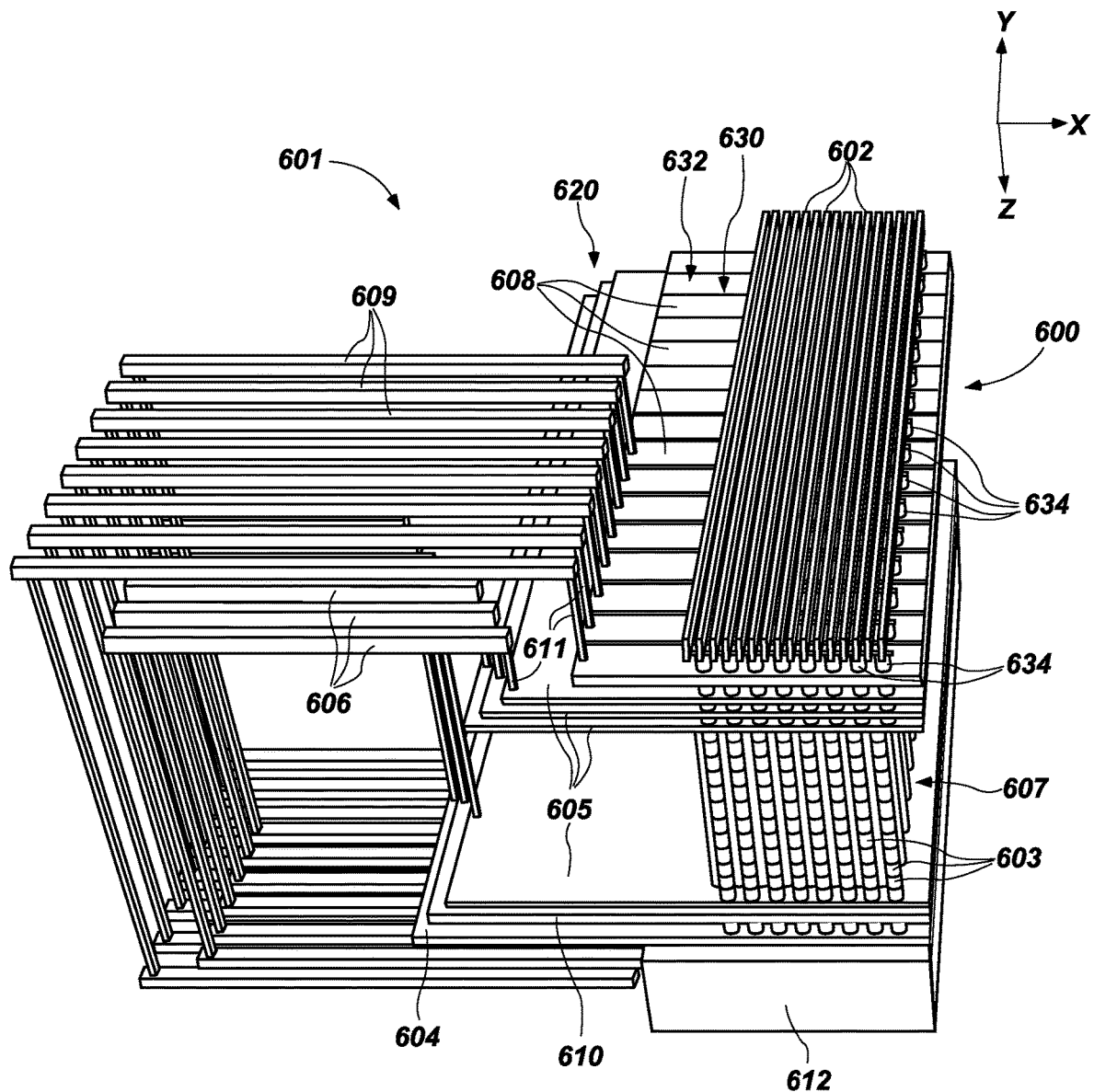
FIG. 6 is a partial cutaway perspective view of a microelectronic device, in accordance with embodiments of the disclosure.

FIG. 6 illustrates a partial cutaway perspective view of a portion of a microelectronic device 601 (e.g., a memory device, such as a dual deck 3D NAND Flash memory device) including a microelectronic device 600. The microelectronic device 600 may be substantially similar to the microelectronic device structure 100 following the processing stage previously described with reference to FIG. 1L. In other embodiments, the microelectronic device 600 may be substantially similar to one or more of the microelectronic device structures 200, 300, 400. As shown in FIG. 6, the microelectronic device 600 may include a staircase structure 620 defining contact regions for connecting access lines 606 to conductive tiers 605 (e.g., conductive layers, conductive plates, such as the conductive structures 146 (FIG. 1L)). The microelectronic device 600 may include vertical strings 607 (e.g., strings of memory cells 603 (e.g., memory cells 133 (FIG. 1F))) that are coupled to each other in series. The vertical strings 607 may extend vertically (e.g., in the Z-direction) and orthogonally to data lines 602, a source tier 604 (e.g., the source structure 103 (FIG. 1L)), the conductive tiers 605, the access lines 606, first select gates 608 (e.g., upper select gates, drain select gates (SGDs), such as the additional conductive structures 150 (FIG. 1F) of the other stack structure 105 (FIG. 1F)), select lines 609, and a second select gate 610 (e.g., a lower select gate, a source select gate (SGS)). The select gates 608 may be horizontally divided (e.g., in the Y-direction) into multiple blocks 632 (e.g., block structures 168 (FIG. 1M)) horizontally separated (e.g., in the Y-direction) from one another by slot structures 630 containing the dielectric material (FIGS. 1L, 1N) and formed within the slots 158 (FIG. 1L).

Vertical conductive contacts 611 may electrically couple components to each other as shown. For example, the select lines 609 may be electrically coupled to the first select gates 608 and the access lines 606 may be electrically coupled to the conductive tiers 605. The microelectronic device 601 may also include a control unit 612 positioned under the memory array, which may include control logic devices configured to control various operations of other features (e.g., the vertical strings 607 of memory cells 603) of the microelectronic device 601. By way of non-limiting example, the control unit 612 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control unit 612 may be electrically coupled to the data lines 602, the source tier 604, the access lines 606, the first select gates 608, and the second select gates 610, for example. In some embodiments, the control unit 612 includes CMOS (complementary metal-oxide-semiconductor) circuitry. In such embodiments, the control unit 612 may be characterized as having a "CMOS under Array" ("CuA") configuration.

The first select gates 608 may extend horizontally in a first direction (e.g., the X-direction) and may be coupled to respective first groups of vertical strings 607 of memory cells 603 at a first end (e.g., an upper end) of the vertical strings 607. The second select gate 610 may be formed in a substantially planar configuration and may be coupled to the vertical strings 607 at a second, opposite end (e.g., a lower end) of the vertical strings 607 of memory cells 603.

The data lines 602 (e.g., bit lines) may extend horizontally in a second direction (e.g., in the Y-direction) that is at an angle (e.g., perpendicular) to the first direction in which the first select gates 608 extend. The data lines 602 may be coupled to respective second groups of the vertical strings 607 at the first end (e.g., the upper end) of the vertical strings 607. A first group of vertical strings 607 coupled to a respective first select gate 608 may share a particular vertical string 607 with a second group of vertical strings 607 coupled to a respective data line 602. Thus, a particular vertical string 607 may be selected at an intersection of a particular first select gate 608 and a particular data line 602. Accordingly, the first select gates 608 may be used for selecting memory cells 603 of the vertical strings 607 of memory cells 603.

The conductive tiers 605 (e.g., word lines, such as the conductive structures 146 (FIG. 1L)) may extend in respective horizontal planes. The conductive tiers 605 may be stacked vertically, such that each conductive tier 605 is coupled to all of the vertical strings 607 of memory cells 603, and the vertical strings 607 of the memory cells 603 extend vertically through the stack of conductive tiers 605. The conductive tiers 605 may be coupled to or may form control gates of the memory cells 603 to which the conductive tiers 605 are coupled. Each conductive tier 605 may be coupled to one memory cell 603 of a particular vertical string 607 of memory cells 603.

The first select gates 608 and the second select gates 610 may operate to select a particular vertical string 607 of the memory cells 603 between a particular data line 602 and the source tier 604. Thus, a particular memory cell 603 may be selected and electrically coupled to a data line 602 by operation of (e.g., by selecting) the appropriate first select gate 608, second select gate 610, and conductive tier 605 that are coupled to the particular memory cell 603.

The staircase structure 620 may be configured to provide electrical connection between the access lines 606 and the conductive tiers 605 through the vertical conductive contacts 611. In other words, a particular level of the conductive tiers 605 may be selected via an access line 606 in electrical communication with a respective vertical conductive contact 611 in electrical communication with the particular conductive tier 605.

The data lines 602 may be electrically coupled to the vertical strings 607 through conductive contact structure 634 (e.g., the conductive contacts (FIG. 1L)).

Thus, in accordance with embodiments of the disclosure, a microelectronic device comprises a stack structure comprising an alternating sequence of conductive structures and insulative structures arranged in tiers. Memory cells vertically extend through the stack structure, and comprise a channel material vertically extending through the stack structure. An additional stack structure vertically overlies the stack structure and comprises additional conductive structures and additional insulative structures arranged in additional tiers. First pillar structures extend through the additional stack structure and vertically overlie a portion of the memory cells. Second pillar structures are adjacent to the first pillar structures and extend through the additional stack structure and vertically overlie another portion of the memory cells. Slot structures are laterally adjacent to the first pillar structures and to the second pillar structures and extend through at least a portion of the additional stack structure. A distance between the first pillar structures and the slot structures is substantially equal to a distance between the second pillar structures and the slot structures.

Thus, in accordance with additional embodiments of the disclosure, a microelectronic device comprises strings of memory cells in a stack structure comprising tiers of alternating insulative structures and conductive structures. Pillars are within an additional stack structure comprising additional tiers of alternating insulative structures and conductive structures. A channel region extends through the stack structure and the additional stack structure. Slot structures extend at least partially into the additional stack structure and exhibit arcuate surfaces defining a weave pattern.

Thus, in accordance with further embodiments of the disclosure, a method of forming a microelectronic device comprises forming a first stack structure comprising alternating levels of insulative structures and nitride structures. Memory cells comprising a channel material are formed and extend through the first stack structure. A second stack structure is formed and comprises alternating levels of additional insulative structures and additional nitride structures over the first stack structure. Pillar structures are formed and extend through the second stack structure. The pillar structures overlie the memory cells of the first stack structure and comprise another channel material and a conductive material extending between portions of the another channel material. An insulative material is formed over the second stack structure. A portion of the pillar structures and the insulative material is removed to form an opening over the pillar structures. A width of the opening is greater than a width of the pillar structures. A sacrificial structure is formed in the opening. The nitride structures of the first stack structure and the second stack structure are replaced with conductive structures. The sacrificial structure are removed from the opening. A hard mask material is formed in the opening, with a width of the hard mask material being greater than a width of the pillar structures. A patterned mask is formed over the hard mask material and a portion of the hard mask material and the insulative material is exposed through the patterned mask. The exposed hard mask material and the exposed insulative material is removed to form a slot exhibiting a non-linear shape between neighboring pillar structures. The slot extends through the insulative material, at least partially into the second stack structure. A dielectric material is formed in the slot to form a slot structure.

Figure 7:
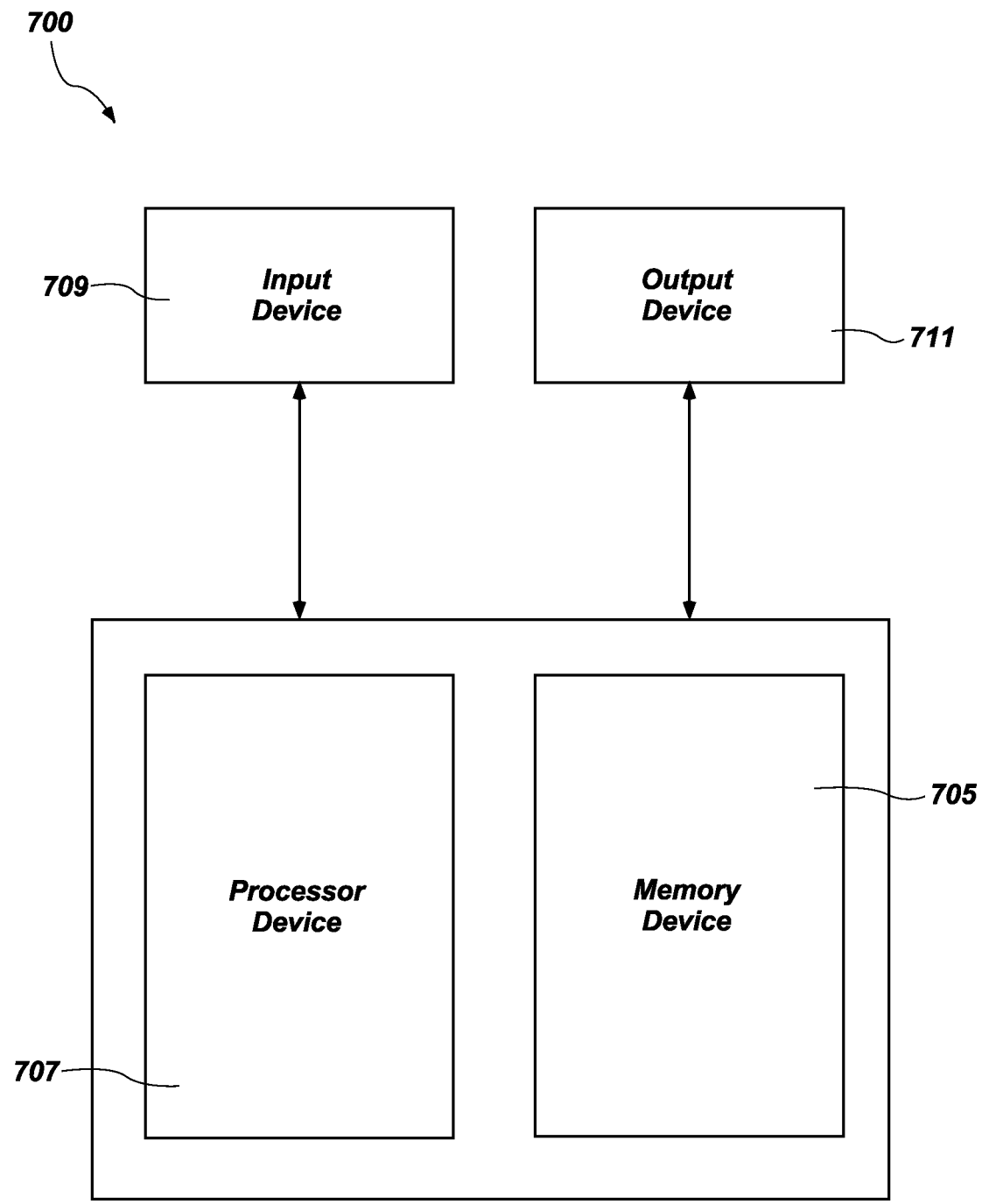
FIG. 7 is a block diagram of an electronic system, in accordance with embodiments of the disclosure.

Microelectronic devices including microelectronic devices (e.g., the microelectronic device 601) and microelectronic device structures (e.g., the microelectronic device structures 100, 200, 300, 400) including the slot structures 162 exhibiting a weave pattern may be used in embodiments of electronic systems of the disclosure. For example, FIG. 7 is a block diagram of an electronic system 700, in accordance with embodiments of the disclosure. The electronic system 700 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 700 includes at least one memory device 705. The memory device 705 may include, for example, an embodiment of a microelectronic device structure previously described herein (e.g., the microelectronic device structure 100, 200, 300, 400 previously described with reference to FIGS. 1A-1N, FIGS. 2A-2C, FIGS. 3A-3K, and FIGS. 5A-5F) including the slot structures 162 and the first upper pillar structures 135 and second upper pillar structures 137.

The electronic system 700 may further include at least one electronic signal processor device 707 (often referred to as a "microprocessor"). The electronic signal processor device 707 may, optionally, include an embodiment of a microelectronic device or a microelectronic device structure previously described herein (e.g., one or more of the microelectronic device structure 100a, 100b, 100c or the microelectronic device structure 100, 200, 300, 400 previously described with reference to FIGS. 1A-1N, FIGS. 2A-2C, FIGS. 3A-3K, and FIGS. 5A-5F). The electronic system 700 may further include one or more input devices 709 for inputting information into the electronic system 700 by a user, such as, for example, a mouse or other pointing device, a keyboard, a touchpad, a button, or a control panel. The electronic system 700 may further include one or more output devices 711 for outputting information (e.g., visual or audio output) to a user such as, for example, a monitor, a display, a printer, an audio output jack, a speaker, etc. In some embodiments, the input device 709 and the output device 711 may comprise a single touchscreen device that can be used both to input information to the electronic system 700 and to output visual information to a user. The input device 709 and the output device 711 may communicate electrically with one or more of the memory device 705 and the electronic signal processor device 707.

Figure 8:
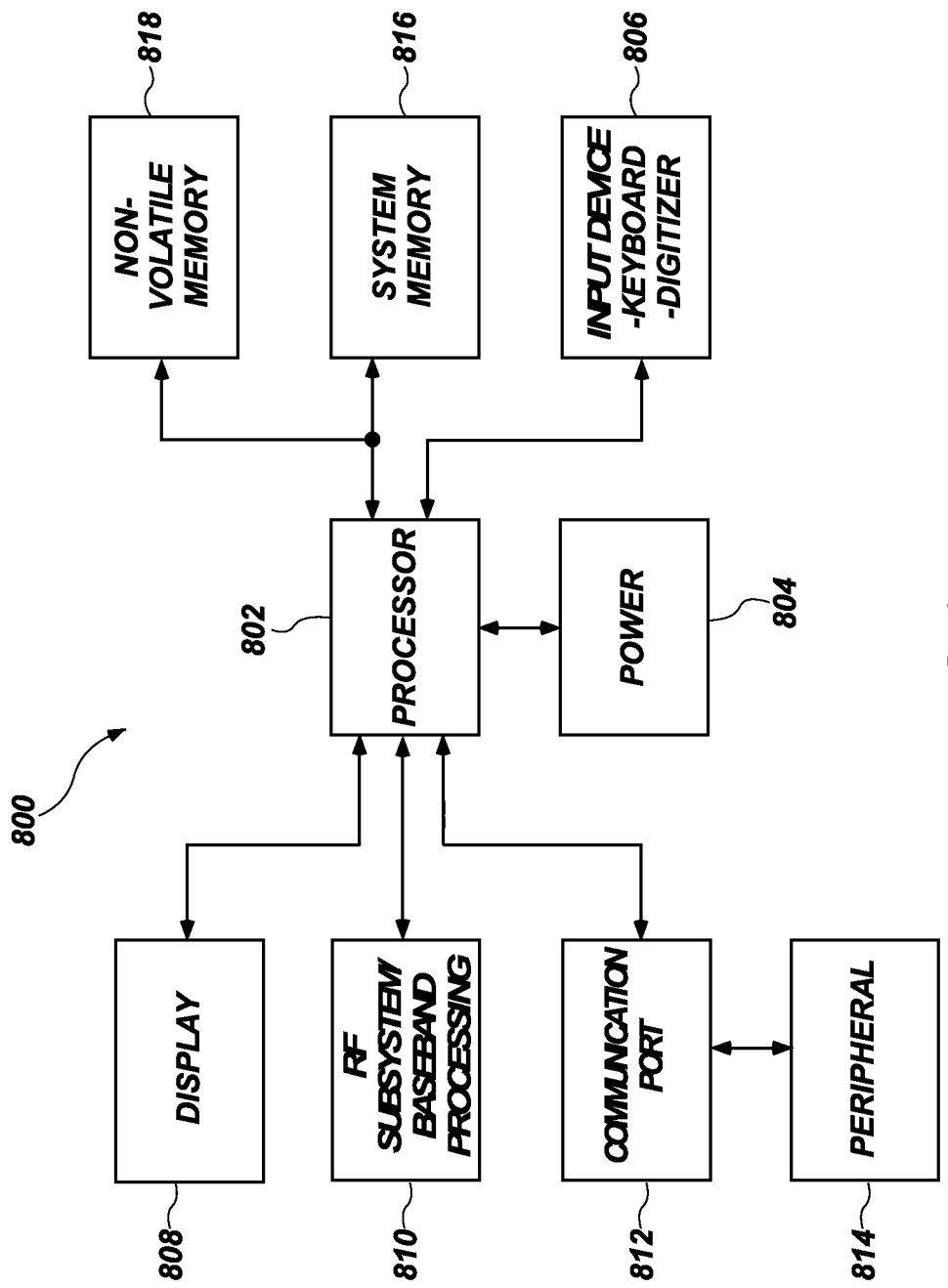
FIG. 8 is a block diagram of a processor-based system, in accordance with embodiments of the disclosure.

With reference to FIG. 8, depicted is a processor-based system 800. The processor-based system 800 may include various microelectronic devices and microelectronic device structures (e.g., one or more of the microelectronic device structure 100a, 100b, 100c or the microelectronic device structure 100, 200, 300, 400 previously described with reference to FIGS. 1A-1N, FIGS. 2A-2C, FIGS. 3A-3K, and FIGS. 5A-5F) manufactured in accordance with embodiments of the present disclosure. The processor-based system 800 may be any of a variety of types such as a computer, pager, cellular phone, personal organizer, control circuit, or other electronic device. The processor-based system 800 may include one or more processors 802, such as a microprocessor, to control the processing of system functions and requests in the processor-based system 800. The processor 802 and other subcomponents of the processor-based system 800 may include microelectronic devices and microelectronic device structures (e.g., one or more of the microelectronic device structure 100a, 100b, 100c or the microelectronic device structure 100, 200, 300, 400 previously described with reference to FIGS. 1A-1N, FIGS. 2A-2C, FIGS. 3A-3K, and FIGS. 5A-5F) manufactured in accordance with embodiments of the present disclosure.

The processor-based system 800 may include a power supply 804 in operable communication with the processor 802. For example, if the processor-based system 800 is a portable system, the power supply 804 may include one or more of a fuel cell, a power scavenging device, permanent batteries, replaceable batteries, and rechargeable batteries. The power supply 804 may also include an AC adapter; therefore, the processor-based system 800 may be plugged into a wall outlet, for example. The power supply 804 may also include a DC adapter such that the processor-based system 800 may be plugged into a vehicle cigarette lighter or a vehicle power port, for example.

Various other devices may be coupled to the processor 802 depending on the functions that the processor-based system 800 performs. For example, a user interface 806 may be coupled to the processor 802. The user interface 806 may include input devices such as buttons, switches, a keyboard, a light pen, a mouse, a digitizer and stylus, a touch screen, a voice recognition system, a microphone, or a combination thereof. A display 808 may also be coupled to the processor 802. The display 808 may include an LCD display, an SED display, a CRT display, a DLP display, a plasma display, an OLED display, an LED display, a three-dimensional projection, an audio display, or a combination thereof. Furthermore, an RF sub-system/baseband processor 810 may also be coupled to the processor 802. The RF sub-system/baseband processor 810 may include an antenna that is coupled to an RF receiver and to an RF transmitter (not shown). A communication port 812, or more than one communication port 812, may also be coupled to the processor 802. The communication port 812 may be adapted to be coupled to one or more peripheral devices 814, such as a modem, a printer, a computer, a scanner, or a camera, or to a network, such as a local area network, remote area network, intranet, or the Internet, for example.

The processor 802 may control the processor-based system 800 by implementing software programs stored in the memory. The software programs may include an operating system, database software, drafting software, word processing software, media editing software, or media playing software, for example. The memory is operably coupled to the processor 802 to store and facilitate execution of various programs. For example, the processor 802 may be coupled to system memory 816, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 816 may include volatile memory, non-volatile memory, or a combination thereof. The system memory 816 is typically large so that it can store dynamically loaded applications and data. In some embodiments, the system memory 816 may include semiconductor devices, such as the microelectronic devices and microelectronic device structures (e.g., the microelectronic device structure 100a, 100b, 100c or the microelectronic device structure 100, 200, 300, 400) described above, or a combination thereof.

The processor 802 may also be coupled to non-volatile memory 818, which is not to suggest that system memory 816 is necessarily volatile. The non-volatile memory 818 may include one or more of STT-MRAM, MRAM, read-only memory (ROM) such as an EPROM, resistive read-only memory (RROM), and flash memory to be used in conjunction with the system memory 816. The size of the non-volatile memory 818 is typically selected to be just large enough to store any necessary operating system, application programs, and fixed data. Additionally, the non-volatile memory 818 may include a high-capacity memory such as disk drive memory, such as a hybrid-drive including resistive memory or other types of non-volatile solid-state memory, for example. The non-volatile memory 818 may include microelectronic devices, such as the microelectronic devices and microelectronic device structures (e.g., the microelectronic device structure 100a, 100b, 100c or the microelectronic device structure 100, 200, 300, 400) described above, or a combination thereof.

Thus, in accordance with embodiments of the disclosure, an electronic system is disclosed and comprises an input device, an output device, a processor device operably coupled to the input device and the output device, and a memory device operably coupled to the processor device. The memory device comprises at least one microelectronic device that comprises memory cells extending through a stack structure comprising alternating levels of insulative structures and conductive structures. Pillars are within an additional stack structure comprising tiers of alternating additional insulative structures and additional conductive structures. The pillars overlie the memory cells. A channel region extends through the stack structure and the additional stack structure. Slot structures extend at least partially through the additional stack structure and exhibit a weave pattern defined by crest regions and valley regions of a dielectric material.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
    a stack structure comprising an alternating sequence of conductive structures and insulative structures arranged in tiers;
    memory cells vertically extending through the stack structure, the memory cells comprising a channel material vertically extending through the stack structure;
    an additional stack structure vertically overlying the stack structure and comprising additional conductive structures and additional insulative structures arranged in additional tiers;
    first pillar structures extending through the additional stack structure and vertically overlying a portion of the memory cells;
    second pillar structures adjacent to the first pillar structures and extending through the additional stack structure and vertically overlying another portion of the memory cells; and
    slot structures extending through at least a portion of the additional stack structure, the slot structures laterally adjacent to the first pillar structures and to the second pillar structures, wherein a distance between the first pillar structures and the slot structures is substantially equal to a distance between the second pillar structures and the slot structures, the slot structures exhibiting a non-linear shape.

2. The microelectronic device of claim 1, wherein the slot structures comprise a dielectric material.

3. The microelectronic device of claim 2, wherein the dielectric material of the slot structures comprises an oxide material.

4. The microelectronic device of claim 2, further comprising a liner adjacent to the dielectric material.

5. The microelectronic device of claim 1, wherein the slot structures divide the additional stack structure into sub-block structures.

6. The microelectronic device of claim 1, further comprising another channel material vertically extending through the additional stack structure and in electrical communication with the channel material of the stack structure.

7. The microelectronic device of claim 1, wherein the first pillar structures and the second pillar structures of the additional stack structure are horizontally aligned with underlying memory cells of the stack structure.

8. A microelectronic device, comprising:
    strings of memory cells in a stack structure comprising tiers of alternating insulative structures and conductive structures;
    pillars within an additional stack structure comprising additional tiers of alternating insulative structures and conductive structures, the additional stack structure overlying the stack structure;
    a channel region extending through the stack structure and the additional stack structure; and
    slot structures extending at least partially into the additional stack structure, the slot structures exhibiting arcuate surfaces defining a weave pattern.

9. The microelectronic device of claim 8, wherein the pillars of the additional stack structure and the strings of memory cells in the stack structure are centered.

10. The microelectronic device of claim 8, wherein the slot structures are between columns of adjacent pillars of the additional stack structure.

11. The microelectronic device of claim 8, wherein the slot structures exhibit crest regions and valley regions.

12. The microelectronic device of claim 11, wherein the slot structures comprise one or more protrusions extending from one or more of the crest regions and the valley regions.

13. The microelectronic device of claim 11, wherein the slot structures comprise one or more protrusions laterally extending from one or more of the crest regions and the valley regions.

14. A method of forming a microelectronic device, the method comprising:
   forming a stack structure comprising alternating levels of insulative structures and nitride structures arranged in tiers;
   forming memory cells comprising a channel material vertically extending through the first stack structure;
   forming an additional second stack structure comprising alternating levels of additional insulative structures and additional nitride structures arranged in additional tiers and vertically overlying the stack structure;
   forming first pillar structures and second pillar structures extending through the additional stack structure, the second pillar structures adjacent to the first pillar structures, the first pillar structures and the second pillar structures vertically overlying portions of the memory cells of the stack structure and the additional stack structure and comprising another channel material and a conductive material extending between portions of the another channel material;
   forming an insulative material over the additional stack structure;
   removing a portion of the first pillar structures and the second pillar structures and the insulative material to form an opening over the first pillar structures and the second pillar structures, a width of the opening greater than a width of the first pillar structures and the second pillar structures;
   forming a sacrificial structure in the opening;
   replacing the nitride structures of the stack structure and the additional stack structure with conductive structures to form the stack structure and the additional stack structure comprising an alternating sequence of conductive structures and insulative structures arranged in tiers;
   removing the sacrificial structure from the opening;
   forming a hard mask material in the opening, a width of the hard mask material greater than a width of the first pillar structures and the second pillar structures;
   forming a patterned mask over the hard mask material, a portion of the hard mask material and the insulative material exposed through the patterned mask;
   removing the exposed hard mask material and the exposed insulative material to form a slot exhibiting a non-linear shape between neighboring first pillar structures and second pillar structures, the slot extending through the insulative material, at least partially into the additional stack structure; and
   forming a dielectric material in the slot to form slot structures, the slot structures extending through at least a portion of the additional stack structure and the slot structures laterally adjacent to the first pillar structures and to the second pillar structures, wherein a distance between the first pillar structures and the slot structures is substantially equal to a distance between the second pillar structures and the slot structures, the slot structures exhibiting a non-linear shape.

15. The method of claim 14, wherein forming first pillar structures and second pillar structures extending through the additional stack structure comprises forming the first pillar structures and the second pillar structures centered over underlying memory cells.

16. The method of claim 14, wherein forming first pillar structures and second pillar structures extending through the additional stack structure comprises forming the first pillar structures and the second pillar structures substantially horizontally aligned with underlying memory cells of the stack structure.

17. The method of claim 14, wherein forming first pillar structures and second pillar structures extending through the additional stack structure comprises forming the channel material and the another channel material to form a channel region extending through the additional stack structure and into the stack structure.

18. The method of claim 14, wherein removing the exposed hard mask material and the exposed insulative material to form a slot comprises forming a portion of the slot extending vertically over a portion of the pillar structures.

19. The method of claim 14, wherein removing the exposed hard mask material and the exposed insulative material to form a slot comprises forming a portion of the slot aligned with sidewalls of the hard mask material.

20. The method of claim 14, wherein removing the exposed hard mask material and the exposed insulative material to form a slot extending at least partially into the additional stack structure comprises extending the slot to a lowermost conductive structure of the additional stack structure.

21. The method of claim 14, wherein forming a sacrificial structure in the opening comprising forming the sacrificial structure at a width greater than the width of the pillar structures.

22. The method of claim 14, wherein forming a dielectric material in the slot to form a slot structure comprises forming the slot structures exhibiting arcuate surfaces.

23. An electronic system, comprising:
   an input device;
   an output device;
   a processor device operably coupled to the input device and the output device; and
   a memory device operably coupled to the processor device and comprising at least one microelectronic device, the at least one microelectronic device comprising:
      memory cells extending through a stack structure comprising tiers of alternating insulative structures and conductive structures;
      pillars within an additional stack structure comprising tiers of alternating additional insulative structures and additional conductive structures, the pillars overlying the memory cells;
      a channel region extending through the stack structure and the additional stack structure; and
      slot structures extending at least partially through the additional stack structure, the slot structures exhibiting a weave pattern defined by crest regions and valley regions of a dielectric material.

24. The electronic system of claim 23, wherein the memory cells and the pillars are concentrically positioned.

25. The electronic system of claim 23, wherein the slot structures separate vertically adjacent pillars of the additional stack structure.

* * * * *

UNITED STATES PATENT AND TRADEMARK OFFICE
CERTIFICATE OF CORRECTION

PATENT NO. : 12,406,886 B2
APPLICATION NO. : 17/720695
DATED : September 2, 2025
INVENTOR(S) : Chandra S. Tiwari et al.

Page 1 of 1

It is certified that error appears in the above-identified patent and that said Letters Patent is hereby corrected as shown below:

In the Claims

| | | | |
|---|---|---|---|
| Claim 14, | Column 27, | Line 14, | change "through the first stack structure;" to --through the stack structure;-- |
| Claim 14, | Column 27, | Line 15, | change "an additional second stack structure" to --an additional stack structure-- |

Signed and Sealed this
Eighteenth Day of November, 2025

John A. Squires
*Director of the United States Patent and Trademark Office*